US012563960B2

(12) United States Patent
Yoshiyasu et al.

(10) Patent No.: US 12,563,960 B2
(45) Date of Patent: Feb. 24, 2026

(54) ORGANIC COMPOUND, LIGHT-EMITTING DEVICE, LIGHT-EMITTING APPARATUS, ELECTRONIC DEVICE, AND LIGHTING DEVICE

(71) Applicant: Semiconductor Energy Laboratory Co., Ltd., Kanagawa-ken (JP)

(72) Inventors: Yui Yoshiyasu, Kanagawa (JP); Hideko Yoshizumi, Kanagawa (JP); Takeyoshi Watabe, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 555 days.

(21) Appl. No.: 17/263,674

(22) PCT Filed: Jul. 29, 2019

(86) PCT No.: PCT/IB2019/056430
§ 371 (c)(1),
(2) Date: Jan. 27, 2021

(87) PCT Pub. No.: WO2020/026106
PCT Pub. Date: Feb. 6, 2020

(65) Prior Publication Data

US 2021/0336156 A1 Oct. 28, 2021

(30) Foreign Application Priority Data

Jul. 31, 2018 (JP) ................................ 2018-143623

(51) Int. Cl.
*H10K 85/30* (2023.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
None
See application file for complete search history.

(56) References Cited

U.S. PATENT DOCUMENTS 8,367,223 B2 2/2013 Xia et al.
9,899,612 B2 * 2/2018 Kwong ................ H10K 85/342
(Continued)

FOREIGN PATENT DOCUMENTS

CN 104520308 A 4/2015
CN 104592124 A 5/2015
(Continued)

OTHER PUBLICATIONS

Liu, Yun-Jun, et al. "Ruthenium (II) complexes containing asymmetric 2-(pyrazin-2-yl) naphthoimidazole: syntheses, characterization, DNA-binding and photocleavage studies." Inorganica chimica acta 358.6 (2005): 1904-1910. (Year: 2005).*
(Continued)

*Primary Examiner* — Dawn L Garrett
(74) *Attorney, Agent, or Firm* — Husch Blackwell LLP

(57) ABSTRACT

A novel organometallic complex is provided. One embodiment of the present invention provides a novel organometallic complex having a high quantum yield. An Ir complex has a structure including a 1H-naphtho[1,2-d]imidazole skeleton as a ligand and being represented by General Formula (G-1) below. Of Ns included in the 1H-naphtho[1,2-d]imidazole skeleton, N that is not bonded to Ir is bonded to a substituted or unsubstituted aryl group.
(Continued)

(G-1)

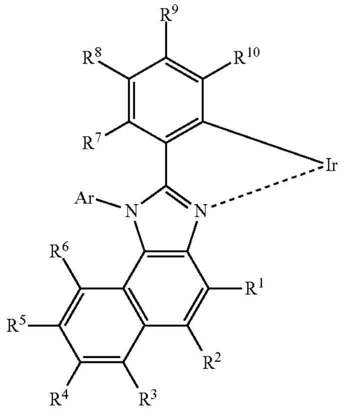

In General Formula (G-1), each of R1 to R10 independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group, and Ar represents a substituted or unsubstituted aryl group having 6 to 25 carbon atoms.

10 Claims, 25 Drawing Sheets

(51) Int. Cl.
*C09K 11/06* (2006.01)
*H10K 50/11* (2023.01)
*H10K 101/10* (2023.01)

(52) U.S. Cl.
CPC *C09K 2211/1044* (2013.01); *C09K 2211/185* (2013.01); *H10K 50/11* (2023.02); *H10K 2101/10* (2023.02)

(56) References Cited

U.S. PATENT DOCUMENTS

| | | | |
|---|---|---|---|
| 10,205,106 | B2 | 2/2019 | Stoessel et al. |
| 10,457,864 | B2 | 10/2019 | Tsai et al. |
| 11,098,245 | B2 | 8/2021 | Tsai et al. |
| 11,692,132 | B2 | 7/2023 | Tsai et al. |
| 2008/0312396 | A1 * | 12/2008 | Stoessel ................ C07F 15/006 546/4 |
| 2009/0278115 | A1 | 11/2009 | Hosokawa et al. |
| 2013/0341599 | A1 * | 12/2013 | Xia ...................... H10K 85/342 546/4 |
| 2015/0171348 | A1 | 6/2015 | Stoessel et al. |
| 2017/0229663 | A1 * | 8/2017 | Tsai .................... C07F 15/0033 |
| 2020/0013967 | A1 | 1/2020 | Yamada et al. |
| 2021/0343943 | A1 | 11/2021 | Ohsawa et al. |
| 2023/0287263 | A1 | 9/2023 | Tsai et al. |

FOREIGN PATENT DOCUMENTS

| | | | | |
|---|---|---|---|---|
| CN | 104835921 | A | 8/2015 | |
| CN | 105503736 | A | 4/2016 | |
| CN | 107043399 | A | 8/2017 | |
| CN | 108774266 | A | 11/2018 | |
| CN | 113039660 | A | 6/2021 | |
| EP | 1238981 | A2 * | 9/2002 | .......... C07F 15/0033 |
| EP | 2 882 763 | A2 | 6/2015 | |
| EP | 3205658 | A | 8/2017 | |
| EP | 3 424 936 | A1 | 1/2019 | |
| EP | 3858842 | A | 8/2021 | |
| JP | 2011-129744 | A | 6/2011 | |
| JP | 2013-147496 | A | 8/2013 | |
| JP | 5463897 | | 4/2014 | |
| JP | 2015-530982 | | 10/2015 | |
| JP | 2018-100267 | A | 6/2018 | |
| KR | 2011-0016047 | A | 2/2011 | |
| KR | 2011-0094027 | A | 8/2011 | |
| KR | 2015-0039846 | A | 4/2015 | |
| TW | 201425318 | | 7/2014 | |
| WO | WO-2007/007464 | | 1/2007 | |
| WO | WO-2010/056669 | | 5/2010 | |
| WO | WO 2014/023377 | A2 | 2/2014 | |
| WO | WO-2018/109621 | | 6/2018 | |

OTHER PUBLICATIONS

Yi, Xiuyu, et al. "Visible light-harvesting cyclometalated Ir (III) complexes with pyreno [4, 5-d] imidazole C/\ N ligands as triplet photosensitizers for triplet-triplet annihilation upconversion." Dyes and Pigments 96.1 (2013): 104-115. (Year: 2013).*

Liu, Ming, et al. "Study of Configuration Differentia and Highly Efficient, Deep-Blue, Organic Light-Emitting Diodes Based on Novel Naphtho [1, 2-d] imidazole Derivatives." Advanced Functional Materials 25.32 (2015): 5190-5198. (Year: 2015).*

Karatsu, T., Takahashi, M., Yagai, S., & Kitamura, A. (2013). Photophysical properties of substituted homoleptic and heteroleptic phenylimidazolinato Ir (III) complexes as a blue phosphorescent material. Inorganic Chemistry, 52(21), 12338-12350. (Year: 2013).*

Machine translation of CN 105503736 (publication date: Apr. 2016). (Year: 2016).*

Jayabharathi, J. et al., "Organic Light Emitting Materials Based on Iridium(III) Complexes Bearing Phenanthroimidazole Ligands," Journal of Physical Organic Chemistry , Mar. 7, 2014, vol. 27, No. 6, pp. 504-511.

Liu, B. et al., "Tuning the Ground State and Excited State Properties of Monocationic Iridium(III) Complexes by Varying the Site of Benzannulation on Diimine Ligand," Inorganic Chemistry, Apr. 11, 2017, vol. 56, No. 9, pp. 5361-5370.

International Search Report (Application No. PCT/IB2019/056430) Dated Oct. 21, 2019.

Written Opinion (Application No. PCT/IB2019/056430) Dated Oct. 21, 2019.

German Office Action (Application No. 112019003873.7) dated Oct. 11, 2023.

Chinese Office Action (Application No. 201980050982.6) dated Apr. 18, 2024.

German Office Action (Application No. 112019008045.8) Dated Nov. 10, 2025.

Kim. Y et al., "Synthesis of fully-substituted alkenylimidazoles from N-(cyanoalkyl)amides via the In-mediated allylation of nitrile and dehydrative cyclization cascade", Tetrahedron Letters, Sep. 15, 2010, vol. 51, No. 45, pp. 5922-5926.

* cited by examiner

ORGANIC COMPOUND, LIGHT-EMITTING DEVICE, LIGHT-EMITTING APPARATUS, ELECTRONIC DEVICE, AND LIGHTING DEVICE

This application is a 371 of international application PCT/IB2019/056430 filed on Jul. 29, 2019 which is incorporated herein by reference.

TECHNICAL FIELD

One embodiment of the present invention relates to a novel organic compound. In particular, one embodiment of the present invention relates to an organometallic complex including a 1H-naphtho[1,2-d]imidazole skeleton as a ligand. Alternatively, one embodiment of the present invention relates to a light-emitting device, a light-emitting apparatus, an electronic device, and a lighting device each of which includes the organometallic complex.

Note that one embodiment of the present invention is not limited to the above technical field. One embodiment of the present invention relates to an object, a method, or a manufacturing method. In particular, one embodiment of the present invention relates to an organic compound, a light-emitting device, a light-emitting apparatus, and a lighting device, and manufacturing methods thereof. One embodiment of the present invention relates to a novel method for synthesizing an organometallic complex including a 1H-naphtho[1,2-d]imidazole skeleton as a ligand. Thus, specific examples of one embodiment of the present invention disclosed in this specification include methods for manufacturing a light-emitting device, a light-emitting apparatus, a display device, an electronic device, and a lighting device each of which includes the organometallic complex.

BACKGROUND ART

Light-emitting devices (organic EL devices) that use organic compounds and utilize electroluminescence (EL) have been put into practical use. In the basic structure of such light-emitting devices, an organic compound layer (EL layer) containing a light-emitting material is interposed between a pair of electrodes. Carriers are injected by application of voltage to this device, and recombination energy of the carriers is used, whereby light emission can be obtained from the light-emitting material.

Such light-emitting devices are of self-light-emitting type, and have advantages such as high visibility and no need for backlight when used for pixels of a display; accordingly, the light-emitting devices are suitable as flat panel display elements. Displays using such light-emitting devices are also highly advantageous in that they can be fabricated thin and lightweight. Moreover, an extremely fast response speed is also a feature.

Since light-emitting layers of such light-emitting devices can be successively formed two-dimensionally, planar light emission can be obtained. This is a feature difficult to obtain with point light sources typified by incandescent lamps and LEDs or linear light sources typified by fluorescent lamps. Furthermore, light emission from an organic compound can be light emission that does not include UV light by selecting a material; thus, the light-emitting devices also have great potential as planar light sources usable in lighting devices and the like.

Displays and lighting devices using organic EL devices are suitable for a variety of electronic devices as described above; thus, research and development of light-emitting devices have progressed in seeking for higher efficiency or longer device lifetimes. In recent years, phosphorescent materials have been actively developed because higher emission efficiency can be obtained with phosphorescent light-emitting devices than with fluorescent light-emitting devices (see Patent Document 1, for example).

REFERENCE

Patent Document

[Patent Document 1] Japanese Published Patent Application No. 2013-147496

SUMMARY OF THE INVENTION

Problems to be Solved by the Invention

Although phosphorescent materials exhibiting excellent characteristics have been developed as disclosed in Patent Document 1, development of novel materials with better characteristics has been desired. In particular, development of a blue or green phosphorescent material with high efficiency and high reliability has been desired.

In view of the above, an object of one embodiment of the present invention is to provide a novel organometallic complex. Another object of one embodiment of the present invention is to provide a novel organometallic complex including a 1H-naphtho[1,2-d]imidazole skeleton. Another object of one embodiment of the present invention is to provide an organometallic complex with a high quantum yield. Another object of one embodiment of the present invention is to provide a light-emitting device having high emission efficiency. Another object of one embodiment of the present invention is to provide a light-emitting device having a long lifetime. Another object of one embodiment of the present invention is to provide a light-emitting device having high color purity. Another object of one embodiment of the present invention is to provide a light-emitting device having a low drive voltage.

Another object of one embodiment of the present invention is to provide a light-emitting device, a light-emitting apparatus, and an electronic device each having high reliability. Another object of one embodiment of the present invention is to provide a light-emitting device, a light-emitting apparatus, and an electronic device each having low power consumption.

Note that the description of these objects does not preclude the existence of other objects. In one embodiment of the present invention, there is no need to achieve all of these objects. Other objects are apparent from the description of the specification, the drawings, the claims, and the like, and other objects can be derived from the description of the specification, the drawings, the claims, and the like.

Means for Solving the Problems

One embodiment of the present invention is an organometallic complex including a 1H-naphtho[1,2-d]imidazole skeleton as a ligand and having a structure represented by General Formula (G-1) below.

[Chemical Formula 1]

(G-1)

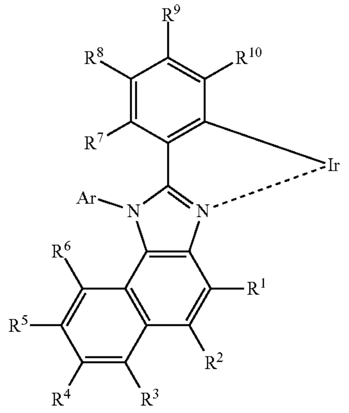

In General Formula (G-1), each of $R^1$ to $R^{10}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group, and Ar represents a substituted or unsubstituted aryl group having 6 to 25 carbon atoms.

Another embodiment of the present invention is an organometallic complex having a structure represented by General Formula (G-2) below.

[Chemical Formula 2]

(G-2)

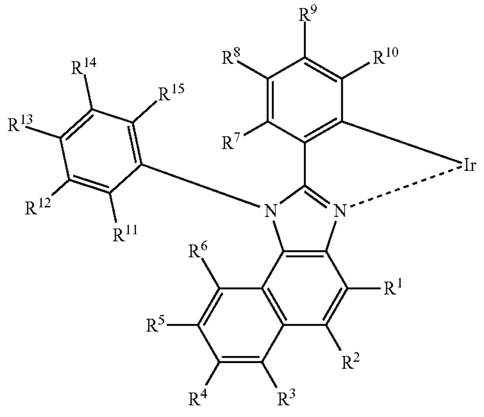

In General Formula (G-2), each of $R^1$ to $R^{15}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group.

Another embodiment of the present invention is an organometallic complex having a structure represented by General Formula (G-3) below.

[Chemical Formula 3]

(G-3)

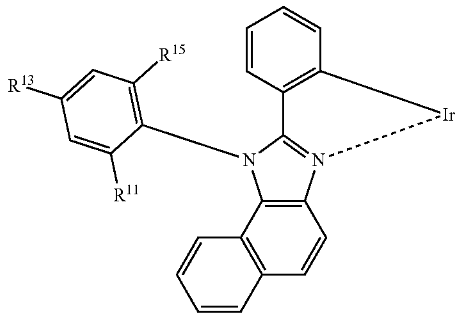

In General Formula (G-3), each of $R^{11}$, $R^{13}$, and $R^{15}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group.

Another embodiment of the present invention is an organometallic complex having a structure represented by General Formula (G-4) below.

[Chemical Formula 4]

(G-4)

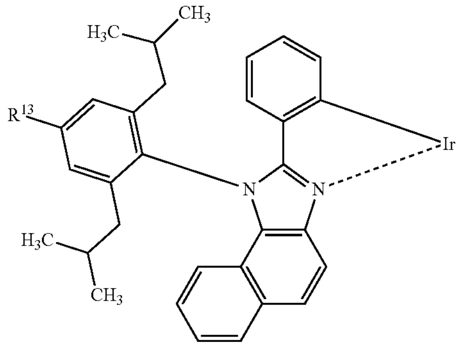

In General Formula (G-4), $R^{13}$ represents hydrogen or an electron-withdrawing group.

Another embodiment of the present invention is an organometallic complex having a structure represented by General Formula (G-5) below.

[Chemical Formula 5]

(G-5)

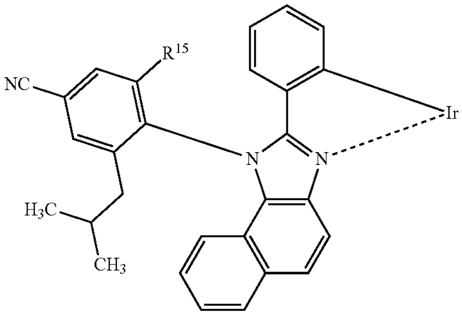

In General Formula (G-5), $R^{15}$ represents any of hydrogen, an alkyl group having 1 to 6 carbon atoms, a substituted or unsubstituted cycloalkyl group having 3 to 7 carbon atoms, and a substituted or unsubstituted aryl group having 6 to 25 carbon atoms.

In the above structure, it is preferable that General Formula (G-1) be represented by General Formula (G-6).

[Chemical Formula 6]

(G-6)

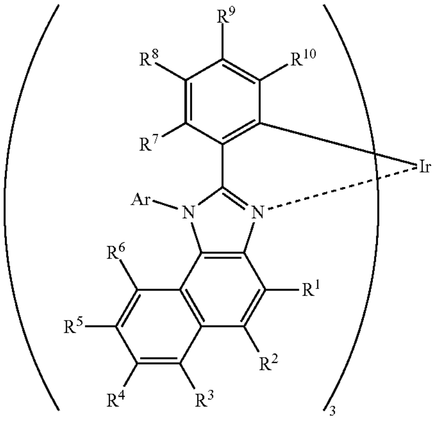

In the above structure, it is preferable that General Formula (G-2) be represented by General Formula (G-7).

[Chemical Formula 7]

(G-7)

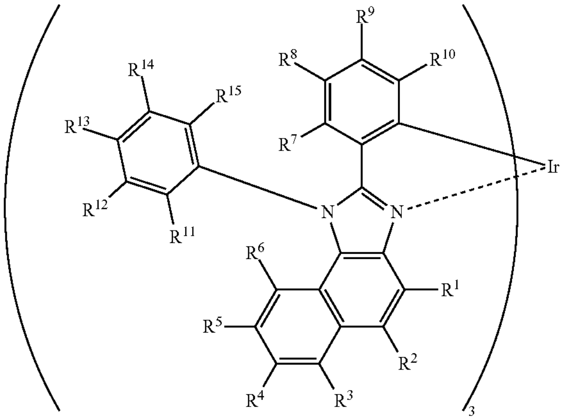

In the above structure, it is preferable that General Formula (G-3) be represented by General Formula (G-8).

[Chemical Formula 8]

(G-8)

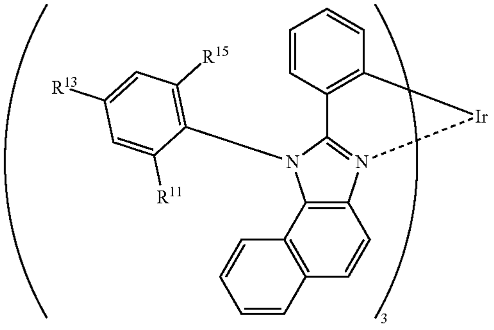

In the above structure, it is preferable that General Formula (G-4) be represented by General Formula (G-9).

[Chemical Formula 9]

(G-9)

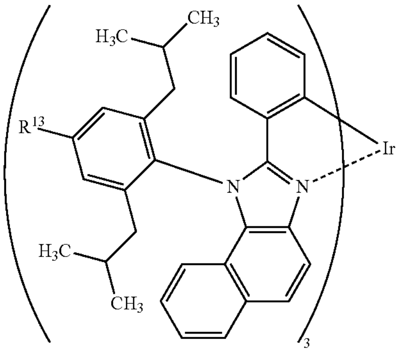

In the above structure, it is preferable that General Formula (G-5) be represented by General Formula (G-10).

[Chemical Formula 10]

(G-10)

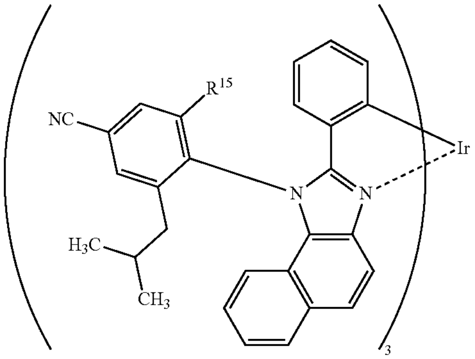

In the above structure, it is preferable that General Formula (G-1) be represented by General Formula (G-11).

[Chemical Formula 11]

(G-11)

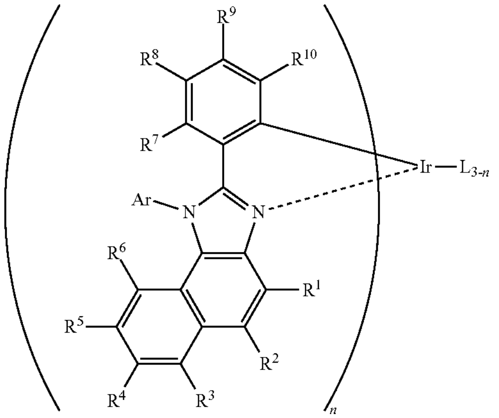

In General Formula (G-11), L represents a monoanionic ligand, and n represents 1 or 2.

In the above structure, it is preferable that General Formula (G-2) be represented by General Formula (G-12).

[Chemical Formula 12]

(G-12)

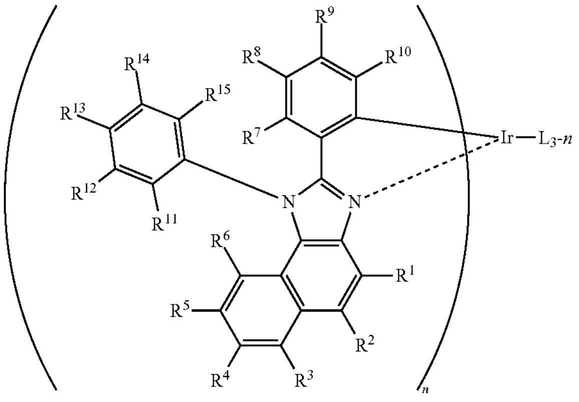

In General Formula (G-12), L represents a monoanionic ligand, and n represents 1 or 2.

In the above structure, it is preferable that General Formula (G-3) be represented by General Formula (G-13).

[Chemical Formula 13]

(G-13)

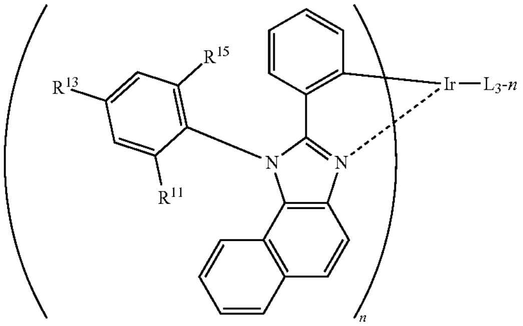

In General Formula (G-13), L represents a monoanionic ligand, and n represents 1 or 2.

In the above structure, it is preferable that General Formula (G-4) be represented by General Formula (G-14).

[Chemical Formula 14]

(G-14)

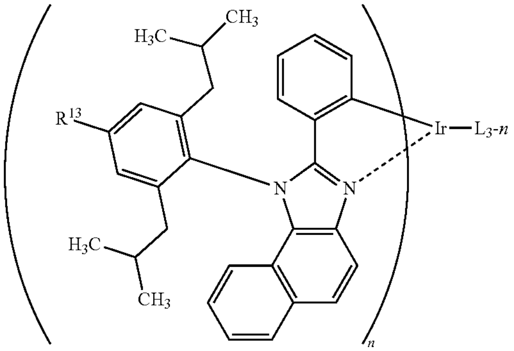

In General Formula (G-14), L represents a monoanionic ligand, and n represents 1 or 2.

In the above structure, it is preferable that General Formula (G-5) be represented by General Formula (G-15).

[Chemical Formula 15]

(G-15)

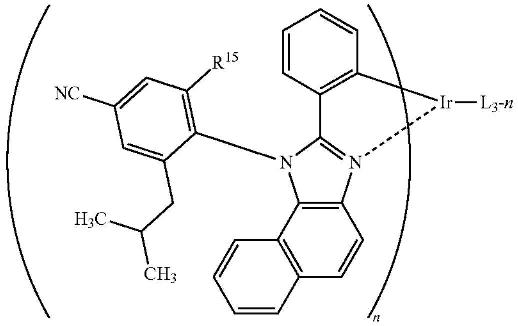

In General Formula (G-15), L represents a monoanionic ligand, and n represents 1 or 2.

In each of General Formulae (G-3), (G-8), and (G-13), it is preferable that each of $R^{11}$ and $R^{15}$ independently represent any of hydrogen, an alkyl group having 1 to 6 carbon atoms, and a substituted or unsubstituted cycloalkyl group having 3 to 7 carbon atoms, and $R^{13}$ represent hydrogen or an electron-withdrawing group.

In the above structure, it is preferable that the electron-withdrawing group be any one of a halogeno group, a cyano group, and a trifluoromethyl group.

In the above structure, the alkyl group is preferably a branched-chain alkyl group having 3 to 6 carbon atoms.

In the above structures, the monoanionic ligand is preferably a monoanionic bidentate chelate ligand having a β-diketone structure, a monoanionic bidentate chelate ligand having a carboxyl group, a monoanionic bidentate chelate ligand having a phenolic hydroxyl group, a monoanionic bidentate chelate ligand in which two ligand elements are both nitrogen, or a bidentate ligand forming a metal-carbon bond with iridium by cyclometalation.

In the above structure, the monoanionic ligand is preferably any one of General Formulae (L1) to (L9) below.

[Chemical Formula 16]

(L1)

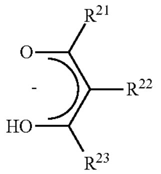

(L2)

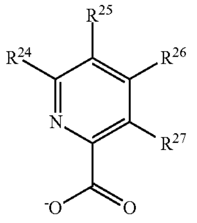

(L3)

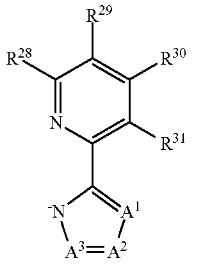

(L4)

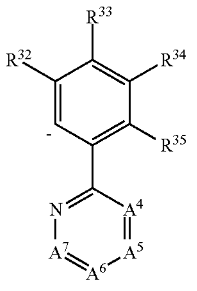

-continued (L5)

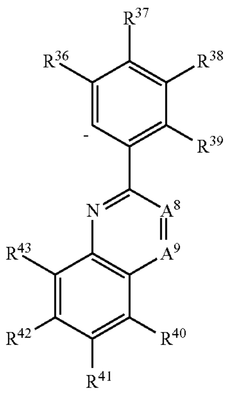

(L6)

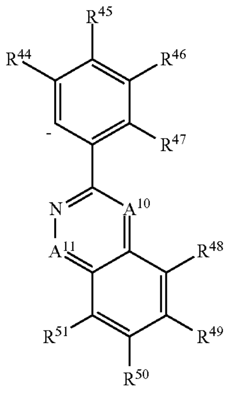

(L7)

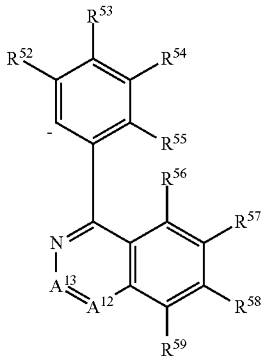

(L8)

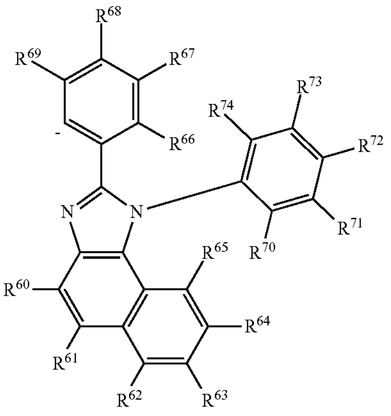

-continued (L9)

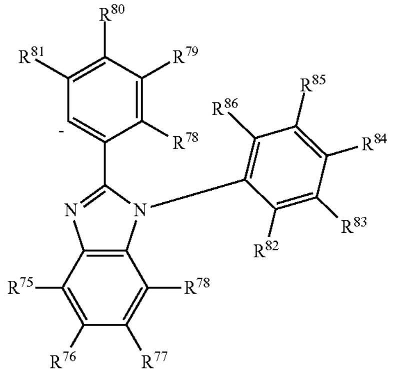

In General Formulae (L1) to (L9), each of $R^{21}$ to $R^{86}$ independently represents any of hydrogen, a substituted or unsubstituted alkyl group having 1 to 6 carbon atoms, a halogeno group, a vinyl group, a cyano group, a substituted or unsubstituted haloalkyl group having 1 to 6 carbon atoms, a substituted or unsubstituted alkoxy group having 1 to 6 carbon atoms, a substituted or unsubstituted alkylthio group having 1 to 6 carbon atoms, and a substituted or unsubstituted aryl group having 6 to 13 carbon atoms. Each of $A^1$ to $A^{13}$ independently represents any of nitrogen, $sp^2$ hybridized carbon bonded to hydrogen, and $sp^2$ hybridized carbon having a substituent, and the substituent is any of an alkyl group having 1 to 6 carbon atoms, a halogeno group, a haloalkyl group having 1 to 6 carbon atoms, and a phenyl group.

Another embodiment of the present invention is an organic compound represented by any one of Structure Formulae (100) to (103) below.

[Chemical Formula 17]

(100)

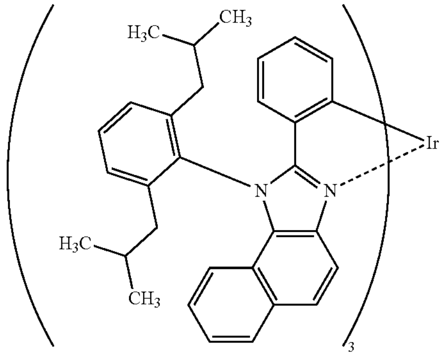

-continued (101)

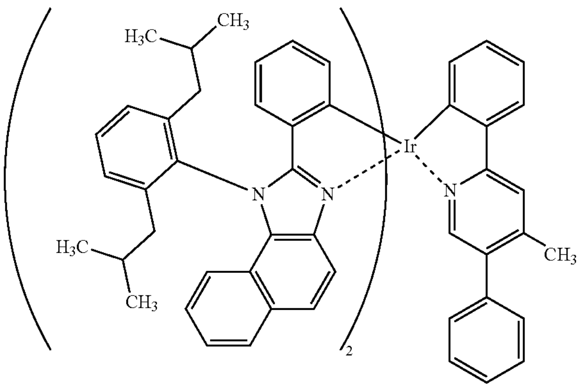

(102)

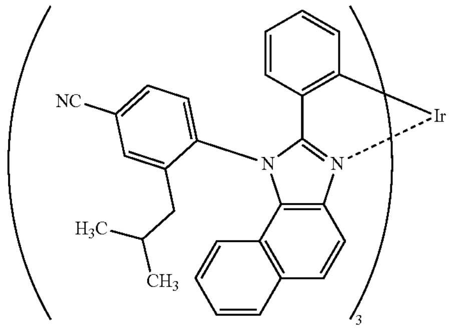

(103)

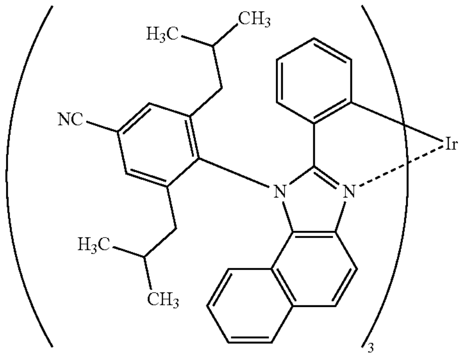

Another embodiment of the present invention is a light-emitting device that includes an EL layer between a pair of electrodes, and includes the organic compound described in any of the above structures in the EL layer. The organic compound is preferably included in a light-emitting layer in the EL layer.

Note that the light-emitting device having any of the above structures includes an EL layer between an anode and a cathode. The EL layer preferably includes at least a light-emitting layer. In addition, the EL layer may include a hole-injection layer, a hole-transport layer, an electron-transport layer, an electron-injection layer, and other functional layers.

Another embodiment of the present invention is a display device including the light-emitting device having any of the above structures, and at least one of a color filter and a transistor. Another embodiment of the present invention is an electronic device including the display device, and at least one of a housing and a touch sensor. Another embodiment of the present invention is a lighting device including the light-emitting device having any of the above structures, and at least one of a housing and a touch sensor. The category of one embodiment of the present invention includes not only a light-emitting apparatus including a light-emitting device but also an electronic device including a light-emitting apparatus. Accordingly, a light-emitting apparatus in this specification refers to an image display device or a light source (including a lighting device). A display module in which a connector such as an FPC (Flexible Printed Circuit) or a TCP (Tape Carrier Package) is connected to a light-emitting device, a display module in which a printed wiring board is provided on the tip of a TCP, and a display module in which an IC (integrated circuit) is directly mounted on a light-emitting device by a COG (Chip On Glass) method are also embodiments of the present invention.

Effect of the Invention

According to one embodiment of the present invention, a novel organometallic complex can be provided. According to one embodiment of the present invention, a novel organometallic complex including a 1H-naphtho[1,2-d]imidazole skeleton can be provided. According to one embodiment of the present invention, an organometallic complex with a high quantum yield can be provided. According to one embodiment of the present invention, a light-emitting device having high emission efficiency can be provided. According to one embodiment of the present invention, a light-emitting device having a long lifetime can be provided. According to one embodiment of the present invention, a light-emitting device having high color purity can be provided. According to one embodiment of the present invention, a light-emitting device having a low drive voltage can be provided.

According to one embodiment of the present invention, a light-emitting device, a light-emitting apparatus, and an electronic device each having high reliability can be provided. According to one embodiment of the present invention, a light-emitting device, a light-emitting apparatus, and an electronic device each having low power consumption can be provided.

Note that the description of these effects does not preclude the existence of other effects. Note that one embodiment of the present invention does not have to have all these effects. Other effects will be apparent from the description of the specification, the drawings, the claims, and the like, and other effects can be derived from the description of the specification, the drawings, the claims, and the like.

MODE FOR CARRYING OUT THE INVENTION

Figure 1A:
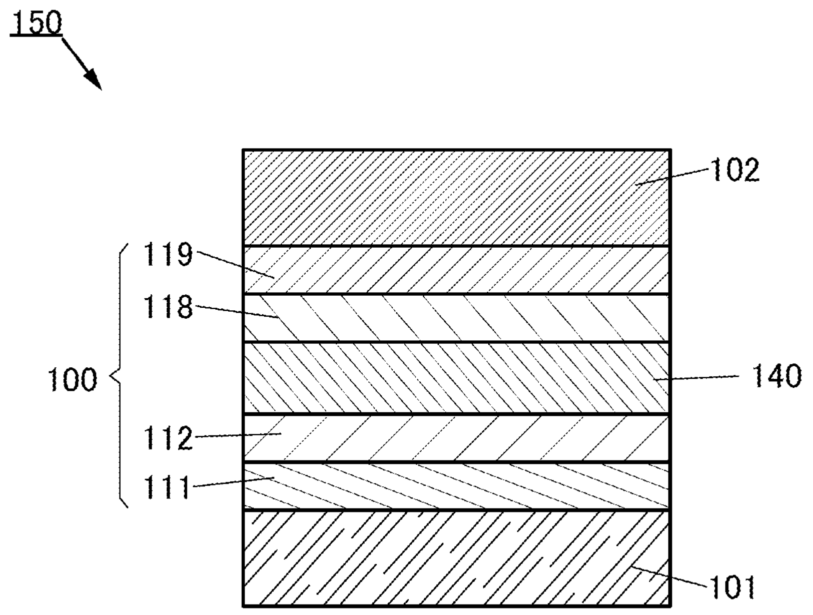
FIGS. 1(A) and 1(B) are each a schematic diagram of a light-emitting device of one embodiment of the present invention.

Hereinafter, embodiments of the present invention will be described. Note that the present invention can be implemented in many different modes, and it is easily understood by those skilled in the art that modes and details of the present invention can be changed in various ways without departing from the spirit and scope thereof. Thus, the present invention should not be interpreted as being limited to description of the embodiments.

Note that in each drawing described in this specification, the size and the thickness of an anode, an EL layer, an intermediate layer, a cathode, and the like are exaggerated for clarity in some cases. Therefore, the sizes of the components are not limited to the sizes in the drawings and relative sizes between the components.

Note that the ordinal numbers such as first, second, and third in this specification and the like are used for convenience and do not denote the order of steps, the positional relation, or the like. Therefore, for example, description can be made even when "first" is replaced with "second", "third", or the like as appropriate. In addition, the ordinal numbers in this specification and the like do not sometimes correspond to the ordinal numbers that are used to specify one embodiment of the present invention.

Note that in structures of the present invention described in this specification and the like, the same portions or portions having similar functions are denoted by common reference numerals in different drawings, and the description thereof is not repeated. Furthermore, the same hatch pattern is used for the portions having similar functions, and the portions are not especially denoted by reference numerals in some cases.

Note that the term "film" and the term "layer" can be interchanged with each other depending on the case or circumstances. For example, the term "conductive layer" can be changed into the term "conductive film" in some cases. As another example, the term "insulating film" can be changed into the term "insulating layer" in some cases.

Embodiment 1

In this embodiment, an organometallic complex of one embodiment of the present invention will be described below.

An organometallic complex of one embodiment of the present invention has a structure represented by General Formula (G-1) below.

[Chemical Formula 18]

(G-1)

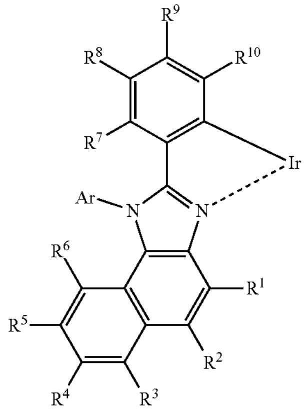

In General Formula (G-1), each of $R^1$ to $R^{10}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group, and Ar represents a substituted or unsubstituted aryl group having 6 to 25 carbon atoms.

The organometallic complex of one embodiment of the present invention includes a 1H-naphtho[1,2-d]imidazole skeleton as a ligand. When the organometallic complex with this structure is used for a light-emitting device, the light-emitting device can have high emission efficiency and/or high reliability.

The ligand included in the organometallic complex of one embodiment of the present invention has a structure in which a benzene ring is fused to a benzene ring included in a benzimidazole skeleton. This structure improves the molecular stability; thus, a highly reliable light-emitting device can be obtained. In addition, an organometallic complex with a high emission quantum yield can be obtained.

When a substituted or unsubstituted aryl group having 6 to 25 carbon atoms is bonded to the 1-position of the 1H-naphtho[1,2-d]imidazole skeleton, the stability and the sublimation property of the molecule are improved as compared to the case where hydrogen or an alkyl group is bonded to the 1-position. Therefore, a highly reliable light-emitting device can be obtained. In the case where an organic EL device is manufactured by using a vacuum evaporation method, the organic compound of one embodiment of the present invention can be suitably used.

<Fusion Position of Imidazole Skeleton and Naphthalene Skeleton>

The 1H-naphtho[1,2-d]imidazole skeleton included in the organometallic complex of one embodiment of the present invention can be regarded as having a structure in which a naphthalene skeleton is fused to an imidazole skeleton. Here, in the case where the naphthalene skeleton is fused to the a-position of the imidazole skeleton, an Ir complex having a structure represented by General Formula (I-1) below can be considered as an example.

[Chemical Formula 19]

(I-1)

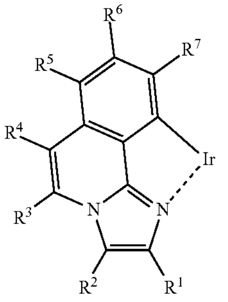

In General Formula (I-1), each of $R^1$ to $R^7$ independently represents any of hydrogen, an alkyl group having 1 to 6 carbon atoms, a substituted or unsubstituted cycloalkyl group having 3 to 7 carbon atoms, and a substituted or unsubstituted aryl group having 6 to 25 carbon atoms.

In the structure represented by General Formula (I-1), the imidazole skeleton bonded to Ir and the benzene skeleton bonded to Ir are fused to each other. The quantum yield of the structure does not tend to be high. In addition, since the imidazole skeleton bonded to Ir and the benzene skeleton bonded to Ir are fused, light emission with a long wavelength is expected as compared to the case where the two skeletons are not fused. Therefore, this structure is expected to be unsuitable for a blue or green phosphorescent material that has been particularly desired to be developed.

In contrast, the 1H-naphtho[1,2-d]imidazole skeleton included in the organometallic complex of one embodiment of the present invention has a structure in which a naphthalene skeleton is fused to the d-position of an imidazole skeleton. Here, in the case where the naphthalene skeleton is fused to the d-position of the imidazole skeleton, a 1H-naphtho[1,2-d]imidazole skeleton and a 1H-naphtho[2,1-d]imidazole skeleton are assumed due to the difference in the fusion position. The influence of the difference in fused carbon on the quantum yield is considered by molecular orbital calculation.

<Calculation Example of Net Charge>

This calculation example specifically describes calculation examples of the lowest triplet excited states ($T_1$ states) of Compound-A using, as a model, the organometallic complex which includes the 1H-naphtho[1,2-d]imidazole skeleton and is one embodiment of the present invention, and, for comparison, Compound-B using, as a model, an organometallic complex including a 1H-naphtho[2,1-d]imidazole skeleton. Structures of Compound-A and Compound-B are shown below. In the structure formula of Compound-A, a benzene ring indicated by a is fused to the side opposite to Ir with respect to N (nitrogen) bonded to Ir. In contrast, in the structure formula of Compound-B, a benzene ring indicated by b is fused to the same side as Ir with respect to N (nitrogen) bonded to Ir. In the case where the 1H-naphtho[2,1-d]imidazole skeleton is used as a ligand of an Ir complex, a benzene ring is fused in the direction same as that in Compound-B.

[Chemical Formula 20]

Compound-A

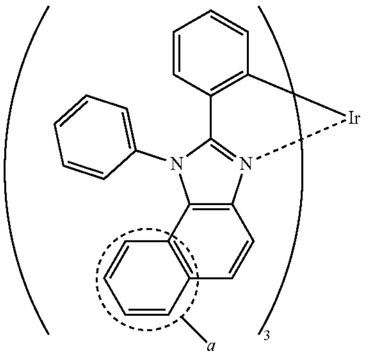

Compound-B

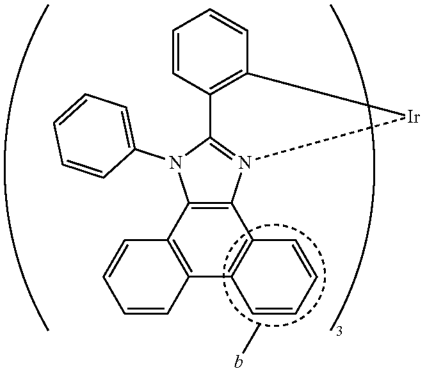

The Gaussian09 program was used for molecular orbital calculations. As a functional, B3PW91 was used, and structural optimization and vibration calculation were performed. As basis functions, LANL2DZ was used for Ir and 6-311G was used for other elements.

The net charge on Ir in the optimal structure obtained from the calculation was calculated as 0.30 in Compound-A, while being calculated as 0.20 in Compound-B.

The result was obtained in which Compound-A had advantageously larger net charge than Compound-B. Metal-Ligand Charge Transfer (MLCT) is transition to which the 5d orbital of Ir and π* of a ligand contribute. Large net charge of Ir in an excited state is given as one factor of a high MLCT property. Thus, it was found that Compound-A using the organometallic complex of one embodiment of the present invention as a model had a higher MLCT property in an excited state than Compound-B. The MLCT property and the quantum yield of a phosphorescent material are known to correlate; thus, it is expected that a high MLCT property results in a high emission quantum yield. Accordingly, the organic compound of one embodiment of the present invention was found to have a high emission quantum yield.

In the structure formula of Compound-B, the benzene ring represented by b exists in the direction causing steric hindrance with Ir. Thus, it is expected that a bond distance between Ir and N (nitrogen) included in the imidazole skeleton is short in Compound-B. Therefore, it is considered that the net charge on Ir is small in Compound-B as described above. Since an Ir complex including the 1H-naphtho[2,1-d]imidazole skeleton also includes a benzene ring indicated by b in the structure formula, it is assumed that the Ir complex also has small net charge like Compound-B. In contrast, the benzene ring indicated by a in the structure formula of Compound-A does not cause steric hindrance with Ir. Therefore, it is considered that Compound-A has larger net charge than Compound-B.

Accordingly, when an organometallic complex having a structure in which a naphthalene skeleton is fused to an imidazole skeleton is considered, the organometallic complex can have a high emission quantum yield by using the 1H-naphtho[1,2-d]imidazole skeleton.

The aryl group having 6 to 25 carbon atoms is preferably a substituted or unsubstituted phenyl group. This structure enables the organometallic complex of one embodiment of the present invention to be synthesized at low cost or with ease. Thus, General Formula (G-1) is preferable a structure represented by General Formula (G-2) below.

[Chemical Formula 21]

(G-2)

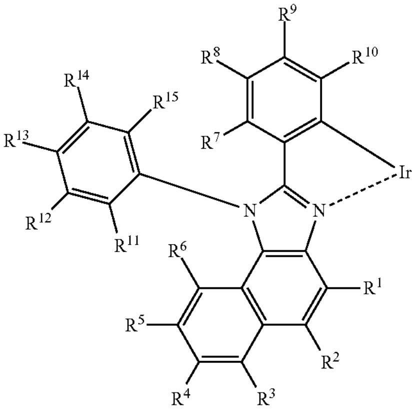

In General Formula (G-2), each of $R^1$ to $R^{15}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group.

The organometallic complex of one embodiment of the present invention has a structure represented by General Formula (G-3) below.

[Chemical Formula 22]

(G-3)

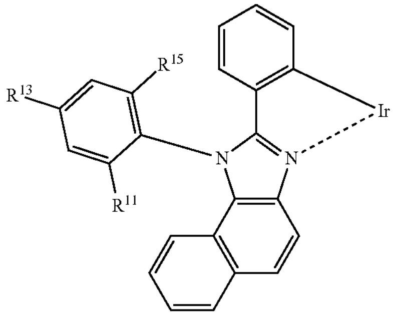

In General Formula (G-3), each of $R^{11}$, $R^{13}$, and $R^{15}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group.

In General Formulae (G-2) and (G-3), it is preferable that at least one of $R^{11}$ and $R^{15}$ be an alkyl group having 1 to 6 carbon atoms. With this structure, a material with an excellent sublimation property can be formed; thus, the material use efficiency can be increased in manufacturing a light-emitting device by a vacuum evaporation method. Moreover, in the case where at least one of and $R^{15}$ is an alkyl group having 1 to 6 carbon atoms in the phenyl group to which and $R^{15}$ are bonded, a dihedral angle between the phenyl group and the 1H-naphtho[1,2-d]imidazole skeleton becomes large because of the steric hindrance of the alkyl group. Therefore, conjugation between the phenyl group and the 1H-naphtho[1,2-d]imidazole skeleton does not easily extend, and thus the emission wavelength can be shifted to a short wavelength side. In addition, the alkyl group is further preferably a branched-chain alkyl group having 3 to 7 carbon atoms. The above effects can be easily obtained with the branched-chain alkyl group. Examples of the branched-chain alkyl group include an isopropyl group, an isobutyl group, and a tertiary butyl group.

Thus, the organometallic complex of one embodiment of the present invention has a structure represented by General Formula (G-4) below.

[Chemical Formula 23]

(G-4)

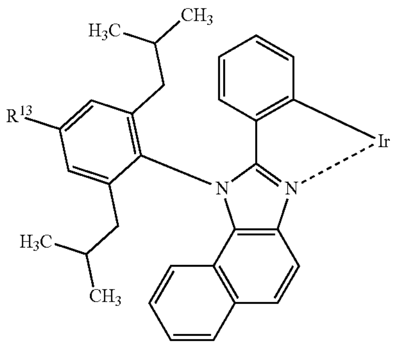

In General Formula (G-4), $R^{13}$ represents hydrogen or an electron-withdrawing group.

In General Formula (G-4), $R^{13}$ is preferably hydrogen for easier synthesis. When $R^{13}$ is an electron-withdrawing group, the LUMO (Lowest Unoccupied Molecular Orbital) level and the HOMO (Highest Occupied Molecular Orbital) level of the organometallic complex can be lowered. Accordingly, when the organometallic complex is used for a light-emitting device, an electron-injection property can be increased while a hole-injection property is maintained, and the emission efficiency can be improved. In addition, a CT (Charge Transfer) property is expected to be increased, and the spectrum width is anticipated to be widened. Therefore, a light-emitting device with a high color rendering property can be manufactured.

The organometallic complex of one embodiment of the present invention is an organometallic complex represented by General Formula (G-5) below.

[Chemical Formula 24]

(G-5)

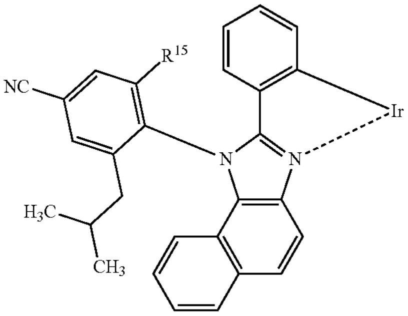

In General Formula (G-5), $R^{15}$ represents any of hydrogen, an alkyl group having 1 to 6 carbon atoms, a substituted or unsubstituted cycloalkyl group having 3 to 7 carbon atoms, and a substituted or unsubstituted aryl group having 6 to 25 carbon atoms.

When a cyano group which is an electron-withdrawing group is introduced into the 4-position of the phenyl group bonded to the 1-position of the 1H-naphtho[1,2-d]imidazole as described above, a light-emitting device with high emission efficiency can be manufactured. Moreover, a light-emitting device with a high color rendering property can be manufactured.

The organometallic complex of one embodiment of the present invention is an organometallic complex represented by General Formula (G-6) below.

[Chemical Formula 25]

(G-6)

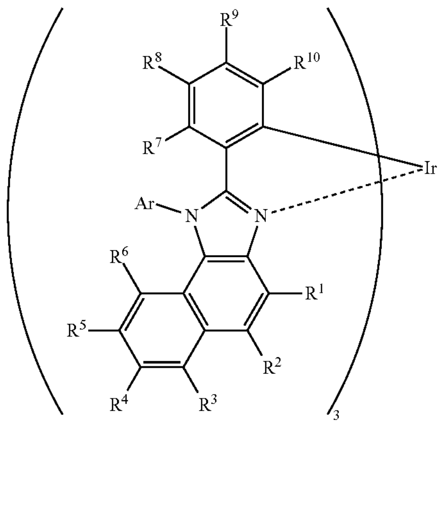

2In General Formula (G-6), each of $R^1$ to $R^{10}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group, and Ar represents a substituted or unsubstituted aryl group having 6 to 25 carbon atoms.

The organometallic complex represented by General Formula (G-6) is a tris-type complex of organometallic complexes that can be represented by General Formula (G-1), in which three kinds of ligands included in the organometallic complex are the same. A tris-type organometallic complex is preferable because it has high emission efficiency and high reliability.

The organometallic complex of one embodiment of the present invention is an organometallic complex represented by General Formula (G-7) below.

[Chemical Formula 26]

(G-7)

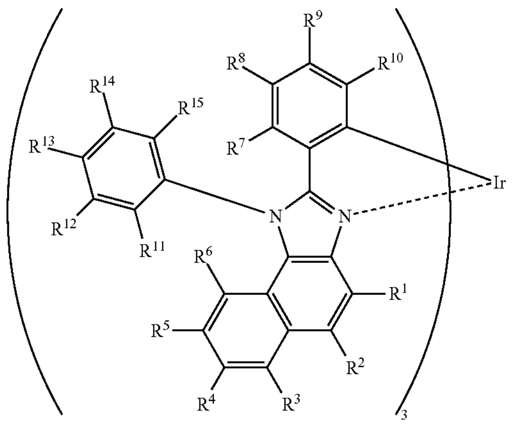

In General Formula (G-7), each of $R^1$ to $R^{15}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group.

The organometallic complex represented by General Formula (G-7) is a tris-type complex of organometallic complexes that can be represented by General Formula (G-2), in which three kinds of ligands included in the organometallic complex are the same. A tris-type organometallic complex is preferable because it has high emission efficiency and high reliability.

The organometallic complex of one embodiment of the present invention is an organometallic complex represented by General Formula (G-8) below.

[Chemical Formula 27]

(G-8)

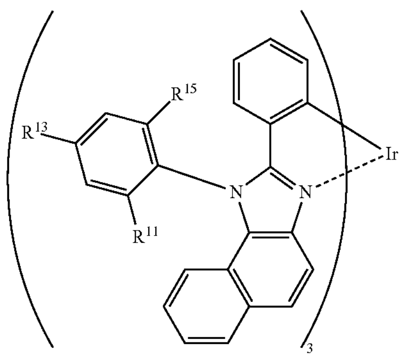

In General Formula (G-8), each of $R^{11}$, $R^{13}$, and $R^{15}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group.

The organometallic complex represented by General Formula (G-8) is a tris-type complex of organometallic complexes that can be represented by General Formula (G-3), in which three kinds of ligands included in the organometallic complex are the same. A tris-type organometallic complex is preferable because it has high emission efficiency and high reliability.

The organometallic complex of one embodiment of the present invention is an organometallic complex represented by General Formula (G-9) below.

[Chemical Formula 28]

(G-9)

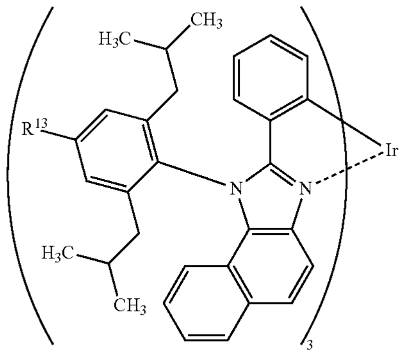

In General Formula (G-9), $R^{13}$ represents hydrogen or an electron-withdrawing group.

The organometallic complex represented by General Formula (G-9) is a tris-type complex of organometallic complexes that can be represented by General Formula (G-4), in which three kinds of ligands included in the organometallic complex are the same. A tris-type organometallic complex is preferable because it has high emission efficiency and high reliability.

The organometallic complex of one embodiment of the present invention is an organometallic complex represented by General Formula (G-10) below.

[Chemical Formula 29]

(G-10)

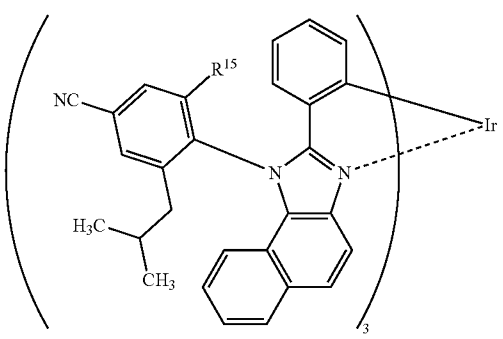

In General Formula (G-10), $R^{15}$ represents any of hydrogen, an alkyl group having 1 to 6 carbon atoms, a substituted or unsubstituted cycloalkyl group having 3 to 7 carbon atoms, and a substituted or unsubstituted aryl group having 6 to 25 carbon atoms.

The organometallic complex represented by General Formula (G-10) is a tris-type complex of organometallic complexes that can be represented by General Formula (G-5), in which three kinds of ligands included in the organometallic complex are the same. A tris-type organometallic complex is preferable because it has high emission efficiency and high reliability.

The organometallic complex of one embodiment of the present invention is an organometallic complex represented by General Formula (G-11) below.

[Chemical Formula 30]

(G-11)

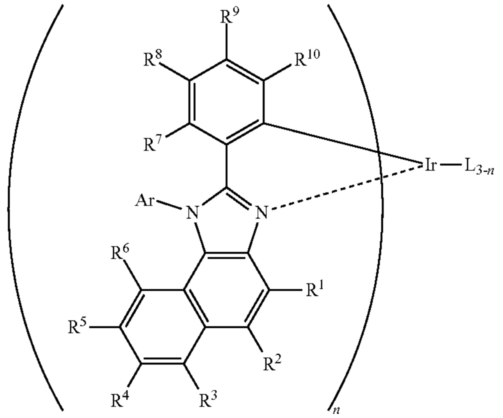

In General Formula (G-11), each of $R^1$ to $R^{10}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group, Ar represents a substituted or unsubstituted aryl group having 6 to 25 carbon atoms, L represents a monoanionic ligand, and n represents 1 or 2.

The organometallic complex represented by General Formula (G-11) is a hetero-type complex of organometallic complexes that can be represented by General Formula (G-1), which includes two or more kinds of ligands. A hetero-type organometallic complex is preferable because an emission color and a sublimation property can be adjusted by selecting a combination of ligands.

The organometallic complex of one embodiment of the present invention is an organometallic complex represented by General Formula (G-12) below.

[Chemical Formula 31]

(G-12)

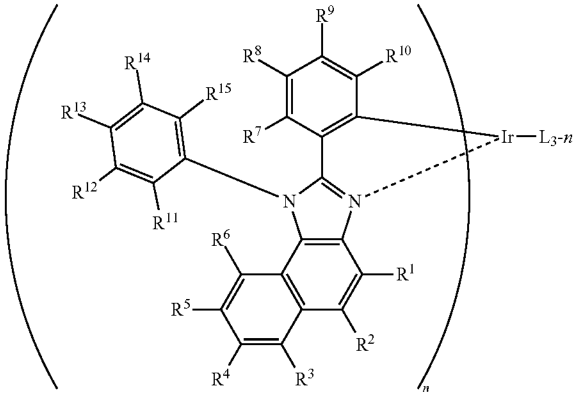

In General Formula (G-12), each of $R^1$ to $R^{15}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group, L represents a monoanionic ligand, and n represents 1 or 2.

The organometallic complex represented by General Formula (G-12) is a hetero-type complex of organometallic complexes that can be represented by General Formula (G-2), which includes two or more kinds of ligands. A hetero-type organometallic complex is preferable because an emission color and a sublimation property can be adjusted by selecting a combination of ligands.

The organometallic complex of one embodiment of the present invention is an organometallic complex represented by General Formula (G-13) below.

[Chemical Formula 32]

(G-13)

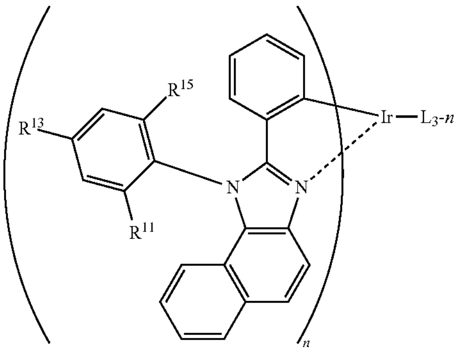

In General Formula (G-13), each of $R^{11}$, $R^{13}$, and $R^{15}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group, L represents a monoanionic ligand, and n represents 1 or 2.

The organometallic complex represented by General Formula (G-13) is a hetero-type complex of organometallic complexes that can be represented by General Formula (G-3), which includes two or more kinds of ligands. A hetero-type organometallic complex is preferable because an emission color and a sublimation property can be adjusted by selecting a combination of ligands.

The organometallic complex of one embodiment of the present invention is an organometallic complex represented by General Formula (G-14) below.

[Chemical Formula 33]

(G-14)

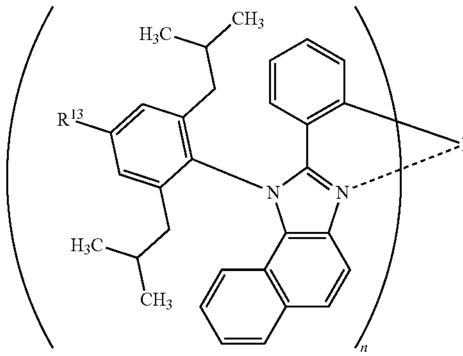

In General Formula (G-14), $R^{13}$ represents an electron-withdrawing group, L represents a monoanionic ligand, and n represents 1 or 2.

The organometallic complex represented by General Formula (G-14) is a hetero-type complex of organometallic complexes that can be represented by General Formula (G-4), which includes two or more kinds of ligands. A hetero-type organometallic complex is preferable because an emission color and a sublimation property can be adjusted by selecting a combination of ligands.

The organometallic complex of one embodiment of the present invention is an organometallic complex represented by General Formula (G-15) below.

[Chemical Formula 34]

(G-15)

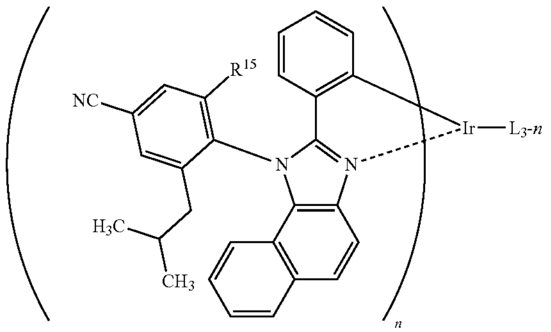

In General Formula (G-15), $R^{15}$ represents any of hydrogen, an alkyl group having 1 to 6 carbon atoms, a substituted or unsubstituted cycloalkyl group having 3 to 7 carbon atoms, and a substituted or unsubstituted aryl group having 6 to 25 carbon atoms, L represents a monoanionic ligand, and n represents 1 or 2.

The organometallic complex represented by General Formula (G-15) is a hetero-type complex of organometallic complexes that can be represented by General Formula (G-5), which includes two or more kinds of ligands. A hetero-type organometallic complex is preferable because an emission color and a sublimation property can be adjusted by selecting a combination of ligands.

In General Formulae (G-11) to (G-15), the monoanionic ligand represented by L is preferably a monoanionic bidentate chelate ligand having a β-diketone structure, a monoanionic bidentate chelate ligand having a carboxyl group, a monoanionic bidentate chelate ligand having a phenolic hydroxyl group, a monoanionic bidentate chelate ligand in which two ligand elements are both nitrogen, or a bidentate ligand forming a metal-carbon bond with iridium by cyclometalation. Specifically, the monoanionic ligand is preferably any of General Formulae (L1) to (L9) below.

[Chemical Formula 35]

(L1)

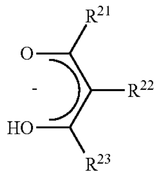

(L2)

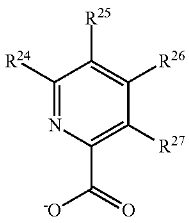

-continued (L3)

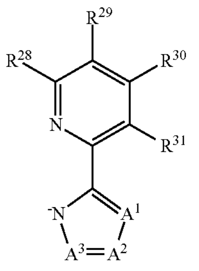

(L4)

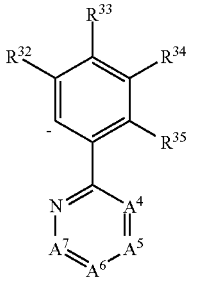

(L5)

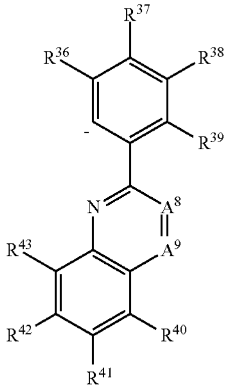

(L6)

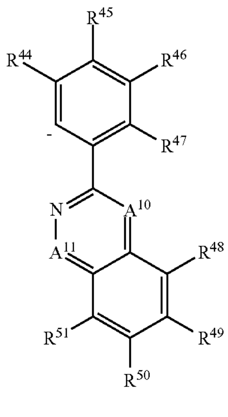

-continued (L7)

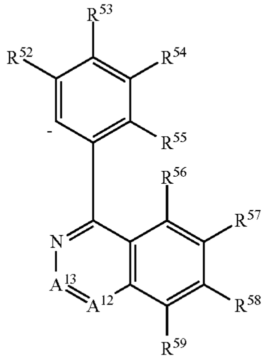

(L8)

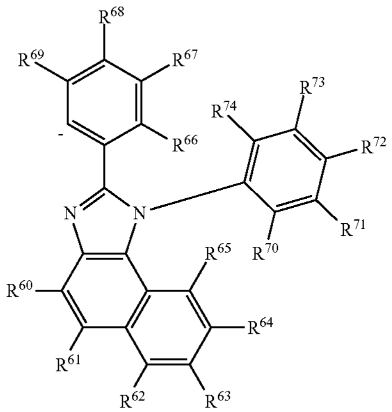

(L9)

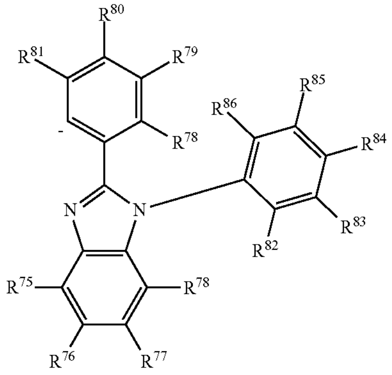

In General Formulae (L1) to (L9), each of $R^{21}$ to $R^{86}$ independently represents any of hydrogen, a substituted or unsubstituted alkyl group having 1 to 6 carbon atoms, a halogeno group, a vinyl group, a cyano group, a substituted or unsubstituted haloalkyl group having 1 to 6 carbon atoms, a substituted or unsubstituted alkoxy group having 1 to 6 carbon atoms, a substituted or unsubstituted alkylthio group having 1 to 6 carbon atoms, and a substituted or unsubstituted aryl group having 6 to 13 carbon atoms. Each of $A^1$ to $A^{13}$ independently represents any of nitrogen, $sp^2$ hybridized carbon bonded to hydrogen, and $sp^2$ hybridized carbon having a substituent, and the substituent is any of an alkyl group having 1 to 6 carbon atoms, a halogeno group, a haloalkyl group having 1 to 6 carbon atoms, and a phenyl group.

Here, in a hetero-type organometallic complex having plural kinds of ligands, the HOMO level and the LUMO level of the organometallic complex are preferably distributed in the same kind of ligands. The organometallic complex having such a structure can have particularly high emission efficiency. Thus, in General Formulae (G-11) to (G-15), L is particularly preferably (L8) or (L9). The organometallic complex of one embodiment of the present invention includes an imidazole skeleton which is a five-membered ring. Thus, L preferably has a structure including a five-membered ring skeleton. With this structure, the HOMO level and the LUMO level of the organometallic complex are easily distributed in the same ligand.

<Examples of Substituent>

In General Formulae (G-1) to (G-15), each of $R^1$ to $R^{15}$ represents, for example, any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group. Examples of the alkyl group include a methyl group, an ethyl group, a propyl group, an isopropyl group, a butyl group, an isobutyl group, a tert-butyl group, and an n-hexyl group; examples of the cycloalkyl group include a cyclopropyl group, a cyclobutyl group, a cyclopentyl group, and a cyclohexyl group; examples of the aryl group include a phenyl group, a naphthyl group, a biphenyl group, a fluorenyl group, and a spirofluorenyl group; and examples of the electron-withdrawing group include a halogeno group, a cyano group, a nitro group, a carbonyl group, and a haloalkyl group, where a trifluoromethyl group is particularly given as a specific example of the haloalkyl group. More specifically, groups represented by Structure Formulae (R-1) to (R-43) below can be given, for example. In particular, a halogeno group, a cyano group, and a trifluoromethyl group are preferable because they have an excellent electron-withdrawing property and high stability. Note that the groups represented by $R^1$ to $R^4$ and $R^5$ to $R^{13}$ are not limited thereto.

[Chemical Formula 36]

(R-1)

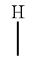

(R-2)

(R-3)

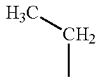

(R-4)

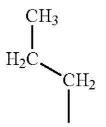

(R-5)

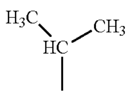

(R-6)

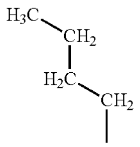

-continued (R-7)

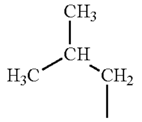

(R-8)

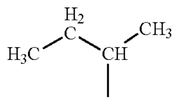

(R-9)

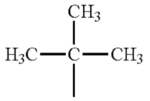

(R-10)

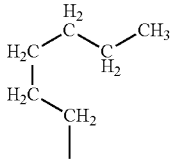

(R-11)

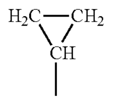

(R-12)

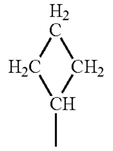

(R-13)

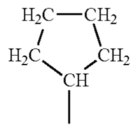

(R-14)

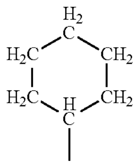

(R-15)

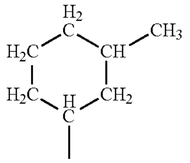

(R-16)

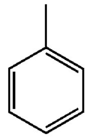

(R-17)

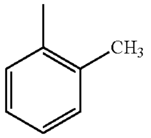

-continued
(R-18)
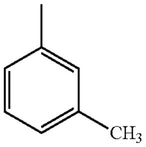
(R-19)
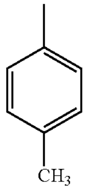
(R-20)
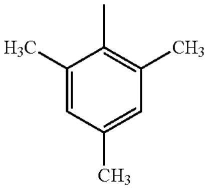
(R-21)
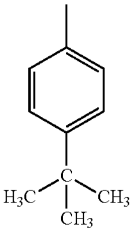
(R-22)
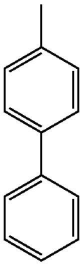
(R-23)
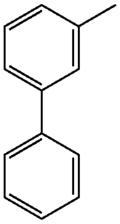
(R-24)
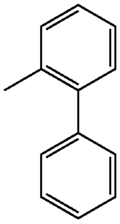
-continued
(R-25)
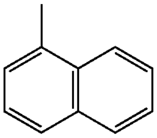
(R-26)
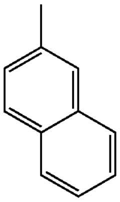
(R-27)
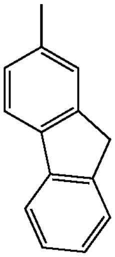
(R-28)
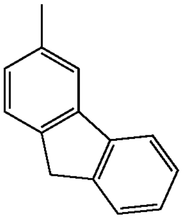
(R-29)
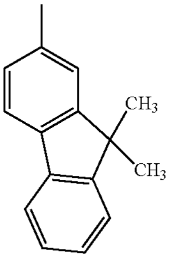
(R-30)
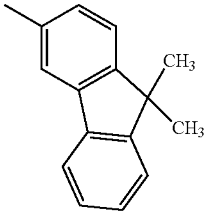
(R-31)
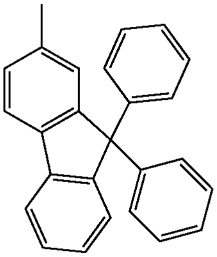

-continued (R-32)

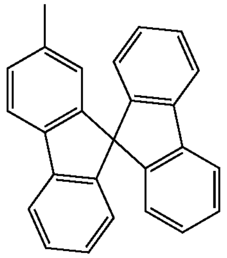

(R-33)

(R-34)

(R-35)

(R-35)

(R-36)

(R-37)

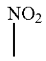

(R-38)

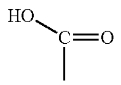

(R-39)

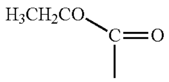

(R-40)

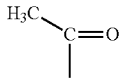

(R-41)

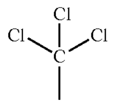

(R-42)

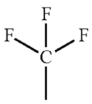

(R-43)

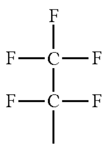

In this case, when each of $R^1$ to $R^{10}$ is hydrogen, the organometallic complex of one embodiment of the present invention can be synthesized simply at low cost. The organometallic complex is electrochemically stable and has high reliability, which is preferable. In the case of using a substituent other than hydrogen, the heat resistance of the organometallic complex of one embodiment of the present invention can be increased. In the case of using an alkyl group or a cycloalkyl group as in (R-2) to (R-15), the organometallic complex of one embodiment of the present invention can have high solubility in an organic solvent and thus can be easily purified. In the case of using an aryl group which does not include an alkyl group or a cycloalkyl group as in (R-16), (R-22) to (R-28), (R-31), and (R-32), electrochemical stability and high reliability can be obtained.

Examples of the substituted or unsubstituted aryl group having 6 to 25 carbon atoms in General Formulae (G-1), (G-6), and (G-11) include a phenyl group, a naphthyl group, a biphenyl group, a fluorenyl group, and a spirofluorenyl group. Specifically, groups represented by Structure Formulae (Ar-1) to (Ar-25) below can be used. Note that the group represented by Ar is not limited thereto. In addition, a substituent may be further included.

[Chemical Formula 37]

(Ar-1)

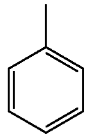

(Ar-2)

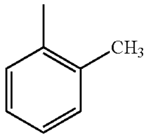

(Ar-3)

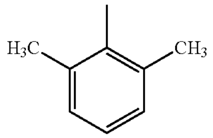

(Ar-4)

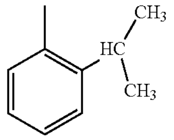

(Ar-5)

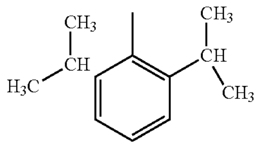

(Ar-6)

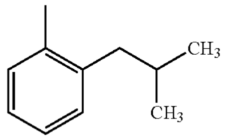

(Ar-7)

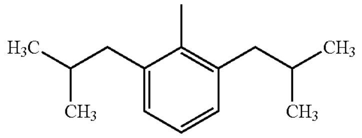

(Ar-8)

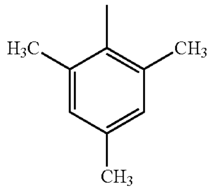

-continued
(Ar-9)
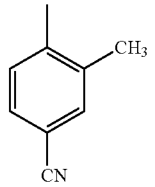
(Ar-10)
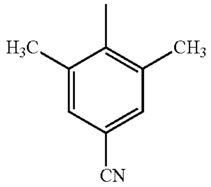
(Ar-11)
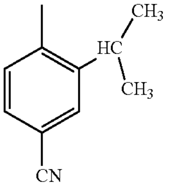
(Ar-12)
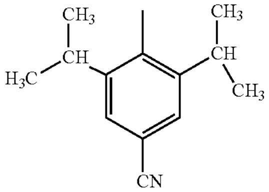
(Ar-13)
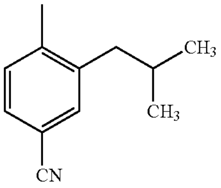
(Ar-14)
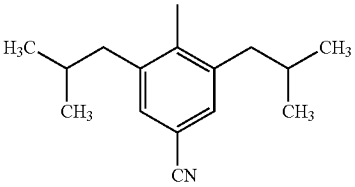
(Ar-15)
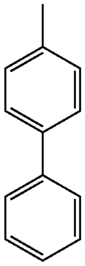
-continued
(Ar-16)
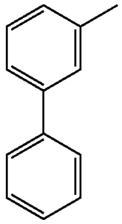
(Ar-17)
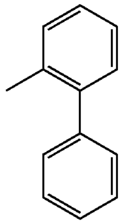
(Ar-18)
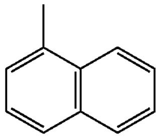
(Ar-19)
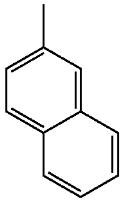
(Ar-20)
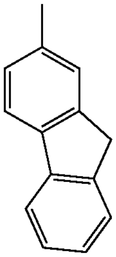
(Ar-21)
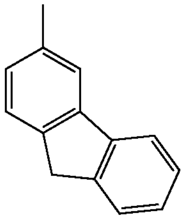
(Ar-22)
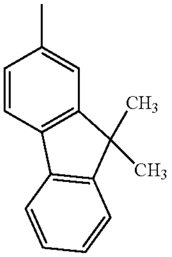

-continued (Ar-23)

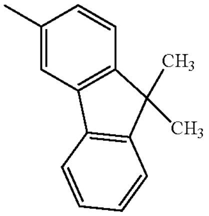

(Ar-24)

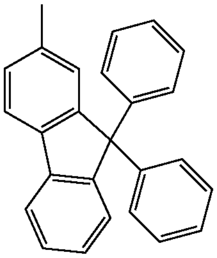

(Ar-25)

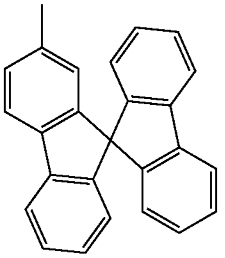

In General Formulae (L1) to (L9), each of $R^{21}$ to $R^{86}$ independently represents any of hydrogen, a substituted or unsubstituted alkyl group having 1 to 6 carbon atoms, a halogeno group, a vinyl group, a cyano group, a substituted or unsubstituted haloalkyl group having 1 to 6 carbon atoms, a substituted or unsubstituted alkoxy group having 1 to 6 carbon atoms, a substituted or unsubstituted alkylthio group having 1 to 6 carbon atoms, and a substituted or unsubstituted aryl group having 6 to 13 carbon atoms. Examples of the alkyl group include a methyl group, an ethyl group, a propyl group, an isopropyl group, a butyl group, an isobutyl group, a tert-butyl group, and an n-hexyl group; examples of the halogeno group include a fluoro group, a chloro group, a bromo group, and an iodine group; examples of the vinyl group include a vinyl group and a vinyl acetate group; examples of the haloalkyl group include a trifluoromethyl group, a pentafluoroethyl group, and a trichloromethyl group; examples of the alkoxy group include a methoxy group, an ethoxy group, and a phenoxy group; examples of the alkylthio group include a propylthio group and a butylthio group; and examples of the aryl group include a phenyl group, a naphthyl group, a biphenyl group, and a fluorenyl group. More specific examples include groups represented by Structure Formulae (R-50) to (R-95) below. Note that the groups represented by $R^{21}$ to $R^{86}$ are not limited thereto.

[Chemical Formula 38]

(R-50)

(R-51)

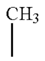

-continued (R-52)

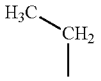

(R-53)

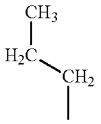

(R-54)

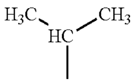

(R-55)

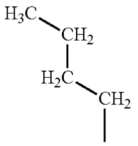

(R-56)

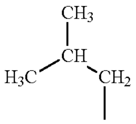

(R-57)

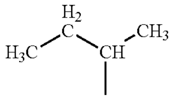

(R-58)

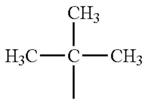

(R-59)

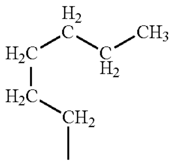

(R-60)

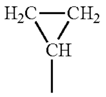

(R-61)

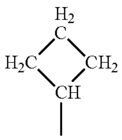

(R-62)

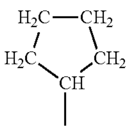

(R-63)

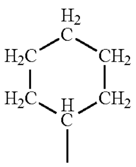

-continued
(R-64)
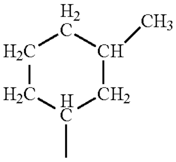
(R-65)
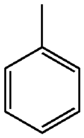
(R-66)
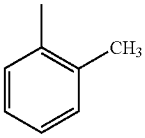
(R-67)
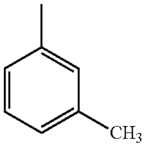
(R-68)
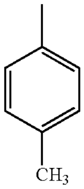
(R-69)
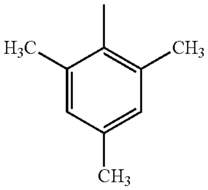
(R-70)
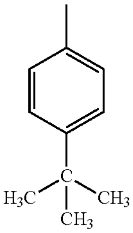
(R-71)
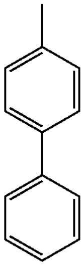
-continued
(R-72)
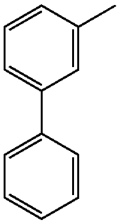
(R-73)
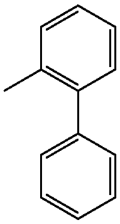
(R-74)
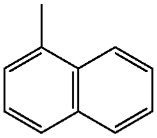
(R-75)
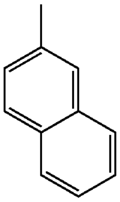
(R-76)
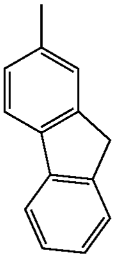
(R-77)
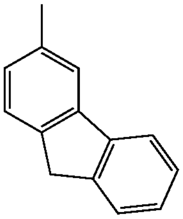
(R-78)
(R-79)
(R-80)
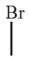
(R-81)

-continued (R-82)

(R-83)

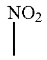

(R-84)

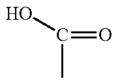

(R-85)

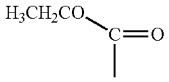

(R-86)

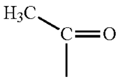

(R-87)

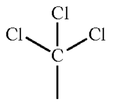

(R-88)

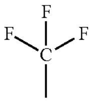

(R-89)

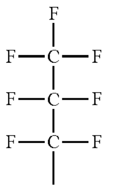

(R-90)

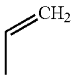

(R-91)

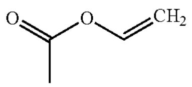

-continued (R-92)

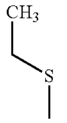

(R-93)

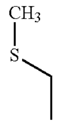

(R-94)

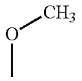

(R-95)

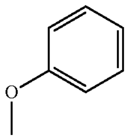

In the case where any of Ar, $R^1$ to $R^{15}$, and $R^{21}$ to $R^{86}$ in General Formulae (G1) to (G15) above further includes a substituent, examples of the substituent include an alkyl group having 1 to 6 carbon atoms, a substituted or unsubstituted cycloalkyl group having 3 to 7 carbon atoms, and a substituted or unsubstituted aryl group having 6 to 25 carbon atoms. Specific examples of the alkyl group include a methyl group, an ethyl group, a propyl group, an isopropyl group, a butyl group, an isobutyl group, a tert-butyl group, and an n-hexyl group; specific examples of the cycloalkyl group include a cyclopropyl group, a cyclobutyl group, a cyclopentyl group, and a cyclohexyl group; and specific examples of the aryl group include a phenyl group, a naphthyl group, and a fluorenyl group.

<Specific Examples of Compound>

Specific structure examples of the compounds represented by General Formulae (G-1) to (G-15) include organometallic complexes represented by Structure Formulae (100) to (123) and Structure Formulae (200) to (223) below. Note that the organometallic complexes represented by General Formulae (G-1) to (G-15) are not limited to the following examples.

[Chemical Formula 39]

(100)

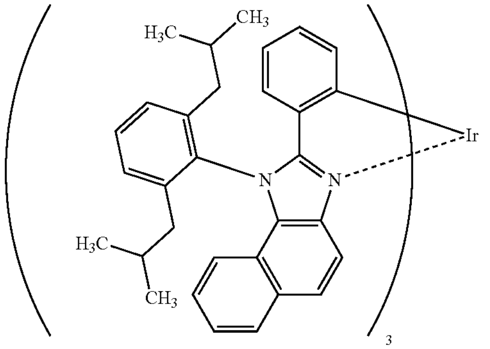

(101)

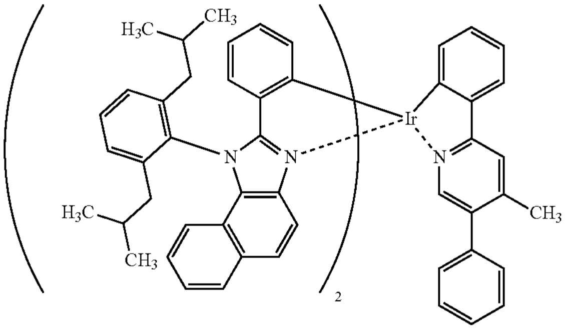

-continued
(102)
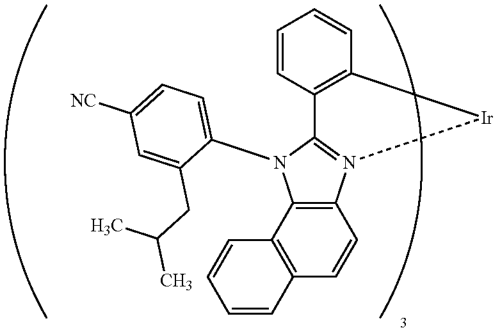
(103)
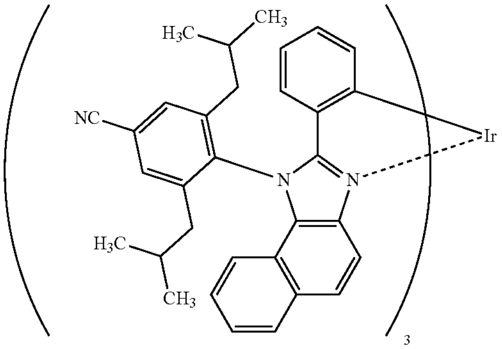
(104)
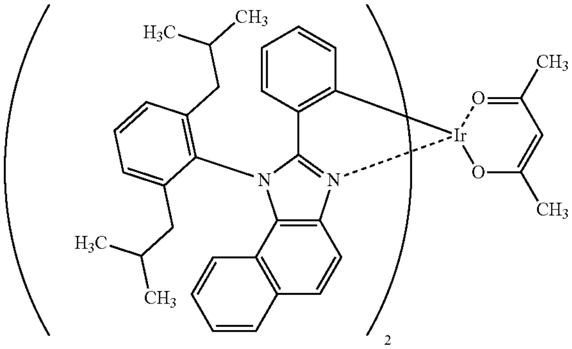
(105)
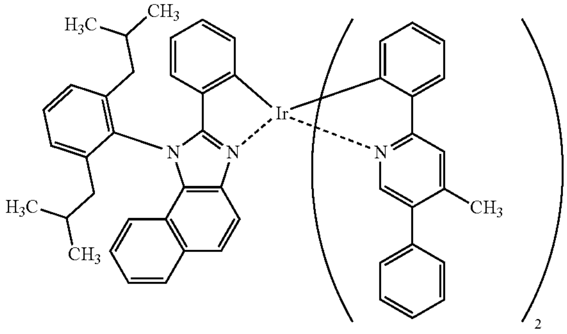
(106)
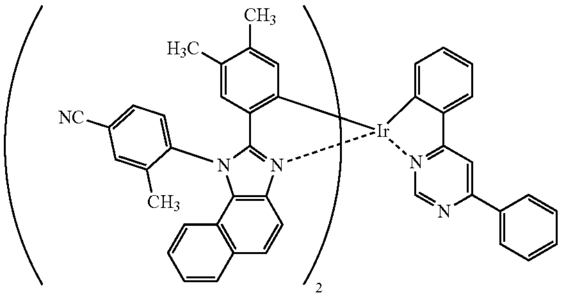
(107)
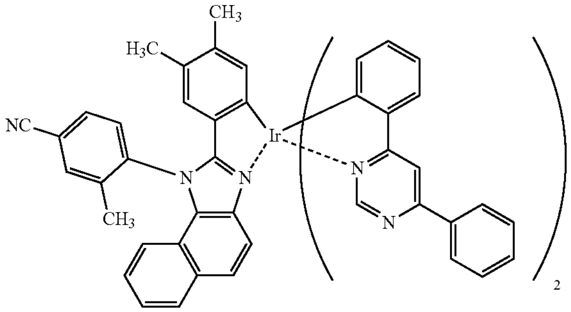
[Chemical Formula 40]
(108)
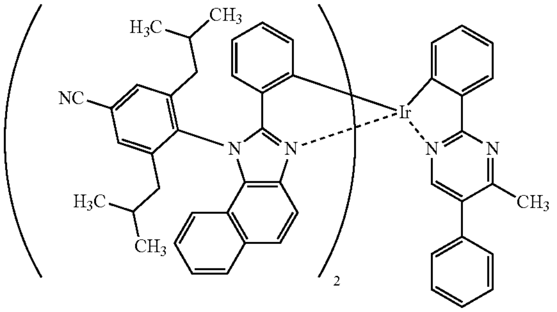
(109)
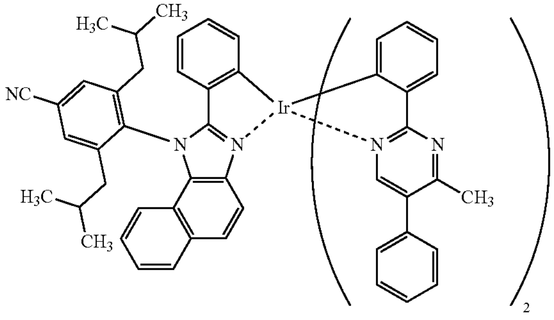

-continued
(110)
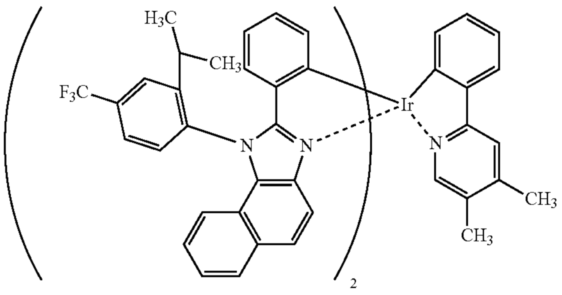
(111)
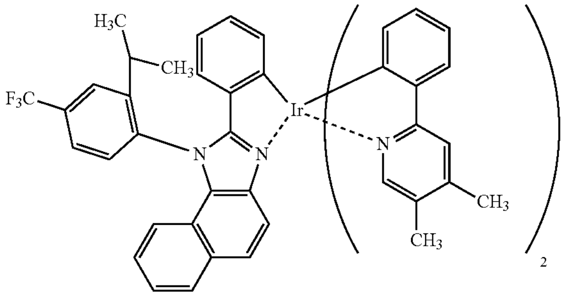
(112)
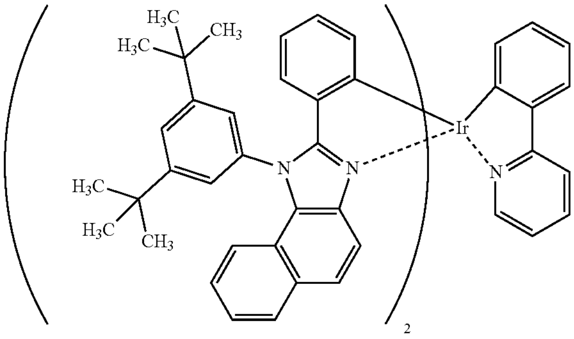
(113)
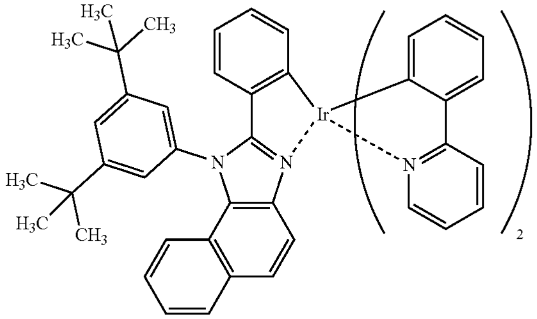
(114)
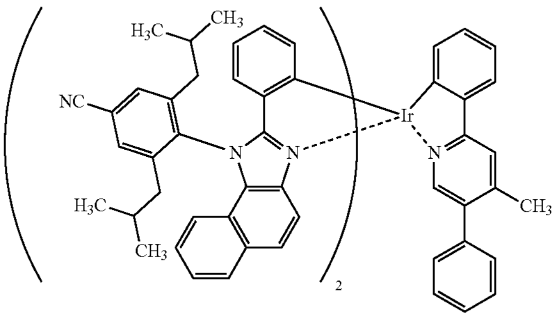
(115)
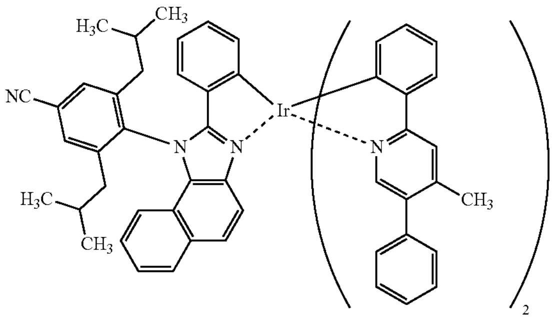
[Chemical Formula 41]
(116)
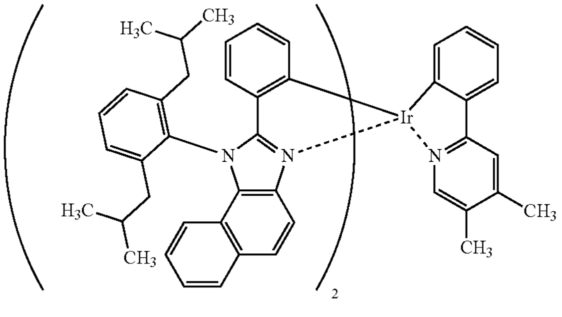
(117)
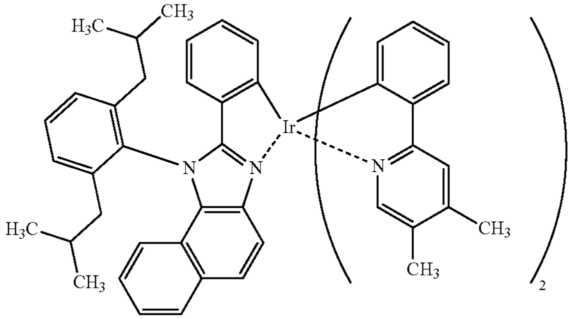

-continued
(118)
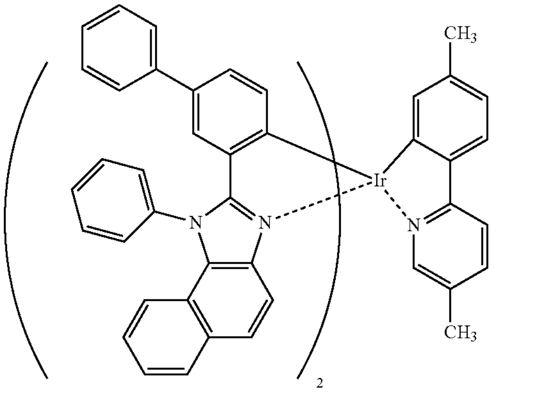
(119)
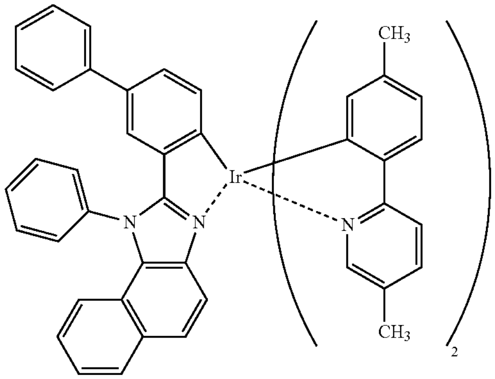
(120)
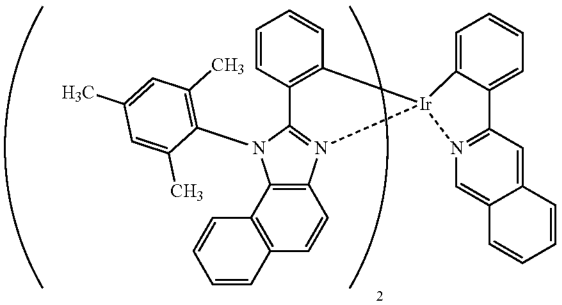
(121)
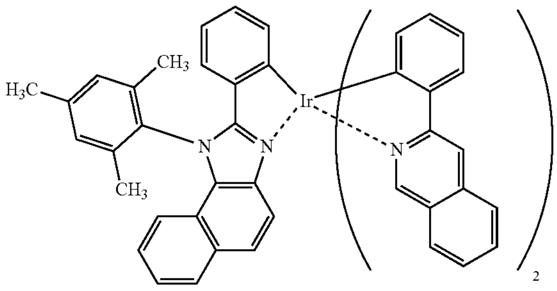
(122)
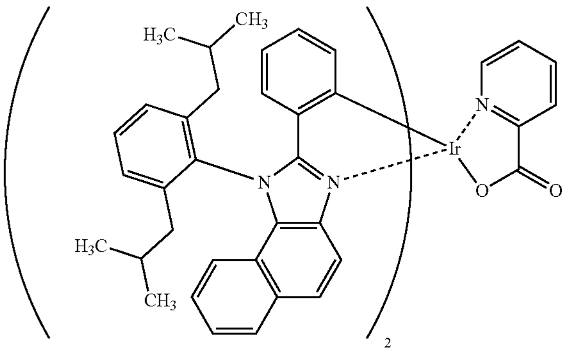
(123)
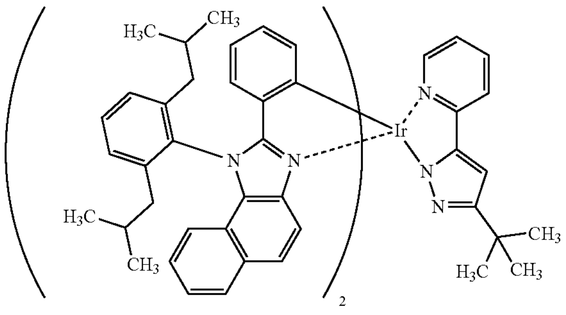
[Chemical Formula 42]
(200)
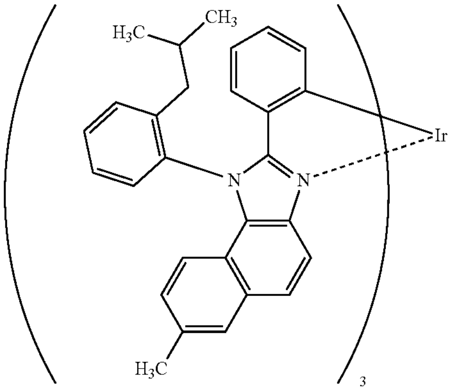
(201)
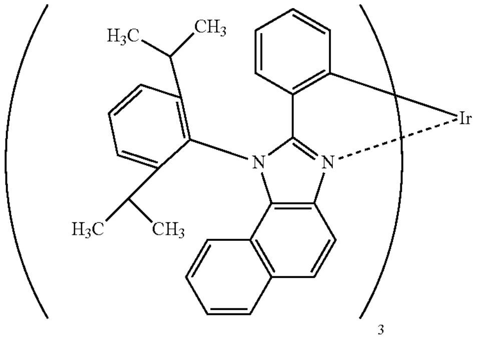

-continued
(202)
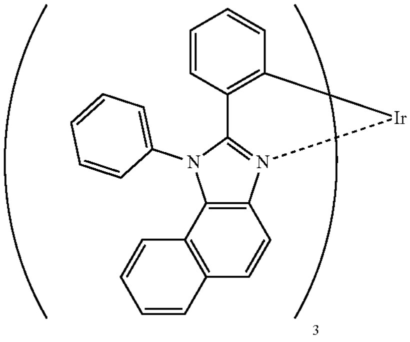
(203)
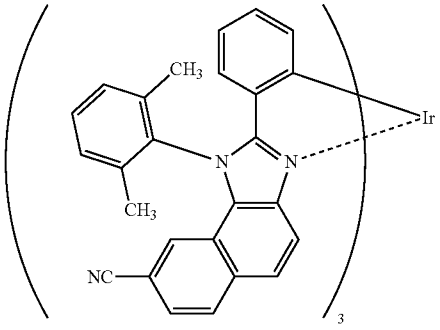
(204)
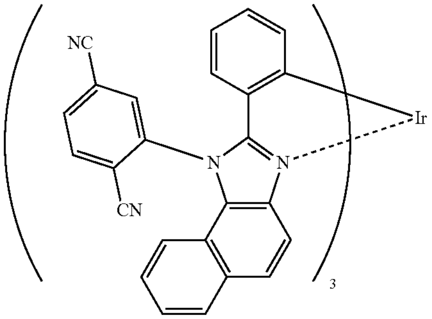
(205)
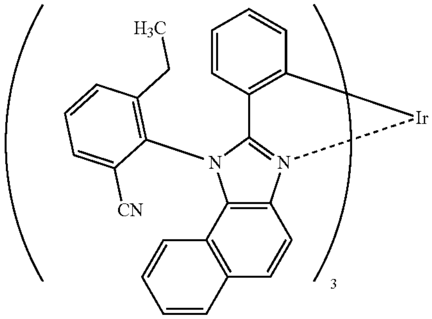
(206)
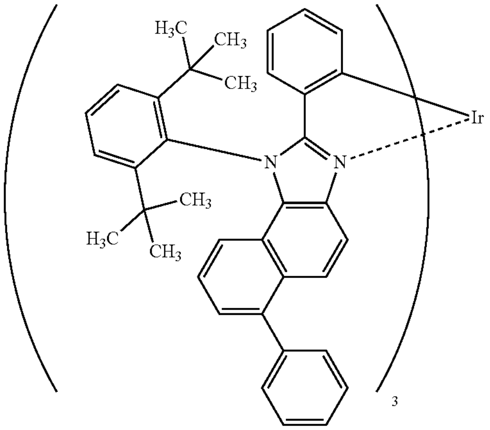
(207)
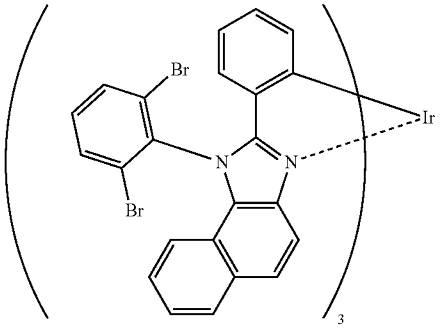
(208)
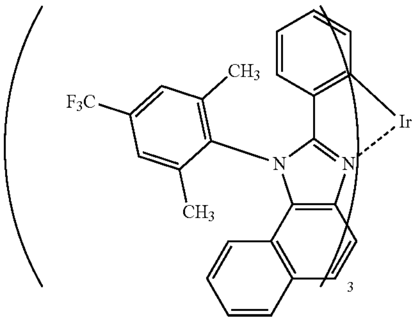
(209)
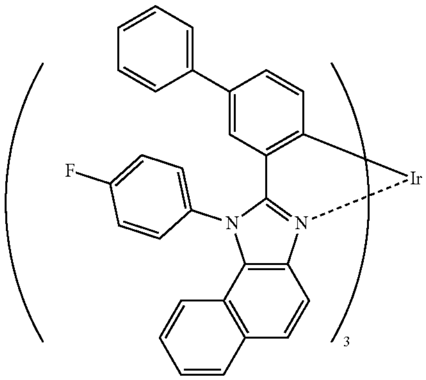

-continued
(210)
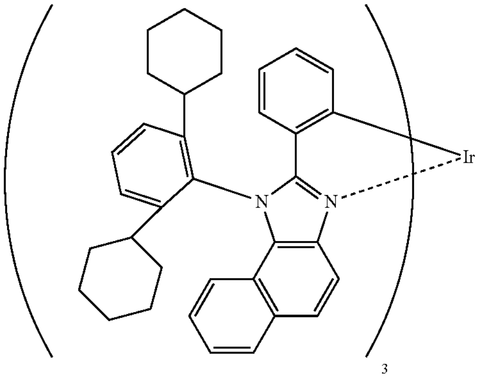
(211)
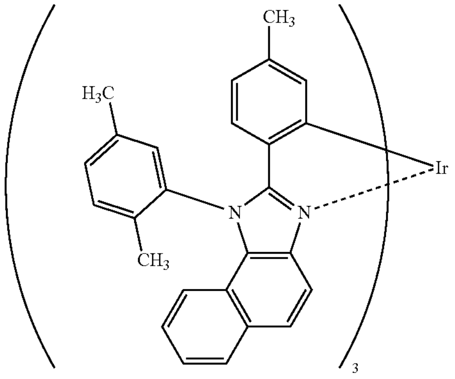
[Chemical Formula 43]
(212)
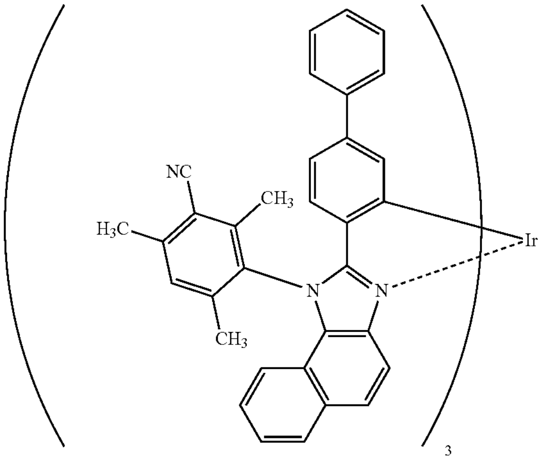
(213)
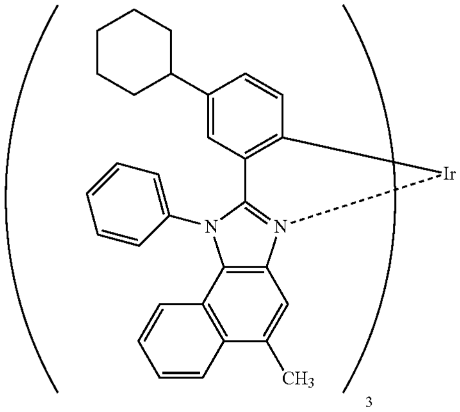
(214)
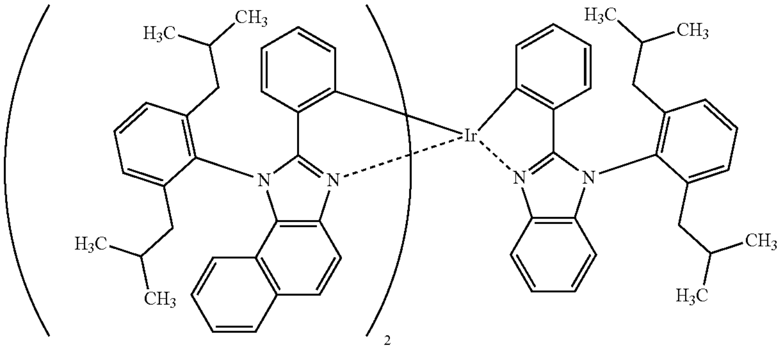
(215)
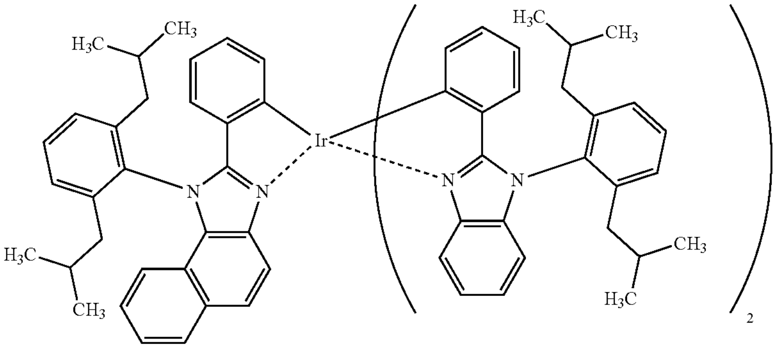

-continued
(216)
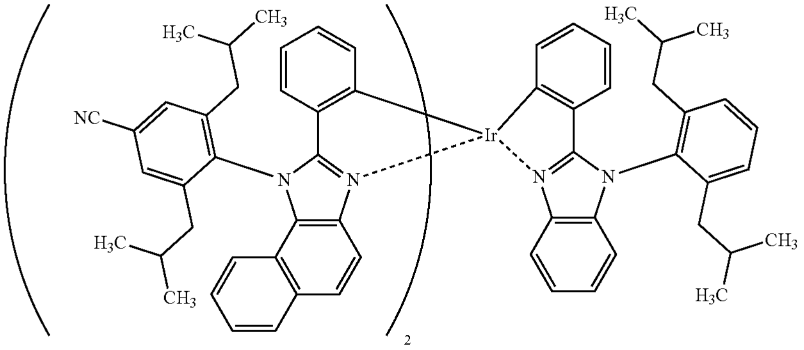
(217)
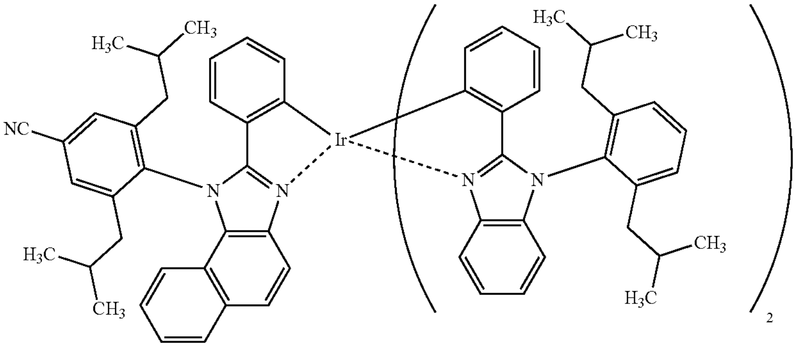
[Chemical Formula 44]
(218)
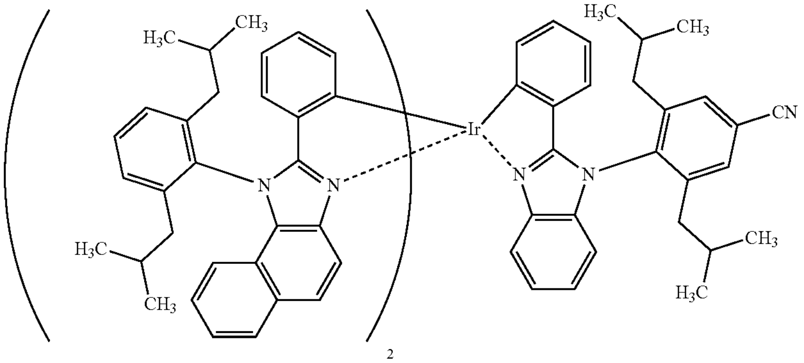
(219)
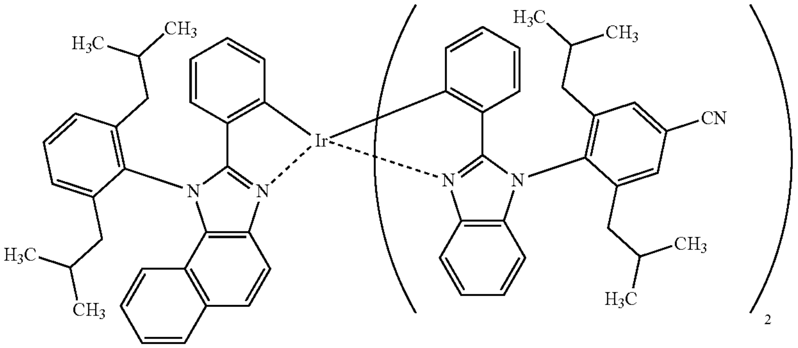

-continued
(220)
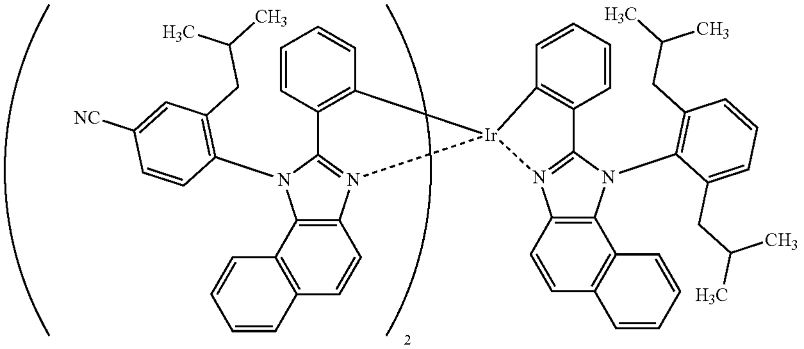
[Chemical Formula 45]
(221)
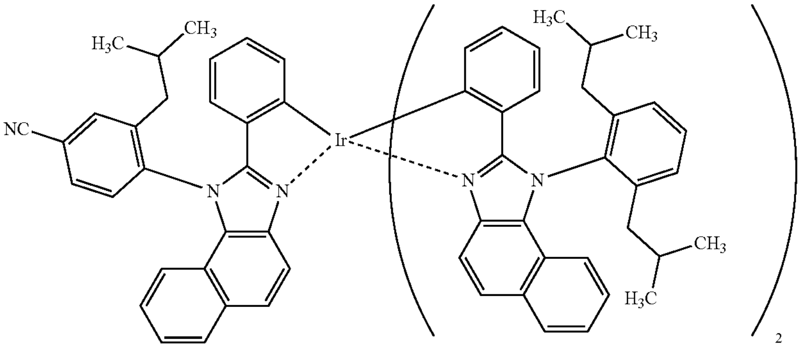
(222)
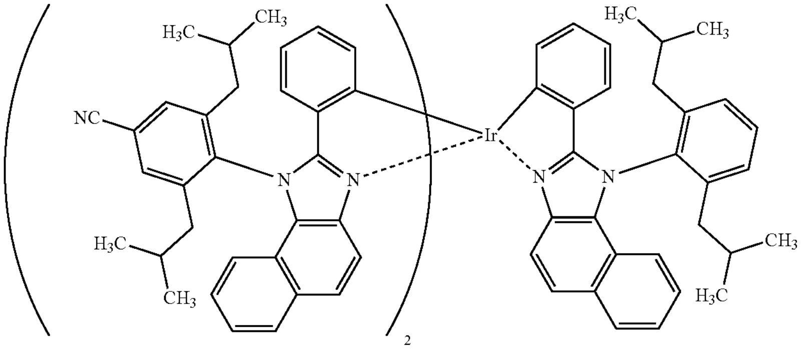
(223)
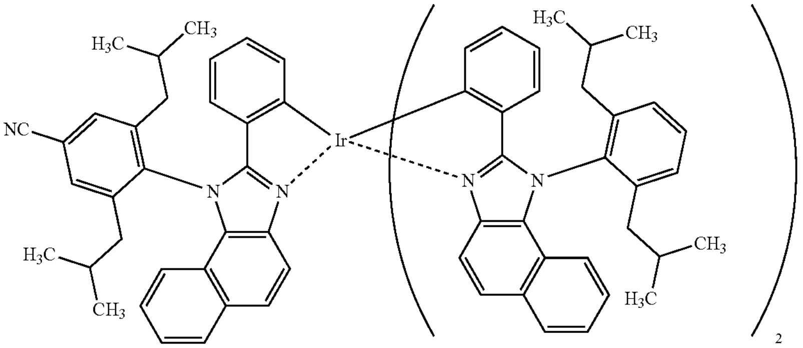

Note that the organometallic complex in this embodiment can be deposited by an evaporation method (including a vacuum evaporation method), an inkjet method, a coating method, a gravure printing method, or the like.

Note that this embodiment can be combined as appropriate with any of the other embodiments.

Embodiment 2

In this embodiment, an example of a synthesis method of the organometallic complex of one embodiment of the present invention is described.

<<Synthesis Method of 1H-Naphtho[1,2-d]Imidazole Derivative Represented by General Formula (g-1)>>

An example of a synthesis method of a 1H-naphtho[1,2-d]imidazole derivative represented by General Formula (g-1) below is described. The organometallic complex of one embodiment of the present invention which has the structure represented by General Formula (G-1) includes the 1H-naphtho[1,2-d]imidazole derivative represented by General Formula (g-1) as a ligand. Thus, by synthesizing an Ir complex using the 1H-naphtho[1,2-d]imidazole derivative represented by General Formula (g-1), the organometallic complex of one embodiment of the present invention can be synthesized as described later.

[Chemical Formula 46]

(g-1)

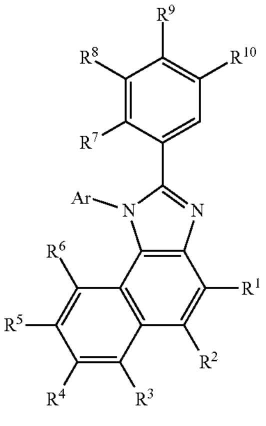

In General Formula (g-1), each of $R^1$ to $R^{10}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group, and Ar represents a substituted or unsubstituted aryl group having 6 to 25 carbon atoms.

As shown in Scheme (S-1) below, an arylaldehyde compound or arylcarboxylic acid chloride (M1) and an o-naphthalenediamine derivative (M2) in which substitution of Ar occurs at the N-position are reacted with each other, whereby the 1H-naphtho[1,2-d]imidazole derivative represented by General Formula (g-1) can be obtained.

[Chemical Formula 47]

(S-1)

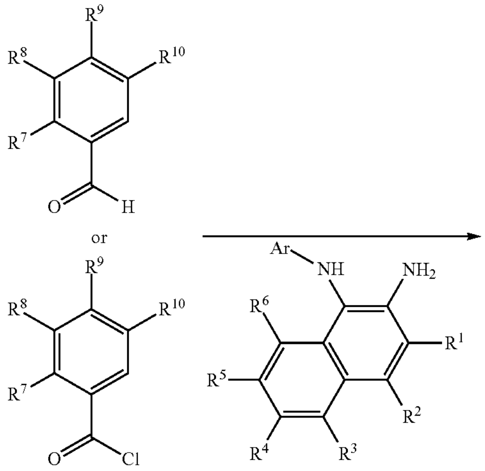

(M1) (M2)

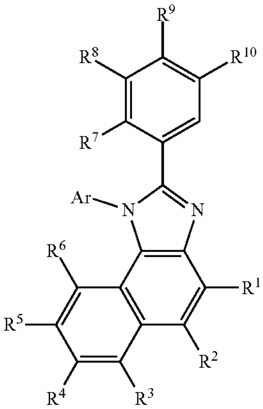

(g-1)

In Scheme (S-1), each of $R^1$ to $R^{10}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group, and Ar represents a substituted or unsubstituted aryl group having 6 to 25 carbon atoms.

<Synthesis Method of Organometallic Complex Represented by General Formula (G-6)>

Next, among synthesis methods of the organometallic complex having the structure represented by General Formula (G-1), an example of a synthesis method of the organometallic complex represented by General Formula (G-6) is described.

As shown in Scheme (S-2) below, the 1H-naphtho[1,2-d]imidazole derivative represented by General Formula (g-1) is mixed with an iridium metal compound containing a halogen (e.g., an iridium chloride hydrate or ammonium hexachloroiridate) or an iridium organometallic complex compound (e.g., an acetylacetonate complex or a diethylsulfide complex) and then the mixture is heated, whereby the organometallic complex having the structure represented by General Formula (G-6) can be obtained. This heating process may be performed after the 1H-naphtho[1,2-d]imidazole derivative represented by General Formula (g-1) and the iridium metal compound containing a halogen or the iridium organometallic complex are dissolved in an alcohol-based solvent (e.g., glycerol, ethylene glycol, 2-methoxyethanol, or 2-ethoxyethanol). In Scheme (S-2), each of $R^1$ to $R^{10}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group, and Ar represents a substituted or unsubstituted aryl group having 6 to 25 carbon atoms.

[Chemical Formula 48]

(S-2)

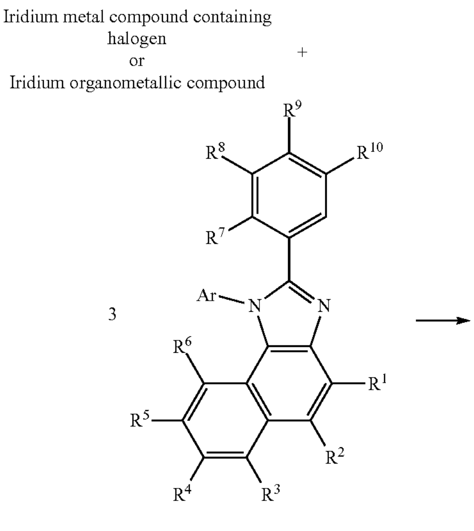

(g-1)

-continued

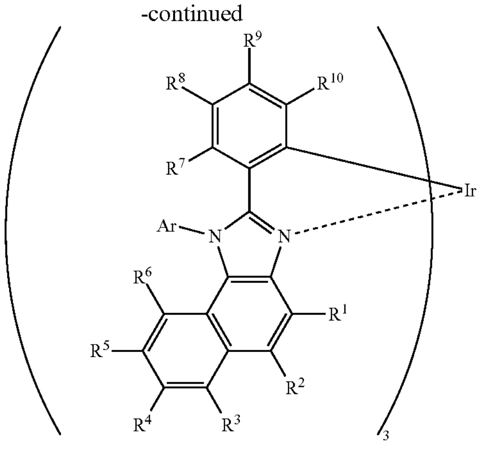

(G-6)

Note that the synthesis method of the organometallic complex of the present invention is not limited to Scheme (S-2).

<Synthesis Method of Organometallic Complex Represented by General Formula (G-11)>

Next, among synthesis methods of the organometallic complex having the structure represented by General Formula (G-1), an example of a synthesis method of the organometallic complex represented by General Formula (G-11) is described.

As shown in Scheme (S-3) below, the 1H-naphtho[1,2-d]imidazole derivative represented by General Formula (g-1) or L and an iridium compound containing a halogen (e.g., iridium chloride, iridium bromide, or iridium iodide) are heated in an inert gas atmosphere using no solvent, an alcohol-based solvent (e.g., glycerol, ethylene glycol, 2-methoxyethanol, or 2-ethoxyethanol) alone, or a mixed solvent of water and one or more of the alcohol-based solvents, so that a dinuclear complex (P1) of the 1H-naphtho[1,2-d]imidazole derivative or a dinuclear complex (P2) including a monoanionic bidentate ligand, which is one type of organometallic complex having a halogen-bridged structure, can be obtained. In Scheme (S-3), X represents a halogen atom, each of $R^1$ to $R^{10}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group, and Ar represents a substituted or unsubstituted aryl group having 6 to 25 carbon atoms.

[Chemical Formula 49]

(S-3)

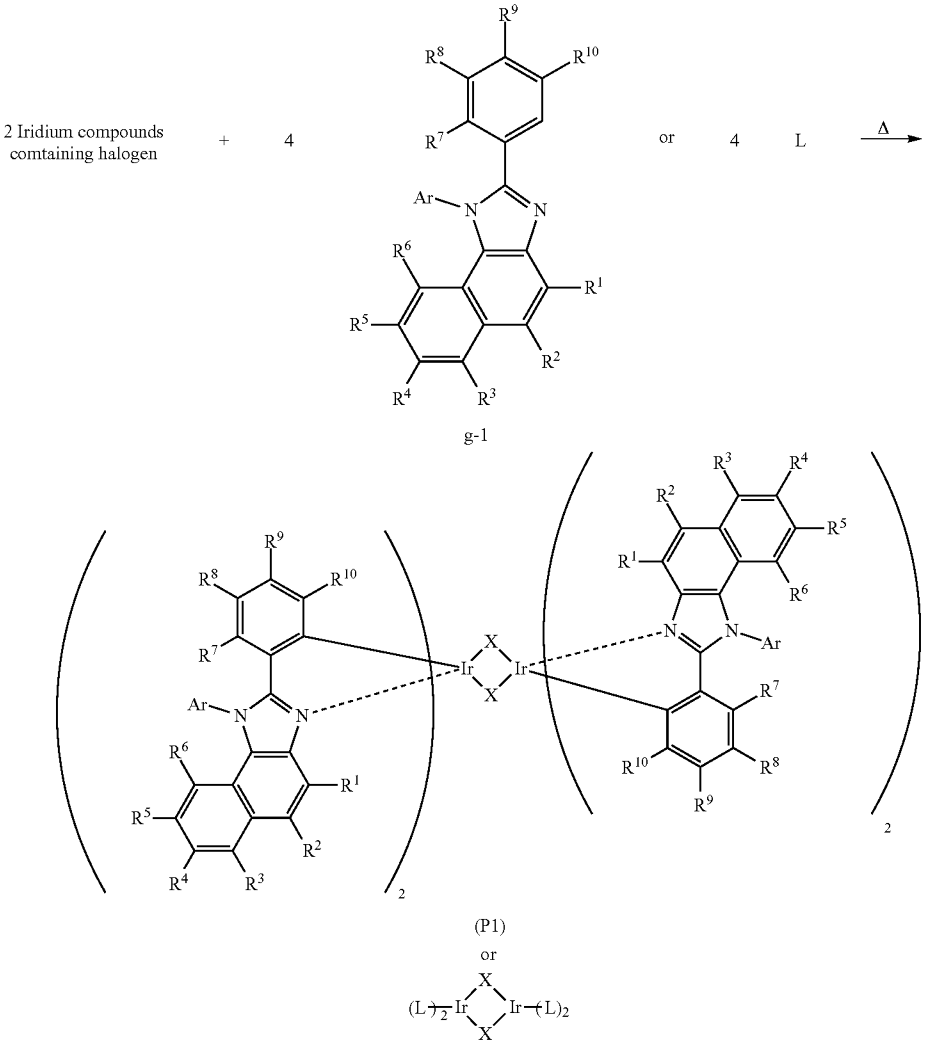

Then, as shown in Scheme (S-4) below, the dinuclear complex (P1) or (P2) obtained in Synthesis Scheme (S-3) described above is reacted with the 1H-naphtho[1,2-d]imidazole derivative represented by General Formula (g-1) or L in an inert gas atmosphere, whereby the organometallic complex which is represented by General Formula (G-11) and is one embodiment of the present invention can be obtained. Here, the obtained organometallic complex may be irradiated with light or heat to be further reacted, in which case an isomer such as a geometrical isomer or an optical isomer can be obtained. This isomer is also the organometallic complex which represented by General Formula (G-11) and is one embodiment of the present invention. In Scheme (S-4), X represents a halogen atom, each of $R^1$ to $R^{10}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, and an electron-withdrawing group, and Ar represents a substituted or unsubstituted aryl group having 6 to 25 carbon atoms.

[Chemical Formula 50]

(S-4)

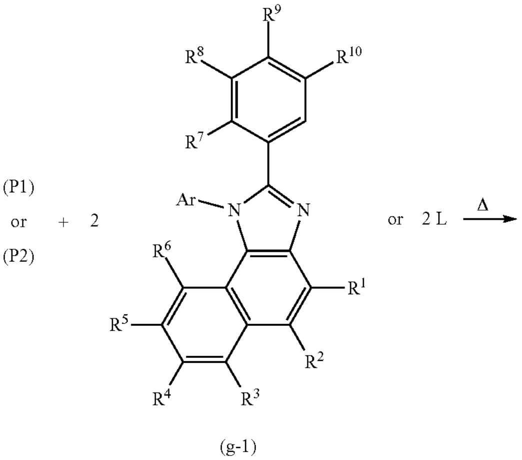

-continued

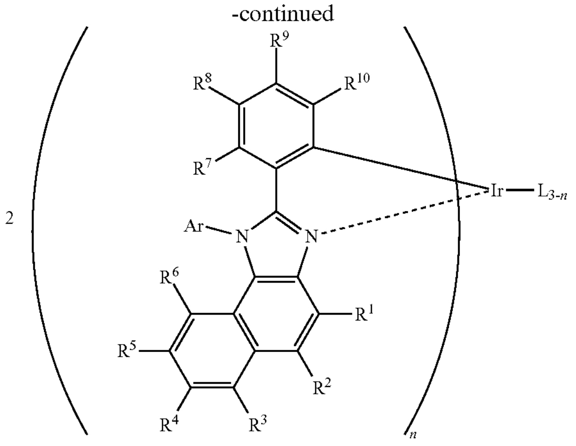

(G-11)

Note that the synthesis method of the organometallic complex of the present invention is not limited to Schemes (S-3) and (S-4).

Embodiment 3

In this embodiment, a light-emitting device including the organometallic complex of one embodiment of the present invention is described below with reference to FIG. 1.

<Structure Example 1 of Light-Emitting Device>

First, a structure of the light-emitting device of one embodiment of the present invention is described with reference to FIGS. 1(A), 1(B), and 1(C).

FIG. 1(A) is a schematic cross-sectional view of a light-emitting device 150 of one embodiment of the present invention.

The light-emitting device 150 includes a pair of electrodes (an electrode 101 and an electrode 102) and an EL layer 100 between the pair of electrodes. The EL layer 100 includes at least a light-emitting layer 140.

The EL layer 100 illustrated in FIG. 1(A) includes functional layers such as a hole-injection layer 111, a hole-transport layer 112, an electron-transport layer 118, and an electron-injection layer 119, in addition to the light-emitting layer 140.

In this embodiment, although description is given assuming that the electrode 101 and the electrode 102 of the pair of electrodes serve as an anode and a cathode, respectively, the structure of the light-emitting device 150 is not limited thereto. That is, the electrode 101 may be a cathode, the electrode 102 may be an anode, and the stacking order of the layers between the electrodes may be reversed. In other words, the hole-injection layer 111, the hole-transport layer 112, the light-emitting layer 140, the electron-transport layer 118, and the electron-injection layer 119 may be stacked in this order from the anode side.

The structure of the EL layer 100 is not limited to the structure illustrated in FIG. 1(A), and a structure including at least one layer selected from the hole-injection layer 111, the hole-transport layer 112, the electron-transport layer 118, and the electron-injection layer 119 may be employed. Alternatively, the EL layer 100 may include a functional layer which is capable of lowering a hole- or electron-injection barrier, improving a hole- or electron-transport property, inhibiting a hole- or electron-transport property, or suppressing a quenching phenomenon by an electrode, for example. Note that the functional layers may each be a single layer or stacked layers.

In the light-emitting device 150, any of the layers in the EL layer 100 contains the organometallic complex of one embodiment of the present invention. Note that the organometallic complex has a favorable quantum yield. Therefore, a light-emitting device with high emission efficiency can be obtained by using the organometallic complex as a guest material of the light-emitting layer 140.

Figure 1B:
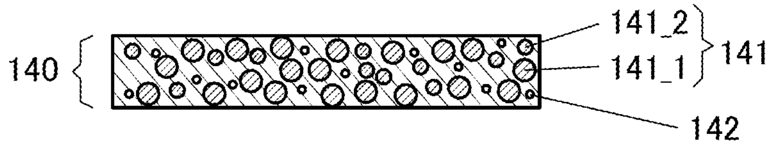

FIG. 1(B) is a schematic cross-sectional view showing an example of the light-emitting layer 140 shown in FIG. 1(A). The light-emitting layer 140 shown in FIG. 1(B) includes a host material 141 and a guest material 142. The host material 141 may be a single organic compound or a co-host system including an organic compound 141_1 and an organic compound 141_2. The organometallic complex of one embodiment of the present invention can be suitably used as the guest material 142.

The guest material 142 is a light-emitting organic material. Examples of the light-emitting organic material include a material capable of emitting fluorescence (hereinafter referred to as a fluorescent material) and a material capable of emitting phosphorescence (hereinafter also referred to as a phosphorescent material), and the phosphorescent material is preferred because it has high emission efficiency. Thus, the organometallic complex of one embodiment of the present invention can be suitably used. A structure in which a phosphorescent material is used as the guest material 142 is described below. The guest material 142 may be rephrased as the phosphorescent material.

In the case where two kinds of host materials such as the organic compound 141_1 and the organic compound 141_2 are used (co-host system) in the light-emitting layer as illustrated in FIG. 1(B), one electron-transport material and one hole-transport material are generally used as the two kinds of host materials. Such a structure is preferable because it lowers a hole-injection barrier between the hole-transport layer 112 and the light-emitting layer 140 and an electron-injection barrier between the electron-transport layer 118 and the light-emitting layer 140 and thus reduces the drive voltage.

<Light Emission Mechanism of Light-Emitting Device>

Next, the light emission mechanism of the light-emitting layer 140 is described below.

The organic compound 141_1 and the organic compound 141_2 included in the host material 141 in the light-emitting layer 140 may form an excited complex (also referred to as exciplex). Described below is the case where the organic compound 141_1 and the organic compound 141_2 form an exciplex.

Figure 1C:
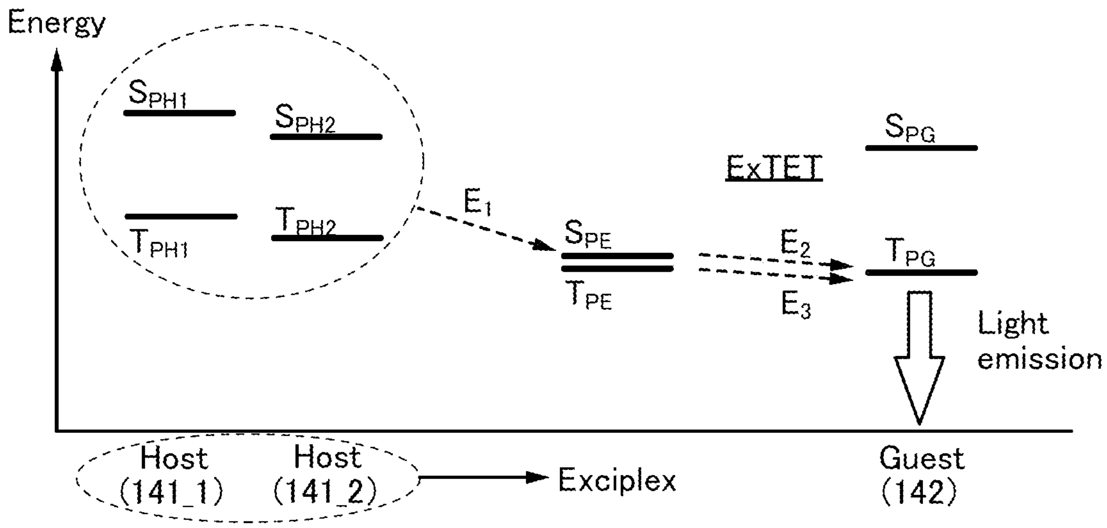
FIG. 1(C) is a diagram illustrating correlation of energy levels of a light-emitting device of one embodiment of the present invention.

FIG. 1(C) shows a correlation between the energy levels of the organic compound 141_1, the organic compound 141_2, and the guest material 142 in the light-emitting layer 140. What terms and numerals in FIG. 1(C) represent are listed below. Note that the organic compound 141_1 is an electron-transport material and the organic compound 141_2 is a hole-transport material in the following description.

Host (141_1): the organic compound 141_1 (host material)

Host (141_2): the organic compound 141_2 (host material)

Guest (142): the guest material 142 (phosphorescent compound)

$S_{PH1}$: the S1 level of the organic compound 141_1 (host material)

$T_{PH1}$: the T1 level of the organic compound 141_1 (host material)

$S_{PH2}$: the S1 level of the organic compound 141_2 (host material)

$T_{PH2}$: the T1 level of the organic compound 141_2 (host material)

$S_{PG}$: the S1 level of the guest material 142 (phosphorescent compound)

$T_{PG}$: the T1 level of the guest material 142 (phosphorescent compound)

$S_{PE}$: the S1 level of the exciplex $T_{PE}$: the T1 level of the exciplex

The organic compound 141_1 and the organic compound 141_2 form an exciplex, and the S1 level ($S_{PE}$) and the T1 level ($T_{PE}$) of the exciplex are energy levels close to each other (see Route $E_1$ in FIG. 1(C)).

The organic compound 141_1 and the organic compound 141_2 receive an electron and a hole, respectively, to readily form an exciplex. Alternatively, one of the organic compounds brought into an excited state immediately interacts with the other organic compound to form an exciplex. Consequently, most excitons in the light-emitting layer 140 exist as exciplexes. Because the excitation energy levels ($S_{PE}$ and $T_{PE}$) of the exciplex are lower than the S1 levels ($S_{PH1}$ and $S_{PH2}$) of the host materials (the organic compound 141_1 and the organic compound 141_2) that form the exciplex, the excited state of the host material 141 can be formed with lower excitation energy. This can reduce the drive voltage of the light-emitting device. The organic compound 141_1 and the organic compound 141_2 may receive a hole and an electron, respectively, to form an exciplex.

Both energies of ($S_{PE}$) and ($T_{PE}$) of the exciplex are then transferred to the T1 level of the guest material 142 (the phosphorescent compound); thus, light emission is obtained (see Routes $E_2$ and $E_3$ in FIG. 1(C)).

Note that the T1 level ($T_{PE}$) of the exciplex is preferably higher than the T1 level ($T_{PG}$) of the guest material 142. In this way, the singlet excitation energy and the triplet excitation energy of the formed exciplex can be transferred from the S1 level ($S_{PE}$) and the T1 level ($T_{PE}$) of the exciplex to the T1 level ($T_{PG}$) of the guest material 142.

In order to efficiently transfer excitation energy from the exciplex to the guest material 142, the T1 level ($T_{PE}$) of the exciplex is preferably lower than or equal to the T1 levels ($T_{PH1}$ and $T_{PH2}$) of the organic compounds (the organic compound 141_1 and the organic compound 141_2) which form the exciplex. Thus, quenching of the triplet excitation energy of the exciplex due to the organic compounds (the organic compound 141_1 and the organic compound 141_2) is less likely to occur, resulting in efficient energy transfer from the exciplex to the guest material 142.

In the case where the combination of the organic compound 141_1 and the organic compound 141_2 is a combination of a compound having a hole-transport property and a compound having an electron-transport property, the carrier balance can be easily controlled depending on the mixture ratio. Specifically, the ratio of the compound having a hole-transport property to the compound having an electron-transport property is preferably within a range of 1:9 to 9:1 (weight ratio). Since the carrier balance can be easily controlled with the structure, a carrier recombination region can also be controlled easily.

The above-described processes through Routes $E_2$ and $E_3$ may be referred to as ExTET (Exciplex-Triplet Energy Transfer) in this specification and the like. In other words, in the light-emitting layer 140, excitation energy is given from the exciplex to the guest material 142. In this case, the efficiency of reverse intersystem crossing from $T_{PE}$ to $S_{PE}$ need not necessarily be high and the emission quantum yield from $S_{PE}$ need not necessarily be high; thus, materials can be selected from a wide range of options. Furthermore, ExTET allows the light-emitting device to have high emission efficiency, a reduced drive voltage, and high reliability.

Although it is acceptable as long as the combination of the organic compound 141_1 and the organic compound 141_2 can form an exciplex, it is preferable that one have a lower HOMO level and a lower LUMO level than the other.

<Materials>

Next, components of a light-emitting device of one embodiment of the present invention are described in detail below.

<<Light-Emitting Layer>>

In the light-emitting layer 140, the host material 141 is present in the highest proportion by weight, and the guest material 142 is dispersed in the host material 141. When the guest material 142 is a phosphorescent compound, the T1 level of the host material 141 (the organic compound 141_1 and the organic compound 141_2) in the light-emitting layer 140 is preferably higher than the T1 level of the guest material (the guest material 142) in the light-emitting layer 140.

The organic compound 141_1 is preferably a compound having a nitrogen-containing six-membered heteroaromatic ring skeleton. Specific examples thereof include compounds having any of a pyridine skeleton, a diazine skeleton (a pyrazine skeleton, a pyrimidine skeleton, and a pyridazine skeleton), and a triazine skeleton. Examples of these basic compounds having a nitrogen-containing heteroaromatic ring skeleton include compounds such as a pyridine derivative, a bipyridine derivative, a pyrimidine derivative, a triazine derivative, a quinoxaline derivative, a dibenzoquinoxaline derivative, a phenanthroline derivative, and a purine derivative. As the organic compound 141_1, a material having a property of transporting more electrons than holes (an electron-transport material) can be used, and a material having an electron mobility of $1\times10^{-6}$ $cm^2/Vs$ or higher is preferable.

Specific examples include heteroaromatic ring compounds having a pyridine skeleton such as bathophenanthroline (abbreviation: Bphen) and bathocuproine (abbreviation: BCP); heteroaromatic ring compounds having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), (2-[3-(3,9'-bi-9H-carbazol-9-yl)phenyl]dibenzo[f,h]quinoxaline) (abbreviation: 2mCzCzPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heteroaromatic ring compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn) and 9-[3-(4,6-diphenyl-1,3,5-triazin-2-yl)phenyl]-9'-phenyl-2,3'-bi-9H-carbazole (abbreviation: mPCCzPTzn-02); and heteroaromatic ring compounds having a pyridine skeleton such as 3,5-bis[3-(9H-carbazol-9-yl)

phenyl]pyridine (abbreviation: 35DCzPPy) and 1,3,5-tri[3-(3-pyridyl)phenyl]benzene (abbreviation: TmPyPB). Among the heteroaromatic ring compounds, the heteroaromatic ring compounds having a triazine skeleton, a diazine (pyrimidine, pyrazine, or pyridazine) skeleton, or a pyridine skeleton are highly reliable and stable and are thus preferably used. In addition, the heteroaromatic ring compounds having the skeletons have a high electron-transport property to contribute to a reduction in drive voltage. Furthermore, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1\times10^{-6}$ $cm^2/Vs$ or higher. Note that other substances may also be used as long as their electron-transport properties are higher than their hole-transport properties.

The organic compound 141_2 is preferably a compound having a nitrogen-containing five-membered heteroaromatic ring skeleton or a tertiary amine skeleton. Specific examples thereof include compounds having any of a pyrrole skeleton and an aromatic amine skeleton. As examples, an indole derivative, a carbazole derivative, a triarylamine derivative, and the like can be given. Examples of a nitrogen-containing five-membered heteroaromatic ring skeleton include an imidazole skeleton, a triazole skeleton, and a tetrazole skeleton. As the organic compound 141_2, a material having a property of transporting more holes than electrons (a hole-transport material) can be used, and a material having a hole mobility of $1\times10^{-6}$ $cm^2/Vs$ or higher is preferable. Furthermore, the hole-transport material may be a high molecular compound.

Examples of the aromatic amine compounds that can be used as the material having a high hole-transport property are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Furthermore, it is possible to use N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), N,N,N',N',N'',N'',N''',N'''-octaphenyldibenzo[g,p]chrysene-2,7,10,15-tetraamine (abbreviation: DBC1), or the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide] (abbreviation: PTPDMA), and poly[N,N'-bis(4-butylphenyl)-N,N'-bis(phenyl)benzidine] (abbreviation: Poly-TPD).

Examples of the material having a high hole-transport property include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N[1]-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). Other examples are amine compounds, carbazole compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), and 2,8-di(9H-carbazol-9-yl)-dibenzothiophene (abbreviation: Cz2DBT). Among the above compounds, compounds having a pyrrole skeleton or an aromatic amine skeleton are preferred because of their high stability and reliability. In addition, the compounds having such skeletons have a high hole-transport property to contribute to a reduction in drive voltage.

As the organic compound 141_2, a compound having a nitrogen-containing five-membered heteroaromatic ring skeleton such as an imidazole skeleton, a triazole skeleton, or a tetrazole skeleton can be used. Specifically, 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and the like can be used, for example.

In addition, the organometallic complex of one embodiment of the present invention can be suitably used as the guest material 142 in the light-emitting layer 140. Since the organometallic complex of one embodiment of the present invention has a high quantum yield, a light-emitting device having high emission efficiency can be obtained. Moreover, in the case of a light-emitting device including a plurality of light-emitting units, such as a light-emitting device 250 to be described later, it is preferable that the organic compound of one embodiment of the present invention be used for a light-emitting layer of one of the light-emitting units. Although a guest material used for the other light-emitting unit(s) is not particularly limited, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like is preferred as a fluorescent compound, and for example, the following substances can be used.

Specifically, the following examples can be given: 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)pyrene-1,6-diamine (abbreviation: 1,6tBu-FLPAPrn), N,N'-diphenyl-N,N'-bis[4-(9-phenyl-9H-fluoren-9-yl)phenyl]-3,8-dicyclohexylpyrene-1, 6-diamine (abbreviation: ch-1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N','N-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

As a phosphorescent compound that can be used as the guest material, an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand and the like can be given.

Examples of the substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: $[Ir(mpptz-dmp)_3]$), tris(5-methyl-3,4-diphenyl-4H-1,2,4-triazolato)iridium(III) (abbreviation: $[Ir(Mptz)_3]$), tris[4-(3-biphenyl)-5-isopropyl-3-phenyl-4H-1,2,4-triazolato]iridium(III) (abbreviation: $[Ir(iPrptz-3b)_3]$), and tris[3-(5-biphenyl)-5-isopropyl-4-phenyl-4H-1,2,4-triazolato]iridium(III) (abbreviation: $[Ir(iPr5btz)_3]$); organometallic iridium complexes having a 1H-triazole skeleton, such as tris[3-methyl-1-(2-methylphenyl)-5-phenyl-1H-1,2,4-triazolato]iridium(III) (abbreviation: $[Ir(Mptz1-mp)_3]$) and tris(1-methyl-5-phenyl-3-propyl-1H-1,2,4-triazolato)iridium(III) (abbreviation: $[Ir(Prptzl-Me)_3]$); organometallic iridium complexes having an imidazole skeleton, such as fac-tris[1-(2,6-diisopropylphenyl)-2-phenyl-1H-imidazole]iridium (III) (abbreviation: $[Ir(iPrpmi)_3]$) and tris[3-(2,6-dimethylphenyl)-7-methylimidazo[1,2-f]phenanthridinato]iridium (III) (abbreviation: $[Ir(dmpimpt\text{-}Me)_3]$); and organometallic iridium complexes in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl] pyridinato-N,$C^{2'}$}iridium(III) picolinate (abbreviation: $[Ir(CF_3ppy)_2(pic)]$), and bis[2-(4',6'-difluorophenyl) pyridinato-N,$C^{2'}$]iridium(III) acetylacetonate (abbreviation: [FIr(acac)]). Among the substances given above, the organometallic iridium complexes having a nitrogen-containing five-membered heteroaromatic ring skeleton, such as a 4H-triazole skeleton, a 1H-triazole skeleton, or an imidazole skeleton have high triplet excitation energy, reliability, and emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: $[Ir(mppm)_3]$), tris(4-t-butyl-6-phenylpyrimidinato) iridium(III) (abbreviation: $[Ir(tBuppm)_3]$), (acetylacetonato) bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[4-(2-norbornyl)-6-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), (acetylacetonato) bis{4,6-dimethyl-2-[6-(2,6-dimethylphenyl)-4-pyrimidinyl-κ$N_3$]phenyl-κC}iridium(III) (abbreviation: $[Ir(dmppm\text{-}dmp)_2(acac)]$), and (acetylacetonato)bis(4,6-diphenylpyrimidinato)iridium(III) (abbreviation: $[Ir(dppm)_2(acac)]$); organometallic iridium complexes having a pyrazine skeleton, such as (acetylacetonato)bis(3,5-dimethyl-2-phenylpyrazinato)iridium(III) (abbreviation: $[Ir(mppr\text{-}Me)_2(acac)]$) and (acetylacetonato)bis(5-isopropyl-3-methyl-2-phenylpyrazinato)iridium(III) (abbreviation: $[Ir(mppr\text{-}iPr)_2(acac)]$); organometallic iridium complexes having a pyridine skeleton, such as tris(2-phenylpyridinato-N,$C^{2'}$)iridium(III) (abbreviation: $[Ir(ppy)_3]$), bis(2-phenylpyridinato-N,$C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo [h]quinolinato)iridium(III) (abbreviation: $[Ir(bzq)_3]$), tris(2-phenylquinolinato-N,$C^{2'}$)iridium(III) (abbreviation: $[Ir(pq)_3]$), and bis(2-phenylquinolinato-N,$C^{2'}$)iridium(III) acetylacetonate (abbreviation: $[Ir(pq)_2(acac)]$); organometallic iridium complexes such as bis(2,4-diphenyl-1,3-oxazolato-N,$C^{2'}$)iridium(III) acetylacetonate (abbreviation: $[Ir(dpo)_2(acac)]$), bis{2-[4'-(perfluorophenyl)phenyl] pyridinato-N,$C^{2'}$}iridium(III) acetylacetonate (abbreviation: $[Ir(p\text{-}PF\text{-}ph)_2(acac)]$), and bis(2-phenylbenzothiazolato-N,$C^{2'}$)iridium(III) acetylacetonate (abbreviation: $[Ir(bt)_2(acac)]$); and a rare earth metal complex such as tris(acetylacetonato)(monophenanthroline)terbium(III) (abbreviation: $[Tb(acac)_3(Phen)]$). Among the substances given above, the organometallic iridium complexes having a pyrimidine skeleton have distinctively high reliability and light emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: $[Ir(5mdppm)_2(dibm)]$), bis[4,6-bis(3-methylphenyl)pyrimidinato](dipivaloylmethanato)iridium(III) (abbreviation: $[Ir(5mdppm)_2(dpm)]$), and bis[4,6-di(naphthalen-1-yl)pyrimidinato](dipivaloylmethanato)iridium(III) (abbreviation: $[Ir(d1npm)_2(dpm)]$); organometallic iridium complexes having a pyrazine skeleton, such as (acetylacetonato)bis(2,3,5-triphenylpyrazinato) iridium(III) (abbreviation: $[Ir(tppr)_2(acac)]$), bis(2,3,5-triphenylpyrazinato)(dipivaloylmethanato)iridium(III) (abbreviation: $[Ir(tppr)_2(dpm)]$), and (acetylacetonato)bis[2,3-bis (4-fluorophenyl)quinoxalinato]iridium(III) (abbreviation: $[Ir(Fdpq)_2(acac)]$); organometallic iridium complexes having a pyridine skeleton, such as tris(1-phenylisoquinolinato-N,$C^{2'}$)iridium(III) (abbreviation: $[Ir(piq)_3]$) and bis(1-phenylisoquinolinato-N,$C^{2'}$)iridium(III) acetylacetonate (abbreviation: $[Ir(piq)_2(acac)]$); a platinum complex such as 2,3,7,8,12,13,17,18-octaethyl-21H,23H-porphyrin platinum (II) (abbreviation: [PtOEP]); and rare earth metal complexes such as tris(1,3-diphenyl-1,3-propanedionato)(monophenanthroline)europium(III) (abbreviation: $[Eu(DBM)_3(Phen)]$) and tris[1-(2-thenoyl)-3,3,3-trifluoroacetonato] (monophenanthroline)europium(III) (abbreviation: $[Eu(TTA)_3(Phen)]$). Among the substances given above, the organometallic iridium complexes having a pyrimidine skeleton have distinctively high reliability and light emission efficiency and are thus particularly preferable. Furthermore, the organometallic iridium complexes having a pyrazine skeleton can provide red light emission with favorable chromaticity.

An organic compound including a benzofuropyridine skeleton or a benzothienopyridine skeleton has a high T1 level, and thus can be suitably used as a host material in a light-emitting layer containing a substance capable of converting triplet excitation energy into light emission as a light-emitting material. Accordingly, the light-emitting material included in the light-emitting layer 140 is preferably a material that can convert the triplet excitation energy into light emission. As an example of the material that can convert the triplet excitation energy into light emission, a thermally activated delayed fluorescence (TADF) material can be given in addition to the above-described phosphorescent compound. Therefore, it is acceptable that the "phosphorescent compound" in the description is replaced with the "thermally activated delayed fluorescence material". Note that the thermally activated delayed fluorescence material is a material having a small difference between the triplet excitation energy level and the singlet excitation energy level and a function of converting triplet excitation energy into singlet excitation energy by reverse intersystem crossing. Thus, the TADF material can up-convert a triplet excited state into a singlet excited state (i.e., reverse intersystem crossing is possible) using a little thermal energy and efficiently exhibit light emission (fluorescence) from the singlet excited state. The TADF is efficiently obtained under the condition where the difference in energy between the triplet excitation energy level and the singlet excitation energy level is preferably larger than 0 eV and smaller than or equal to 0.2 eV, further preferably larger than 0 eV and smaller than or equal to 0.1 eV.

In the case where the thermally activated delayed fluorescence material is composed of one kind of material, any of the following materials can be used, for example.

First, a fullerene, a derivative thereof, an acridine derivative such as proflavine, eosin, and the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$).

As the thermally activated delayed fluorescence material composed of one kind of material, a heteroaromatic ring compound including a π-electron rich heteroaromatic ring and a π-electron deficient heteroaromatic ring can also be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), or the like can be used. The heteroaromatic ring compound is preferable because of having the π-electron rich heteroaromatic ring and the π-electron deficient heteroaromatic ring, for which the electron-transport property and the hole-transport property are high. Among skeletons having the π-electron deficient heteroaromatic ring, a diazine skeleton (a pyrimidine skeleton, a pyrazine skeleton, or a pyridazine skeleton) and a triazine skeleton have high stability and reliability and are particularly preferable. Among skeletons having the π-electron rich heteroaromatic ring, an acridine skeleton, a phenoxazine skeleton, a thiophene skeleton, a furan skeleton, and a pyrrole skeleton have high stability and reliability; therefore, one or more of these skeletons are preferably included. As the pyrrole skeleton, an indole skeleton, a carbazole skeleton, or a 3-(9-phenyl-9H-carbazol-3-yl)-9H-carbazole skeleton is particularly preferred. Note that a substance in which the π-electron rich heteroaromatic ring is directly bonded to the π-electron deficient heteroaromatic ring is particularly preferable because the donor property of the π-electron rich heteroaromatic ring and the acceptor property of the π-electron deficient heteroaromatic ring are both high and the difference between the energy level in the singlet excited state and the energy level in the triplet excited state becomes small.

The light-emitting layer 140 may include a material other than the host material 141 and the guest material 142.

Examples of the material that can be used for the light-emitting layer 140 are, but not limited to, fused polycyclic aromatic compounds such as anthracene derivatives, phenanthrene derivatives, pyrene derivatives, chrysene derivatives, and dibenzo[g,p]chrysene derivatives. Specific example of the fused polycyclic aromatic compounds include 9,10-diphenylanthracene (abbreviation: DPAnth), 6,12-dimethoxy-5,11-diphenylchrysene, 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl) diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more substances having a singlet excitation energy level or a triplet excitation energy level higher than the excitation energy level of the guest material 142 are selected from these substances and known substances.

For example, a compound having a heteroaromatic ring skeleton, such as an oxadiazole derivative, can be used for the light-emitting layer 140. As specific examples thereof, heteroaromatic ring compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), and 4,4'-bis(5-methylbenzoxazol-2-yl)stilbene (abbreviation: BzOs) can be given.

In addition, a metal complex (e.g., a zinc- or aluminum-based metal complex) with a heteroaromatic ring, for example, can be used for the light-emitting layer 140. As examples, metal complexes having a quinoline ligand, a benzoquinoline ligand, an oxazole ligand, and a thiazole ligand can be given. Specific examples thereof include metal complexes having a quinoline or benzoquinoline skeleton, such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ), can be used.

The light-emitting layer 140 can have a structure in which two or more layers are stacked. For example, in the case where the light-emitting layer 140 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material. A light-emitting material included in the first light-emitting layer may be the same as or different from a light-emitting material included in the second light-emitting layer. In addition, the materials may have functions of emitting light of the same color or light of different colors. Light-emitting materials having functions of emitting light of different colors are used for the two light-emitting layers, so that light of a plurality of emission colors can be obtained at the same time. It is particularly preferable to select light-emitting materials of the light-emitting layers so that white light can be obtained by combining light emission from the two light-emitting layers.

Note that the light-emitting layer 140 can be formed by an evaporation method (including a vacuum evaporation method), an inkjet method, a coating method, gravure printing, or the like. Besides the above-mentioned materials, an inorganic compound such as a quantum dot or a high molecular compound (e.g., an oligomer, a dendrimer, and a polymer) may be used.

<<Hole-Injection Layer>>

The hole-injection layer 111 has a function of lowering a barrier for hole injection from one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, and the like can be given. As the phthalocyanine derivative, phthalocyanine, metal phthalocyanine, and the like can be given. As the aromatic amine, a benzidine derivative, a phenylenediamine derivative, and the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron-accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ $cm^2/Vs$ or higher is preferable. Specifically, any of the aromatic amine, carbazole derivative, aromatic hydrocarbon, stilbene derivative, and the like described as examples of the hole-transport material that can be used in the light-emitting layer 140 can be used. Furthermore, the hole-transport material may be a high molecular compound.

As other examples of the hole-transport material, aromatic hydrocarbons such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene can be given. Other examples are pentacene, coronene, and the like. The aromatic hydrocarbon having a hole mobility of $1\times10^{-6}$ $cm^2/Vs$ or higher and having 14 to 42 carbon atoms is particularly preferable.

The aromatic hydrocarbon may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are thiophene compounds, furan compounds, fluorene compounds, triphenylene compounds, phenanthrene compounds, and the like such as 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), 1,3,5-tri(dibenzothiophen-4-yl)benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). Among the above compounds, compounds including a pyrrole skeleton, a furan skeleton, a thiophene skeleton, or an aromatic amine skeleton are preferred because of their high stability and reliability. In addition, the compounds having such skeletons have a high hole-transport property to contribute to a reduction in drive voltage.

<<Hole-Transport Layer>>

The hole-transport layer 112 is a layer containing a hole-transport material and can be formed using any of the hole-transport materials given as examples of the material of the hole-injection layer 111. In order that the hole-transport layer 112 can have a function of transporting holes injected into the hole-injection layer 111 to the light-emitting layer 140, the HOMO level of the hole-transport layer 112 is preferably equal or close to the HOMO level of the hole-injection layer 111.

A substance having a hole mobility of $1\times10^{-6}$ $cm^2/Vs$ or higher is preferred. Note that other substances may also be used as long as they have a property of transporting more holes than electrons. The layer containing a substance having a high hole-transport property is not limited to a single layer, and two or more layers containing the aforementioned substances may be stacked.

<<Electron-Transport Layer>>

The electron-transport layer 118 has a function of transporting, to the light-emitting layer 140, electrons injected from the other of the pair of electrodes (the electrode 101 or the electrode 102) through the electron-injection layer 119. A material having a property of transporting more electrons than holes can be used as the electron-transport material, and a material having an electron mobility of $1\times10^{-6}$ $cm^2/Vs$ or higher is preferable. As a compound that easily accepts electrons (a material having an electron-transport property), a π-electron deficient heteroaromatic ring compound such as a nitrogen-containing heteroaromatic ring compound or a metal complex can be used. Other specific examples include a pyridine derivative, a bipyridine derivative, a pyrimidine derivative, a triazine derivative, a quinoxaline derivative, a dibenzoquinoxaline derivative, a phenanthroline derivative, a triazole derivative, a benzimidazole derivative, and an oxadiazole derivative, which are described above as the electron-transport material that can be used for the light-emitting layer 140. A substance having an electron mobility of $1\times10^{-6}$ $cm^2/Vs$ or higher is preferable. Note that other than these substances, any substance that has a property of transporting more electrons than holes may be used for the electron-transport layer. The electron-transport layer 118 is not limited to a single layer, and two or more layers containing the aforementioned substances may be stacked.

In addition, metal complexes with a heteroaromatic ring, such as metal complexes having a quinoline ligand, a benzoquinoline ligand, an oxazole ligand, and a thiazole ligand, can be given. Specific examples thereof include metal complexes having a quinoline skeleton or a benzoquinoline skeleton, such as tris(8-quinolinolato)aluminum (III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ), can be used.

Between the electron-transport layer 118 and the light-emitting layer 140, a layer that controls transfer of electron carriers may be provided. This is a layer formed by addition of a small amount of a substance having a high electron-trapping property to a material having a high electron-transport property as described above, and the layer is capable of adjusting carrier balance by suppressing transfer of electron carriers. Such a structure is very effective in suppressing a problem (e.g., a decrease in element lifetime) which occurs in the case where the electron-transport property of the electron-transport material is significantly higher than the hole-transport property of the hole-transport material.

<<Electron-Injection Layer>>

The electron-injection layer 119 has a function of lowering a barrier for electron injection at an interface between the electron-injection layer 119 and the electrode 102 to promote electron injection and can be formed using a Group 1 metal or a Group 2 metal, or an oxide, a halide, or a carbonate of any of the metals, for example. Alternatively, a composite material containing the electron-transport material described above and a material having a property of donating electrons to the electron-transport material can also be used. As the material having an electron-donating property, a Group 1 metal, a Group 2 metal, an oxide of any of the metals, and the like can be given. Specifically, an alkali metal, an alkaline earth metal, or a compound thereof, such as lithium fluoride (LiF), sodium fluoride (NaF), cesium fluoride (CsF), calcium fluoride ($CaF_2$), or lithium oxide ($LiO_x$), can be used. Alternatively, a rare earth metal compound like erbium fluoride ($ErF_3$) can be used. Electride may also be used for the electron-injection layer 119. Examples of the electride include a substance in which electrons are added at high concentration to a mixed oxide of calcium and aluminum. The electron-injection layer 119 can be formed using the substance that can be used for the electron-transport layer 118.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer 118 (e.g., the metal complexes and heteroaromatic ring compounds) can be used, for example. As the electron donor, a substance showing an electron-donating property with respect to the organic compound may be used. Specifically, an alkali metal, an alkaline earth metal, and a rare earth metal are preferable, and lithium, sodium, cesium, magnesium, calcium, erbium, ytterbium, and the like are given. In addition, an alkali metal oxide or an alkaline earth metal oxide is preferable, and lithium oxide, calcium oxide, barium oxide, and the like are given. A Lewis base such as magnesium oxide can also be used. An organic compound such as tetrathiafulvalene (abbreviation: TTF) can also be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, gravure printing, or the like. Besides the above-mentioned materials, an inorganic compound such as a quantum dot or a high molecular compound (e.g., an oligomer, a dendrimer, and a polymer) may be used for the light-emitting layer, the hole-injection layer, the hole-transport layer, the electron-transport layer, and the electron-injection layer.

<<Quantum Dot>>

A quantum dot is a semiconductor nanocrystal with a size of several nanometers to several tens of nanometers and contains approximately $1\times10^3$ to $1\times10^6$ atoms. Since energy shift of quantum dots depend on their size, quantum dots made of the same substance emit light with different wavelengths depending on their size; thus, emission wavelengths can be easily adjusted by changing the size of quantum dots.

Since a quantum dot has an emission spectrum with a narrow peak width, light emission with high color purity can be obtained. In addition, a quantum dot is said to have a theoretical internal quantum efficiency of approximately 100%, which far exceeds that of a fluorescent organic compound, i.e., 25%, and is comparable to that of a phosphorescent organic compound. Therefore, the use of a quantum dot as a light-emitting material enables a light-emitting device having high emission efficiency to be obtained. Furthermore, since a quantum dot which is an inorganic material has high inherent stability, a light-emitting device which is favorable also in terms of lifetime can be obtained.

Examples of a material of a quantum dot include a Group 14 element, a Group 15 element, a Group 16 element, a compound of a plurality of Group 14 elements, a compound of an element belonging to any of Group 4 to Group 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used. For example, an alloyed quantum dot of cadmium, selenium, and sulfur is a means effective in obtaining blue light emission because the emission wavelength can be changed by changing the content ratio of the elements.

As the structure of the quantum dot, any of a core type, a core-shell type, a core-multishell type, and the like may be used. When a core is covered with a shell formed of another inorganic material having a wider band gap, the influence of defects and dangling bonds existing at the surface of a nanocrystal can be reduced. Since this can significantly improve the quantum efficiency of light emission, it is preferable to use a core-shell or core-multishell quantum dot. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over a wavelength range of a spectrum of an ultraviolet region, a visible light region, and an infrared region by changing the size of quantum dots. The range of size (diameter) of quantum dots which is usually used is 0.5 nm to 20 nm, preferably 1 nm to 10 nm. The emission spectra are narrowed as the size distribution of the quantum dots gets smaller, and thus light can be obtained with high color purity. The shape of the quantum dots is not particularly limited and may be a spherical shape, a rod shape, a circular shape, or the like. Quantum rods which are rod-like shape quantum dots have a function of emitting directional light; thus, quantum rods can be used as a light-emitting material to obtain a light-emitting device with higher external quantum efficiency.

In most organic EL elements, to improve emission efficiency, concentration quenching of the light-emitting materials is suppressed by dispersing light-emitting materials in host materials. The host materials need to be materials having singlet excitation energy levels or triplet excitation energy levels higher than or equal to those of the light-emitting materials. In the case of using blue phosphorescent materials as light-emitting materials, it is particularly difficult to develop host materials which have triplet excitation energy levels higher than or equal to those of the blue phosphorescent materials and which are excellent in terms of a lifetime. Even when a light-emitting layer is composed of quantum dots and made without a host material, the quantum dots enable emission efficiency to be ensured; thus, a light-emitting device which is favorable in terms of a lifetime can be obtained. In the case where the light-emitting layer is composed of quantum dots, the quantum dots preferably have core-shell structures (including core-multishell structures).

In the case of using quantum dots as the light-emitting material in the light-emitting layer, the thickness of the light-emitting layer is set to 3 nm to 100 nm, preferably 10 nm to 100 nm, and the quantum dot content of the light-emitting layer is 1 to 100 volume %. Note that it is preferable that the light-emitting layer be composed of the quantum dots. To form a light-emitting layer in which the quantum dots are dispersed as light-emitting materials in host materials, the quantum dots may be dispersed in the host materials, or the host materials and the quantum dots may be dissolved or dispersed in an appropriate liquid medium, and then a wet process (e.g., a spin coating method, a casting method, a die coating method, a blade coating method, a roll coating method, an ink-jet method, a printing method, a spray coating method, a curtain coating method, or a Langmuir-Blodgett method) may be employed. For a light-emitting layer containing a phosphorescent material, a vacuum evaporation method, as well as the wet process, can be suitably employed.

An example of the liquid medium used for the wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

<<Pair of Electrodes>>

The electrode 101 and the electrode 102 function as an anode and a cathode of the light-emitting device. The electrode 101 and the electrode 102 can be formed using a metal, an alloy, or a conductive compound, a mixture or a stack thereof, or the like.

One of the electrode 101 and the electrode 102 is preferably formed using a conductive material having a function of reflecting light. Examples of the conductive material include aluminum (Al), an alloy containing Al, and the like. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, it is possible to reduce costs for manufacturing a light-emitting device with aluminum. Alternatively, silver (Ag), an alloy of Ag and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), or gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, an alloy containing silver and ytterbium, and the like. Besides, a transition metal such as tungsten, chromium (Cr), molybdenum (Mo), copper, or titanium can be used.

Light emitted from the light-emitting layer is extracted through one or both of the electrode 101 and the electrode 102. Thus, at least one of the electrode 101 and the electrode 102 is preferably formed using a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1\times10^{-2}$ Ω·cm can be used.

The electrode 101 and the electrode 102 may each be formed using a conductive material having a function of transmitting light and a function of reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm can be used. For example, one or more kinds of conductive metals and alloys, conductive compounds, and the like can be used. Specifically, a metal oxide such as indium tin oxide (hereinafter, referred to as ITO), indium tin oxide containing silicon or silicon oxide (abbreviation: ITSO), indium oxide-zinc oxide (Indium Zinc Oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

In this specification and the like, as the material having a function of transmitting light, a material that has a function of transmitting visible light and has conductivity is used, and examples of the material include, in addition to the above-described oxide conductor typified by ITO, an oxide semiconductor and an organic conductor containing an organic substance. Examples of the organic conductor containing an organic substance include a composite material in which an organic compound and an electron donor (donor) are mixed and a composite material in which an organic compound and an electron acceptor (acceptor) are mixed. Alternatively, an inorganic carbon-based material such as graphene may be used. The resistivity of the material is preferably lower than or equal to $1\times10^{5}$ Ω·cm, further preferably lower than or equal to $1\times10^{4}$ Ω·cm.

Alternatively, one or both of the electrode 101 and the electrode 102 may be formed by stacking two or more of these materials.

In order to improve the light extraction efficiency, a material whose refractive index is higher than that of an electrode having a function of transmitting light may be formed in contact with the electrode. The material may be conductive or non-conductive as long as it has a function of transmitting visible light. In addition to the oxide conductors described above, an oxide semiconductor and an organic substance are given as the examples. Examples of the organic substance include the materials for the light-emitting layer, the hole-injection layer, the hole-transport layer, the electron-transport layer, and the electron-injection layer. Alternatively, an inorganic carbon-based material or a metal film thin enough to transmit light can be used, and stacked layers with a thickness of several nanometers to several tens of nanometers may be used.

In the case where the electrode 101 or the electrode 102 functions as the cathode, the electrode preferably contains a material having a low work function (3.8 eV or lower). For example, it is possible to use an element belonging to Group 1 or Group 2 of the periodic table (e.g., an alkali metal such as lithium, sodium, or cesium, an alkaline earth metal such as calcium or strontium, or magnesium), an alloy containing any of these elements (e.g., Ag—Mg or Al—Li), a rare earth metal such as europium (Eu) or Yb, an alloy containing any of these rare earth metals, an alloy containing aluminum or silver, or the like.

When the electrode 101 or the electrode 102 is used as the anode, a material with a high work function (4.0 eV or higher) is preferably used.

The electrode 101 and the electrode 102 may be a stacked layer of a conductive material having a function of reflecting light and a conductive material having a function of transmitting light. In that case, the electrode 101 and the electrode 102 can have a function of adjusting the optical path length so that light of a desired wavelength emitted from each light-emitting layer resonates and the light of a desired wavelength is intensified, which is preferable.

As the method for forming the electrode 101 and the electrode 102, a sputtering method, an evaporation method, a printing method, a coating method, an MBE (Molecular Beam Epitaxy) method, a CVD method, a pulsed laser deposition method, an ALD (Atomic Layer Deposition) method, or the like can be used as appropriate.

<<Substrate>>

A light-emitting device of one embodiment of the present invention is formed over a substrate of glass, plastic, or the like. As for the order of forming layers over the substrate, layers may be sequentially stacked from the electrode 101 side or sequentially stacked from the electrode 102 side.

For the substrate over which the light-emitting device of one embodiment of the present invention can be formed, glass, quartz, plastic, or the like can be used, for example. Alternatively, a flexible substrate can be used. The flexible substrate means a substrate that can be bent, such as a plastic substrate made of polycarbonate or polyarylate, for example. Furthermore, a film, an inorganic vapor deposition film, or the like can be used. Note that materials other than these may be used as long as they function as a support in a manufacturing process of the light-emitting device and an optical element. Alternatively, another material may be used as long as it has a function of protecting the light-emitting device and the optical element.

In this specification and the like, a light-emitting device can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper which includes a fibrous material, a base material film, and the like. As an example of the glass substrate, a barium borosilicate glass substrate, an aluminoborosilicate glass substrate, a soda lime glass substrate, and the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, paper, and the like.

Furthermore, a flexible substrate may be used as the substrate and the light-emitting device may be formed directly on the flexible substrate. Alternatively, a separation layer may be provided between the substrate and the light-emitting device. The separation layer can be used when part or the whole of a light-emitting device formed over the separation layer is separated from the substrate and transferred onto another substrate. In such a case, the light-emitting device can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting device is formed using a substrate, the light-emitting device may be transferred to another substrate. Examples of the substrate to which the light-emitting device is transferred are, in addition to the above substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), and the like), a leather substrate, a rubber substrate, and the like. With the use of such a substrate, a light-emitting device with high durability, a light-emitting device with high heat resistance, a light-emitting device with reduced weight, or a light-emitting device with reduced thickness can be obtained.

The light-emitting device 150 may be formed over an electrode electrically connected to a field-effect transistor (FET), for example, that is formed over any of the above-described substrates. Accordingly, an active matrix display device in which the FET controls the driving of the light-emitting device 150 can be manufactured.

The structure described above in this embodiment can be used in appropriate combination with the other embodiments.

Embodiment 4

In this embodiment, a light-emitting device having a structure different from the structure of the light-emitting device described in Embodiment 3 will be described below with reference to FIG. 2. Note that in FIG. 2, a portion having a function similar to that of a portion denoted by a reference numeral shown in FIG. 1(A) is represented by the same hatch pattern and the reference numeral is omitted in some cases. In addition, common reference numerals are used for portions having similar functions, and a detailed description thereof is omitted in some cases.

Structure Example 2 of Light-Emitting Device

Figure 2:
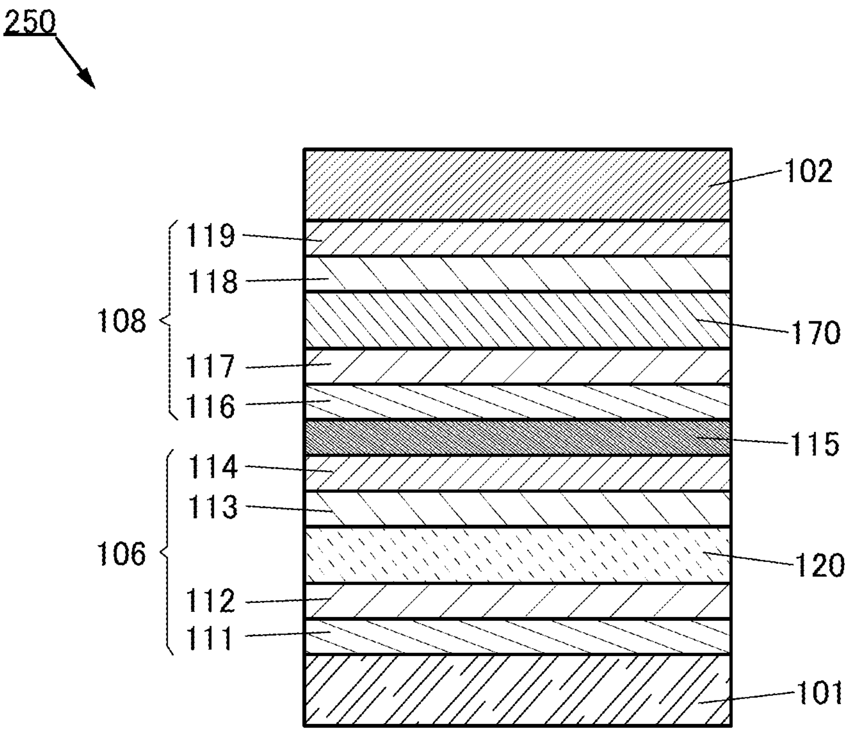
FIG. 2 is a schematic diagram of a light-emitting device of one embodiment of the present invention.

FIG. 2 is a schematic cross-sectional view of a light-emitting device 250.

The light-emitting device 250 illustrated in FIG. 2 includes a plurality of light-emitting units (a light-emitting unit 106 and a light-emitting unit 108) between a pair of electrodes (the electrode 101 and the electrode 102). Any one of the plurality of light-emitting units preferably has a structure similar to that of the EL layer 100 illustrated in FIG. 1(A). That is, the light-emitting device 150 illustrated in FIG. 1(A) includes one light-emitting unit, while the light-emitting device 250 includes a plurality of light-emitting units. Note that the electrode 101 functions as an anode and the electrode 102 functions as a cathode in the light-emitting device 250 in the following description; however, the functions of the electrodes may be reversed as the structure of the light-emitting device 250.

Moreover, in the light-emitting device 250 illustrated in FIG. 2, the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures. For example, it is preferable to use a structure similar to that of the EL layer 100 for the light-emitting unit 108.

The light-emitting device 250 includes a light-emitting layer 120 and a light-emitting layer 170. The light-emitting unit 106 includes the hole-injection layer 111, the hole-transport layer 112, an electron-transport layer 113, and an electron-injection layer 114 in addition to the light-emitting layer 170. The light-emitting unit 108 includes a hole-injection layer 116, a hole-transport layer 117, the electron-transport layer 118, and the electron-injection layer 119 in addition to the light-emitting layer 120.

In the light-emitting device 250, any layer of each of the light-emitting unit 106 and the light-emitting unit 108 contains the organometallic complex of one embodiment of the present invention. Note that the layer containing the organic compound is preferably the light-emitting layer 120 or the light-emitting layer 170.

The charge-generation layer 115 may have either a structure in which a substance having an acceptor property, which is an electron acceptor, is added to a hole-transport material or a structure in which a substance having a donor property, which is an electron donor, is added to an electron-transport material. Moreover, both of these structures may be stacked.

In the case where the charge-generation layer 115 contains a composite material of an organic compound and a substance having an acceptor property, the composite material that can be used for the hole-injection layer 111 described in Embodiment 3 is used as the composite material. As the organic compound, a variety of compounds such as an aromatic amine compound, a carbazole compound, an aromatic hydrocarbon, and a high molecular compound (an oligomer, a dendrimer, a polymer, or the like) can be used. Note that a substance having a hole mobility of $1\times10^{-6}$ $cm^2/Vs$ or higher is preferably used as the organic compound. However, other substances may also be used as long as they have a property of transporting more holes than electrons. Since the composite material of an organic compound and a substance having an acceptor property has excellent carrier-injection and carrier-transport properties, low-voltage driving or low-current driving can be achieved. Note that in the case where a surface of a light-emitting unit on the anode side is in contact with the charge-generation layer 115, the charge-generation layer 115 can also serve as a hole-injection layer or a hole-transport layer of the light-emitting unit; thus, a structure in which a hole-injection layer or a hole-transport layer is not provided in the light-emitting unit may be employed. Alternatively, in the case where a surface of a light-emitting unit on the cathode side is in contact with the charge-generation layer 115, the charge-generation layer 115 can also serve as an electron-injection layer or an electron-transport layer of the light-emitting unit; thus, a structure in which an electron-injection layer or an electron-transport layer is not provided in the light-emitting unit may be employed.

Note that the charge-generation layer 115 may have a stacked-layer structure combining a layer containing the composite material of an organic compound and a substance having an acceptor property and a layer formed of another material. For example, a layer containing the composite material of an organic compound and a substance having an acceptor property and a layer containing one compound selected from electron-donating substances and a compound having a high electron-transport property may be combined. Moreover, a layer containing the composite material of an organic compound and a substance having an acceptor property and a layer containing a transparent conductive film may be combined.

Note that the charge-generation layer 115 sandwiched between the light-emitting unit 106 and the light-emitting unit 108 injects electrons into one of the light-emitting units and injects holes into the other of the light-emitting units when voltage is applied to the electrode 101 and the electrode 102. For example, in FIG. 2, the charge-generation layer 115 injects electrons into the light-emitting unit 106 and injects holes into the light-emitting unit 108 when voltage is applied such that the potential of the electrode 101 is higher than the potential of the electrode 102.

Note that in terms of light extraction efficiency, the charge-generation layer 115 preferably has a property of transmitting visible light (specifically, the transmittance of visible light through the charge-generation layer 115 is higher than or equal to 40%). Moreover, the charge-generation layer 115 functions even when it has lower conductivity than the pair of electrodes (the electrode 101 and the electrode 102).

Forming the charge-generation layer 115 using the above-described materials can inhibit an increase in drive voltage in the case where the light-emitting layers are stacked.

The light-emitting device having two light-emitting units has been described with reference to FIG. 2; however, a light-emitting device in which three or more light-emitting units are stacked can be similarly employed. When a plurality of light-emitting units partitioned by the charge-generation layer are arranged between a pair of electrodes as in the light-emitting device 250, it is possible to achieve a light-emitting device that can emit high-luminance light with the current density kept low and has a long lifetime. Moreover, a light-emitting device having low power consumption can be achieved.

Note that in each of the above structures, the emission colors exhibited by the guest materials used in the light-emitting unit 106 and the light-emitting unit 108 may be the same or different. In the case where guest materials having a function of exhibiting light emission of the same color are used for the light-emitting unit 106 and the light-emitting unit 108, the light-emitting device 250 can exhibit high emission luminance at a small current value, which is preferred. In the case where guest materials having a function of exhibiting light emission of different colors are used for the light-emitting unit 106 and the light-emitting unit 108, the light-emitting device 250 can exhibit multi-color light emission, which is preferred. In this case, with the use of a plurality of light-emitting materials with different emission wavelengths in one or both of the light-emitting layer 120 and the light-emitting layer 170, the light-emitting device 250 emits light obtained by synthesizing light emission having different emission peaks; thus, its emission spectrum has at least two local maximum values.

The above structure is also suitable for obtaining white light emission. When the light-emitting layer 120 and the light-emitting layer 170 emit light of complementary colors, white light emission can be obtained. It is particularly suitable to select the guest materials so that white light emission with high color rendering properties or light emission of at least red, green, and blue can be obtained.

In the case of a light-emitting device in which three or more light-emitting units are stacked, colors of light emitted from guest materials used in the light-emitting units may be the same or different from each other. In the case where a plurality of light-emitting units that emit light of the same color are included, these light-emitting units can emit light with high intensity with a small current value. Such a structure can be suitably used for adjustment of emission colors. The structure is particularly suitable when guest materials that emit light of different colors with different emission efficiencies are used. For example, when three layers of light-emitting units are included, the intensity of fluorescence and phosphorescence can be adjusted with two layers of light-emitting units that contain a fluorescent material for the same color and one layer of a light-emitting unit that contains a phosphorescent material that emits light of a color different from the emission color of the fluorescent material. That is, the intensity of emitted light of each color can be adjusted with the number of light-emitting units.

In the case of the light-emitting device including two layers of fluorescent units and one layer of a phosphorescent unit, it is preferable that the light-emitting device include the two layers of the light-emitting units including a blue fluorescent material and the one layer of the light-emitting unit including a yellow phosphorescent material; that the light-emitting device include the two layers of the light-emitting units including a blue fluorescent material and the one layer of the light-emitting-layer unit including a red phosphorescent material and a green phosphorescent material; or that the light-emitting device include the two layers of the light-emitting units including a blue fluorescent material and the one layer of the light-emitting-layer unit including a red phosphorescent material, a yellow phosphorescent material, and a green phosphorescent material, in which case white light emission can be obtained efficiently.

At least one of the light-emitting layer 120 and the light-emitting layer 170 may further be divided into layers and the divided layers may contain different light-emitting materials. That is, at least one of the light-emitting layer 120 and the light-emitting layer 170 can consist of two or more layers. For example, in the case where the light-emitting layer is formed by stacking a first light-emitting layer and a second light-emitting layer in this order from the hole-transport layer side, the first light-emitting layer is formed using a material having a hole-transport property as the host material and the second light-emitting layer is formed using a material having an electron-transport property as the host material. In this case, the light-emitting materials contained in the first light-emitting layer and the second light-emitting layer may be the same or different, and may have functions of exhibiting light emission of the same color or exhibiting light emission of different colors. White light emission with high color rendering properties that is formed of three primary colors or four or more emission colors can also be obtained by using a plurality of light-emitting materials having functions of exhibiting light emission of different colors.

In addition, it is suitable that the light-emitting layer of the light-emitting unit 108 include a phosphorescent compound. When the organometallic complex of one embodiment of the present invention is used for at least one of the plurality of units, a light-emitting device with high emission efficiency and reliability can be provided.

Note that this embodiment can be combined as appropriate with any of the other embodiments.

Embodiment 5

In this embodiment, a light-emitting apparatus including the light-emitting device described in Embodiment 3 and Embodiment 4 will be described with reference to FIG. 3(A) and FIG. 3(B).

Figure 3A:
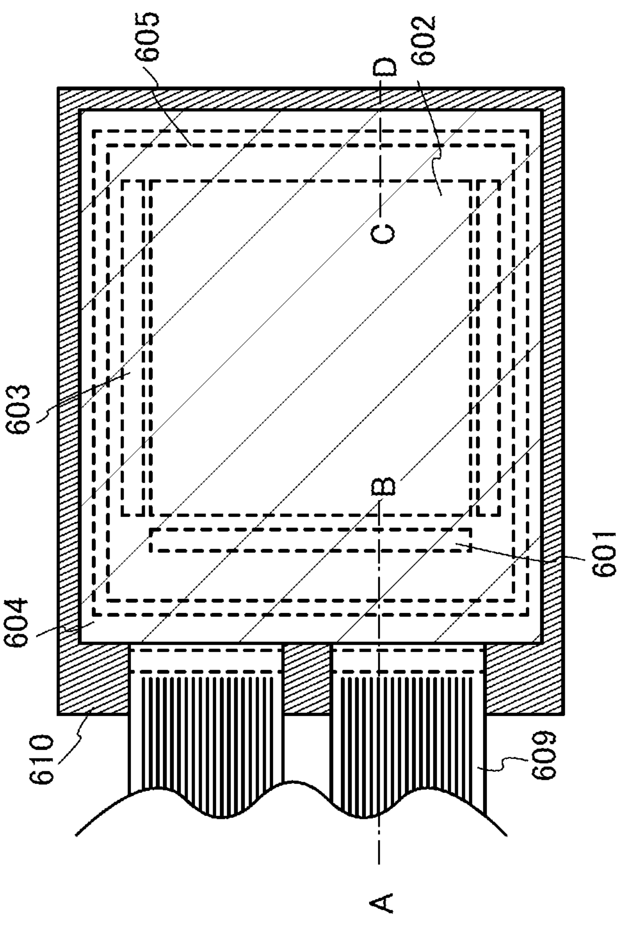
FIGS. 3(A) and 3(B) are conceptual diagrams of an active matrix light-emitting apparatus of one embodiment of the present invention.
Figure 3B:
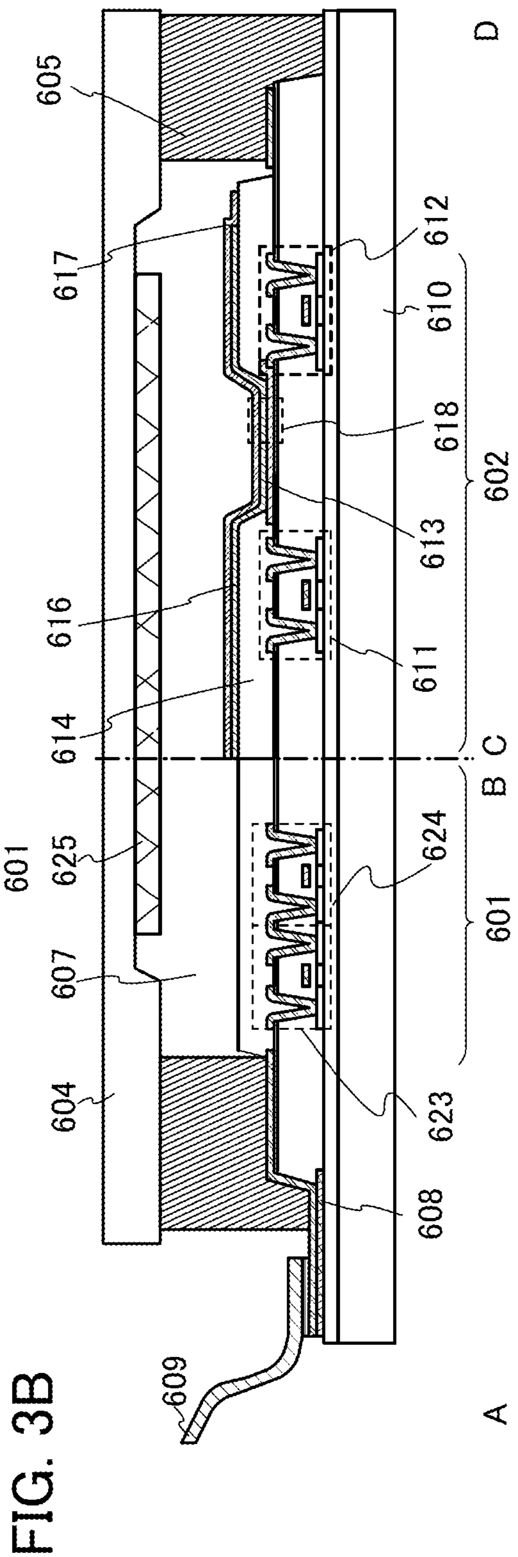

FIG. 3(A) is a top view of a light-emitting apparatus, and FIG. 3(B) is a cross-sectional view taken along A-B and C-D in FIG. 3(A). This light-emitting apparatus includes a driver circuit portion (a source side driver circuit) 601, a pixel portion 602, and a driver circuit portion (a gate side driver circuit) 603 which are indicated by dotted lines as components controlling light emission from a light-emitting device. Furthermore, 604 denotes a sealing substrate, 625 denotes a desiccant, 605 denotes a sealing material, and a portion surrounded by the sealing material 605 is a space 607.

Note that a lead wiring 608 is a wiring for transmitting signals to be input to the source side driver circuit 601 and the gate side driver circuit 603 and receives a video signal, a clock signal, a start signal, a reset signal, and the like from an FPC (flexible printed circuit) 609 serving as an external input terminal. Although only the FPC is shown here, a printed wiring board (PWB) may be attached to the FPC. The light-emitting apparatus in this specification includes not only the light-emitting apparatus itself but also the state where the FPC or the PWB is attached thereto.

Next, a cross-sectional structure of the above light-emitting apparatus is described with reference to FIG. 3(B). The driver circuit portion and the pixel portion are formed over an element substrate 610; here, the source side driver circuit 601, which is the driver circuit portion, and one pixel of the pixel portion 602 are illustrated.

Note that in the source side driver circuit 601, a CMOS circuit in which an n-channel TFT 623 and a p-channel TFT 624 are combined is formed. The driver circuit may be formed of various CMOS circuits, PMOS circuits, or NMOS circuits. Although a driver-integrated type where the driver circuit is formed over the substrate is described in this embodiment, the driver circuit is not necessarily integrated and can be formed not over the substrate but outside the substrate.

The pixel portion 602 is formed of pixels including a switching TFT 611, a current controlling 612, and a first electrode 613 electrically connected to a drain thereof. Note that an insulator 614 is formed to cover an end portion of the first electrode 613. The insulator 614 can be formed using a positive photosensitive resin film.

In order to improve the coverage of a film formed over the insulator 614, the insulator 614 is formed to have a surface with curvature at its upper end portion or lower end portion. For example, in the case where a photosensitive acrylic is used as a material of the insulator 614, only the upper end portion of the insulator 614 preferably has a curved surface. The radius of curvature of the curved surface is preferably greater than or equal to 0.2 μm and less than or equal to 0.3 μm. Either a negative or positive photosensitive material can be used for the insulator 614.

An EL layer 616 and a second electrode 617 are formed over the first electrode 613. Here, as a material used for the first electrode 613 functioning as an anode, a material with a high work function is desirably used. For example, a single-layer film of an ITO film, an indium tin oxide film containing silicon, an indium oxide film containing zinc oxide at 2 wt % or higher and 20 wt % or lower, a titanium nitride film, a chromium film, a tungsten film, a Zn film, a Pt film, or the like, a stacked layer of titanium nitride and a film containing aluminum as its main component, a three-layer structure of a titanium nitride film, a film containing aluminum as its main component, and a titanium nitride film, or the like can be used. Note that the stacked-layer structure achieves low wiring resistance, a favorable ohmic contact, and a function as an anode.

The EL layer 616 is formed by any of a variety of methods such as an evaporation method using an evaporation mask, an inkjet method, and a spin coating method. A material included in the EL layer 616 may be a low molecular compound or a high molecular compound (including an oligomer or a dendrimer).

As a material used for the second electrode 617, which is formed over the EL layer 616 and functions as a cathode, a material with a low work function (e.g., Al, Mg, Li, Ca, or an alloy or a compound thereof, such as MgAg, MgIn, or AlLi) is preferably used. Note that in the case where light generated in the EL layer 616 passes through the second electrode 617, a stacked layer of a thin metal film and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that a light-emitting device 618 is formed with the first electrode 613, the EL layer 616, and the second electrode 617. The light-emitting device 618 is preferably a light-emitting device having any of the structures described in Embodiment 3 and Embodiment 4. The pixel portion includes a plurality of light-emitting devices, and the light-emitting apparatus of this embodiment may include both the light-emitting device with the structure described in Embodiment 3 and Embodiment 4 and a light-emitting device with a different structure.

When the sealing substrate 604 and the element substrate 610 are attached to each other with the sealing material 605, a structure in which the light-emitting device 618 is provided in the space 607 surrounded by the element substrate 610, the sealing substrate 604, and the sealing material 605 is obtained. Note that the space 607 is filled with a filler, and may be filled with an inert gas (nitrogen, argon, or the like) or one or both of a resin and a desiccant.

Note that an epoxy-based resin or glass frit is preferably used for the sealing material 605. Such a material is desirably a material that transmits moisture or oxygen as little as possible. As a material used for the sealing substrate 604, in addition to a glass substrate and a quartz substrate, a plastic substrate formed of FRP (Fiber Reinforced Plastics), PVF (polyvinyl fluoride), polyester, acrylic, or the like can be used.

As described above, the light-emitting apparatus including the light-emitting device described in Embodiment 3 and Embodiment 4 can be obtained.

Structure Example 1 of Light-Emitting Apparatus

As an example of a display device, FIG. 4 shows a light-emitting apparatus including a light-emitting device exhibiting white light emission and a coloring layer (a color filter).

Figure 4A:
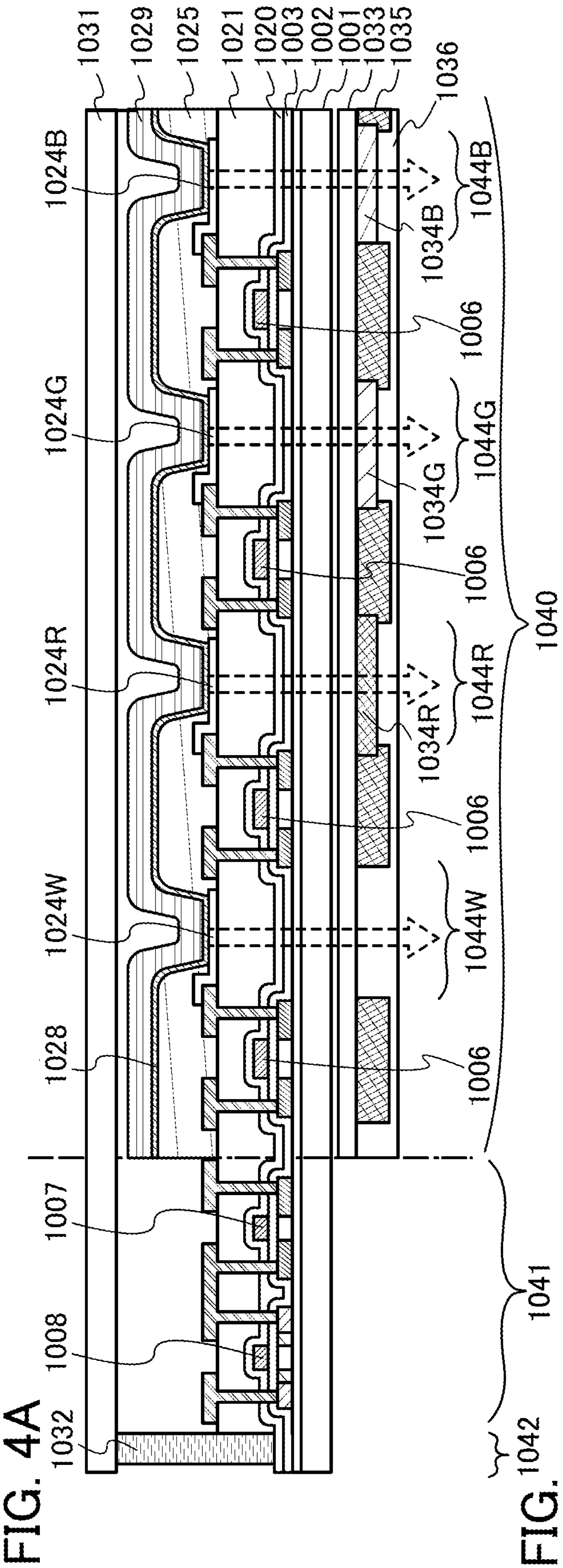
FIGS. 4(A) and 4(B) are each a conceptual diagram of an active matrix light-emitting apparatus of one embodiment of the present invention.

FIG. 4(A) illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of the light-emitting devices, a partition 1026, an EL layer 1028, a second electrode 1029 of the light-emitting devices, a sealing substrate 1031, a sealing material 1032, and the like.

Figure 4B:
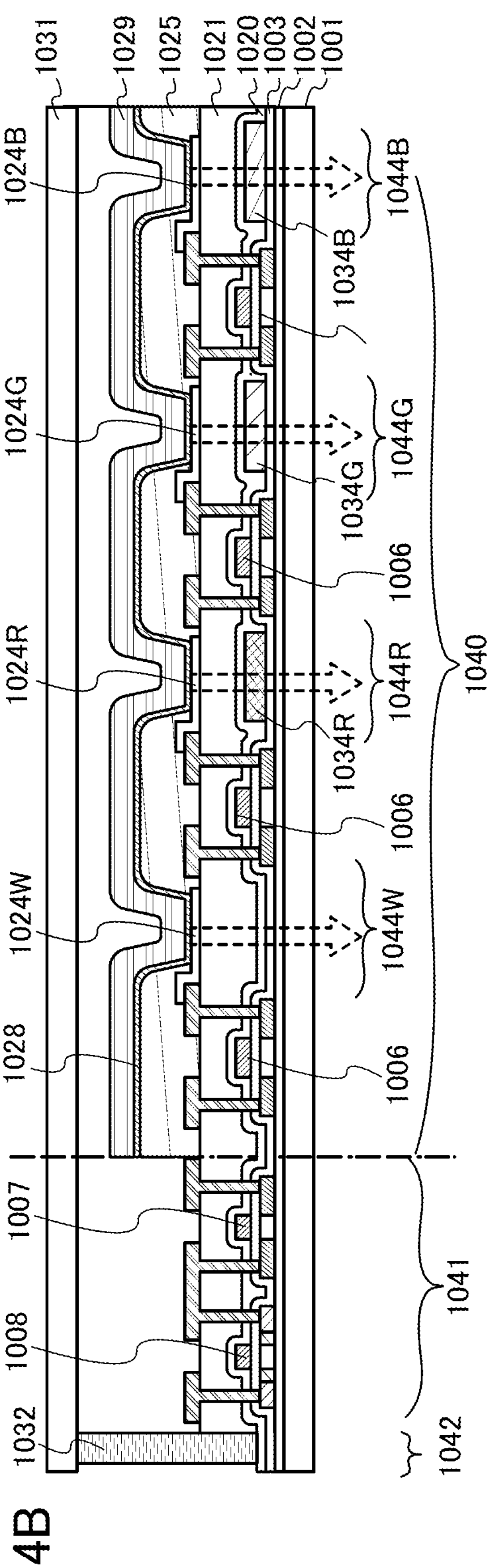

In FIG. 4(A) and FIG. 4(B), coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 4(A), light emitted from some of the light-emitting layers does not pass through the coloring layers and is extracted to the outside, while light emitted from the other light-emitting layers passes through the coloring layers and is extracted to the outside. Since light that does not pass through the coloring layers is white and light that passes through the coloring layers is red, blue, or green, an image can be displayed by pixels of the four colors.

FIG. 4(B) shows an example in which the red coloring layer 1034R, the green coloring layer 1034G, and the blue coloring layer 1034B are formed between the gate insulating film 1003 and the first interlayer insulating film 1020. As illustrated in FIG. 4(B), the coloring layers may be provided between the substrate 1001 and the sealing substrate 1031.

The above-described light-emitting apparatus is a light-emitting apparatus having a structure in which light is extracted on the substrate 1001 side where the TFTs are formed (a bottom emission type), but may be a light-emitting apparatus having a structure in which light is extracted on the sealing substrate 1031 side (a top emission type).

Structure Example 2 of Light-Emitting Apparatus

Figure 5:
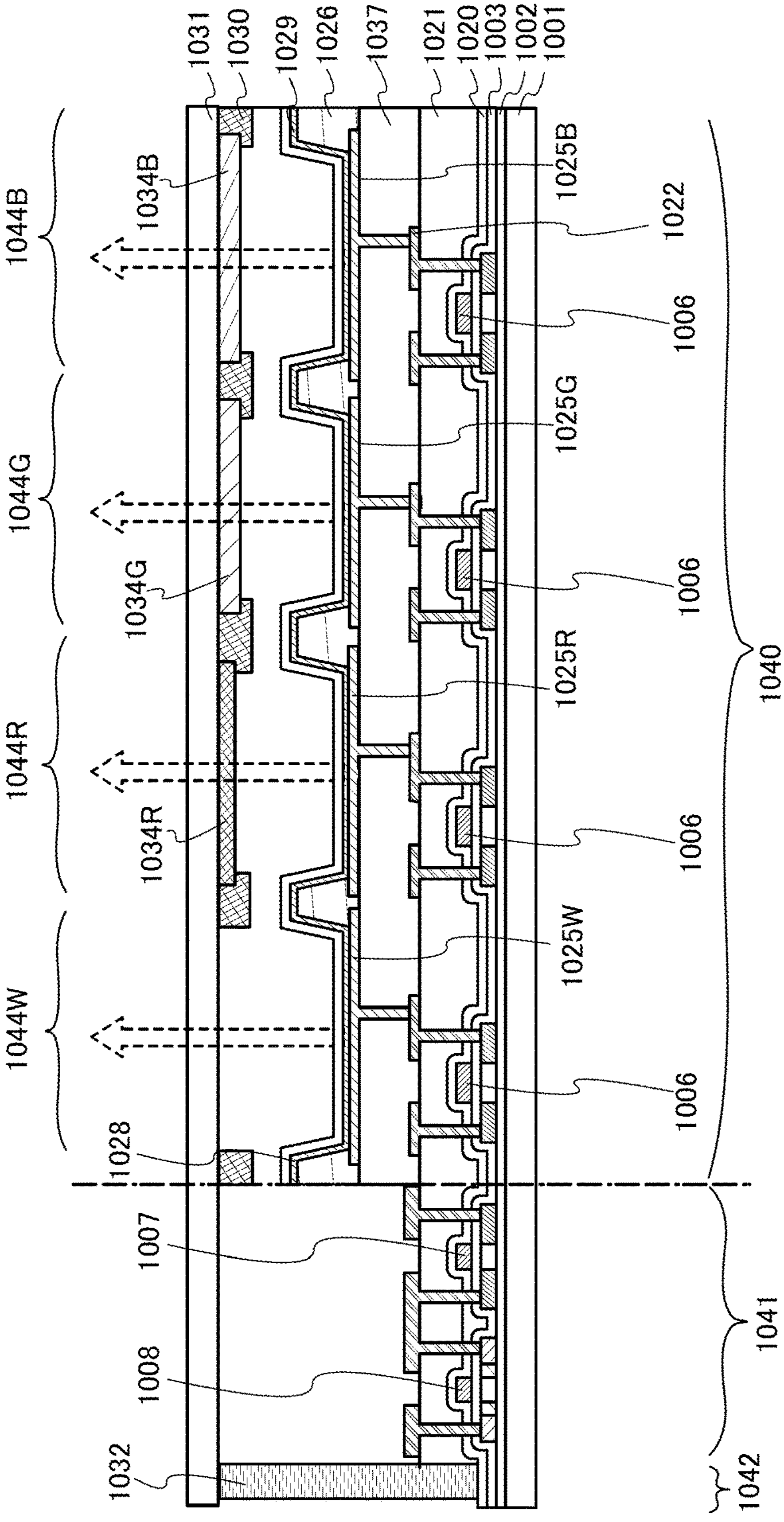
FIG. 5 is a conceptual view of an active matrix light-emitting apparatus of one embodiment of the present invention.

FIG. 5 shows a cross-sectional view of a top-emission light-emitting apparatus. In that case, a substrate that does not transmit light can be used as the substrate 1001. The process up to the formation of a connection electrode that connects the TFT and the anode of the light-emitting device is performed in a manner similar to that of a bottom-emission light-emitting apparatus. Then, a third interlayer insulating film 1037 is formed to cover an electrode 1022. This insulating film may have a planarization function. The third interlayer insulating film 1037 can be formed using a material similar to that of the second interlayer insulating film 1021 or using other various materials.

A first lower electrode 1025W, a lower electrode 1025R, a lower electrode 1025G, and a lower electrode 1025B of the light-emitting devices are anodes here, but may be cathodes. Furthermore, in the case of the top-emission light-emitting apparatus as illustrated in FIG. 5, the lower electrode 1025W, the lower electrode 1025R, the lower electrode 1025G, and the lower electrode 1025B are preferably reflective electrodes. Note that the second electrode 1029 preferably has a function of reflecting light and a function of transmitting light. It is preferable that a microcavity structure be used between the second electrode 1029, and the lower electrode 1025W, the lower electrode 1025R, the lower electrode 1025G, and the lower electrode 1025B, in which case light with a specific wavelength is amplified. The EL layer 1028 has a structure similar to the structures described in Embodiment 3 and Embodiment 4, with which white light emission can be obtained.

In FIG. 4(A), FIG. 4(B), and FIG. 5, the structure of the EL layer for providing white light emission can be achieved by, for example, using a plurality of light-emitting layers or using a plurality of light-emitting units. Note that the structure for providing white light emission is not limited thereto.

In a top emission structure as illustrated in FIG. 5, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (black matrix) 1030 positioned between pixels. The coloring layers (the red coloring layer 1034R, the green coloring layer 1034G, and the blue coloring layer 1034B) and the black layer (black matrix) 1030 may be covered with the overcoat layer. Note that a substrate having a light-transmitting property is used as the sealing substrate 1031.

Although an example in which full color display is performed using four colors of red, green, blue, and white is shown here, there is no particular limitation and full color display using three colors of red, green, and blue may be performed. Alternatively, full color display using four colors of red, green, blue, and yellow may be performed.

As described above, the light-emitting apparatus including the light-emitting device described in Embodiment 3 and Embodiment 4 can be obtained.

Note that this embodiment can be combined as appropriate with any of the other embodiments.

Embodiment 6

In this embodiment, electronic devices of embodiments of the present invention will be described.

One embodiment of the present invention is a light-emitting device using organic EL, and thus, an electronic device with a flat surface, high emission efficiency, and high reliability can be manufactured. An electronic device with a curved surface, high emission efficiency, and high reliability can be manufactured according to one embodiment of the present invention. In addition, with the use of an organic compound of one embodiment of the present invention for the electronic device, an electronic device with high emission efficiency and high reliability can be manufactured.

Examples of the electronic devices include a television device, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

Figure 6A:
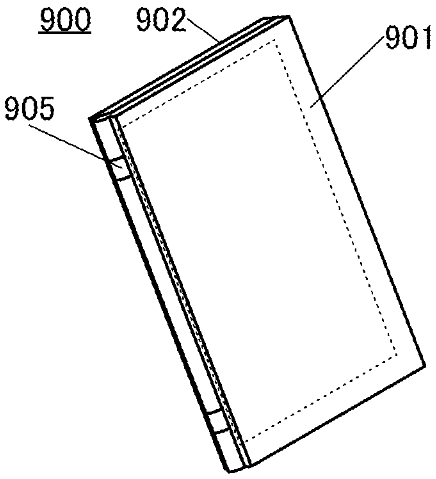
FIGS. 6(A) to 6(D) are diagrams illustrating electronic devices of embodiments of the present invention.
Figure 6B:
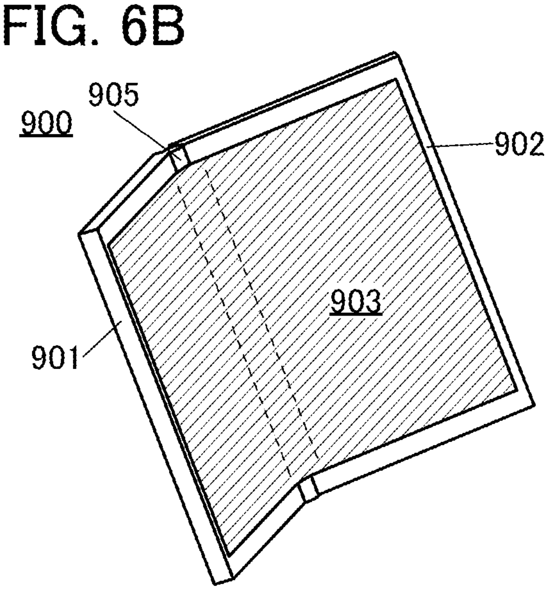

A portable information terminal 900 illustrated in FIGS. 6(A) and 6(B) includes a housing 901, a housing 902, a display portion 903, a hinge portion 905, and the like.

The housing 901 and the housing 902 are joined together by the hinge portion 905. The portable information terminal 900 can be opened as illustrated in FIG. 6(B) from a folded state (FIG. 6(A)). Thus, the portable information terminal 900 has high portability when carried and excellent visibility when used because of its large display region.

In the portable information terminal 900, the flexible display portion 903 is provided across the housing 901 and the housing 902 which are joined together by the hinge portion 905.

The light-emitting apparatus manufactured using one embodiment of the present invention can be used for the display portion 903. Thus, a highly reliable portable information terminal can be manufactured.

The display portion 903 can display at least one of text information, a still image, a moving image, and the like. When text information is displayed on the display portion, the portable information terminal 900 can be used as an e-book reader.

When the portable information terminal 900 is opened, the display portion 903 is held with a large radius of curvature. For example, the display portion 903 is held while including a curved portion with a radius of curvature of greater than or equal to 1 mm and less than or equal to 50 mm, preferably greater than or equal to 5 mm and less than or equal to 30 mm. Part of the display portion 903 can display an image while being curved since pixels are continuously arranged from the housing 901 to the housing 902.

The display portion 903 functions as a touch panel and can be controlled with a finger, a stylus, or the like.

The display portion 903 is preferably formed using one flexible display. Thus, a seamless continuous image can be displayed between the housing 901 and the housing 902. Note that each of the housing 901 and the housing 902 may be provided with a display.

The hinge portion 905 preferably includes a locking mechanism so that an angle formed between the housing 901 and the housing 902 does not become larger than a predetermined angle when the portable information terminal 900 is opened. For example, an angle at which they become locked (they are not opened any further) is preferably greater than or equal to 90° and less than 180° and can be typically 90°, 120°, 135°, 150°, 175°, or the like. In that case, the convenience, safety, and reliability of the portable information terminal 900 can be improved.

When the hinge portion 905 includes a locking mechanism, excessive force is not applied to the display portion 903; thus, breakage of the display portion 903 can be prevented. Therefore, a highly reliable portable information terminal can be achieved.

A power button, an operation button, an external connection port, a speaker, a microphone, or the like may be provided for the housing 901 and the housing 902.

One of the housing 901 and the housing 902 is provided with a wireless communication module, and data can be transmitted and received through a computer network such as the Internet, a LAN (Local Area Network), or Wi-Fi (registered trademark).

Figure 6C:
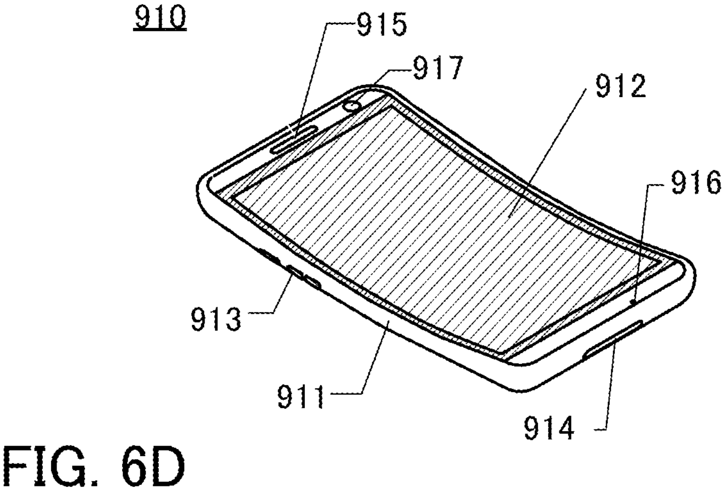

A portable information terminal 910 illustrated in FIG. 6(C) includes a housing 911, a display portion 912, an operation button 913, an external connection port 914, a speaker 915, a microphone 916, a camera 917, and the like.

The light-emitting apparatus manufactured using one embodiment of the present invention can be used for the display portion 912. Thus, the portable information terminal can be manufactured with a high yield.

The portable information terminal 910 includes a touch sensor in the display portion 912. A variety of operations such as making a call and inputting a character can be performed by touch on the display portion 912 with a finger, a stylus, or the like.

In addition, the operation of the operation button 913 can switch the power ON and OFF operations and types of images displayed on the display portion 912. For example, switching from a mail creation screen to a main menu screen can be performed.

When a sensing device such as a gyroscope sensor or an acceleration sensor is provided inside the portable information terminal 910, the direction of display on the screen of the display portion 912 can be automatically switched by determining the orientation (horizontal or vertical) of the portable information terminal 910. Furthermore, the direction of display on the screen can be switched by touch on the display portion 912, operation of the operation button 913, sound input using the microphone 916, or the like.

The portable information terminal 910 has, for example, one or more functions selected from a telephone set, a notebook, an information browsing system, and the like. Specifically, the portable information terminal 910 can be used as a smartphone. The portable information terminal 910 is capable of executing a variety of applications such as mobile phone calls, e-mailing, text viewing and writing, music replay, video replay, Internet communication, and games, for example.

Figure 6D:
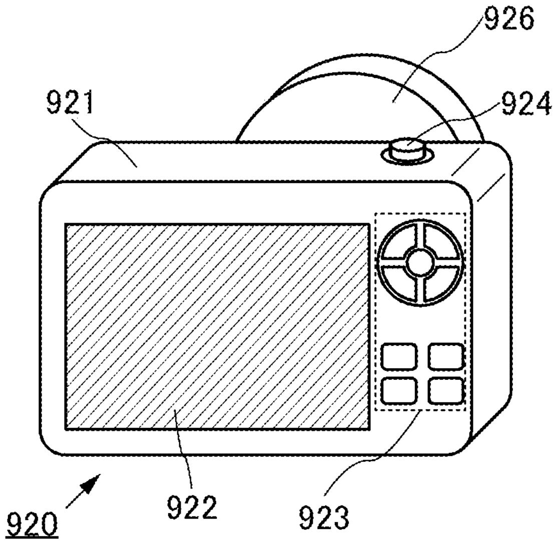

A camera 920 illustrated in FIG. 6(D) includes a housing 921, a display portion 922, operation buttons 923, a shutter button 924, and the like. Furthermore, a detachable lens 926 is attached to the camera 920.

The light-emitting apparatus manufactured using one embodiment of the present invention can be used for the display portion 922. Thus, a highly reliable camera can be manufactured.

Although the camera 920 here is configured such that the lens 926 is detachable from the housing 921 for replacement, the lens 926 may be integrated with the housing 921.

A still image or a moving image can be taken with the camera 920 at the press of the shutter button 924. In addition, the display portion 922 has a function of a touch panel, and images can also be taken by the touch on the display portion 922.

Note that a stroboscope, a viewfinder, or the like can be additionally attached to the camera 920. Alternatively, these may be incorporated into the housing 921.

Figure 7A:
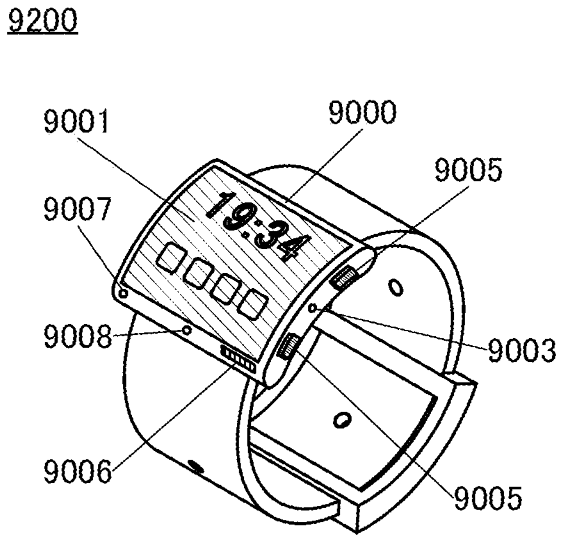
FIGS. 7(A) to 7(E) are diagrams illustrating electronic devices of embodiments of the present invention.
Figure 7B:
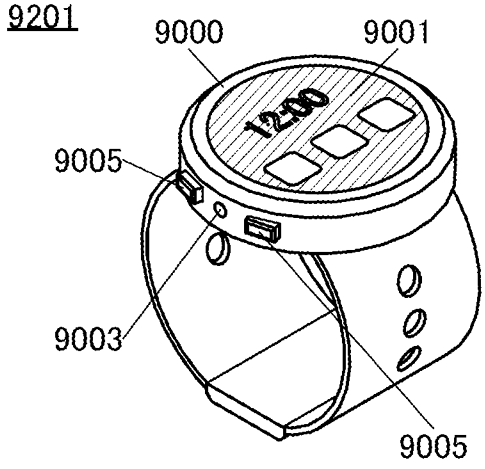

FIG. 7(A) is a perspective view of a wristwatch-type portable information terminal 9200, and FIG. 7(B) is a perspective view of a wristwatch-type portable information terminal 9201.

The portable information terminal 9200 illustrated in FIG. 7(A) is capable of executing a variety of applications such as mobile phone calls, e-mailing, text viewing and writing, music replay, Internet communication, and computer games. The display surface of the display portion 9001 is curved, and an image can be displayed on the curved display surface. The portable information terminal 9200 can perform near field communication conformable to a communication standard. For example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

Unlike in the portable information terminal illustrated in FIG. 7(A), the display surface of the display portion 9001 is not curved in the portable information terminal 9201 illustrated in FIG. 7(B). Furthermore, the external shape of the display portion of the portable information terminal 9201 is a non-rectangular shape (a circular shape in FIG. 7(B)).

Figure 7C:
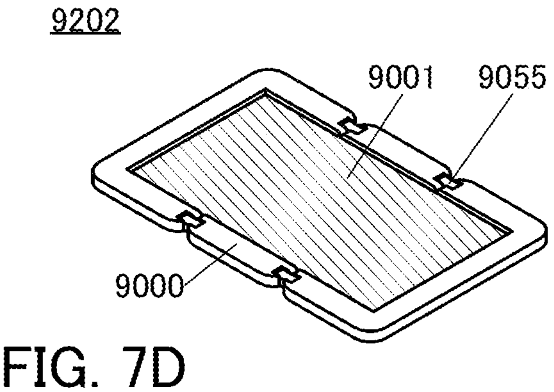
Figure 7D:
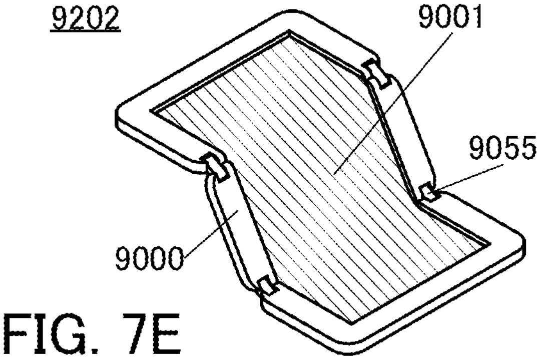
Figure 7E:
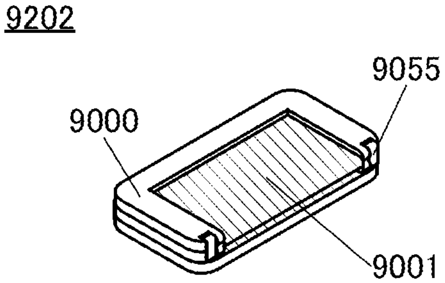

FIGS. 7(C) to 7(E) are perspective views of a foldable portable information terminal 9202. Note that FIG. 7(C) is a perspective view of the portable information terminal 9202 that is opened; FIG. 7(D) is a perspective view of the portable information terminal 9202 that is being changed from one of an opened state and a folded state to the other; and FIG. 7(E) is a perspective view of the portable information terminal 9202 that is folded.

The portable information terminal 9202 is highly portable in the folded state, and is highly browsable in the opened state due to a seamless large display region. The display portion 9001 of the portable information terminal 9202 is supported by three housings 9000 joined together by hinges 9055. By being bent between two housings 9000 with the hinges 9055, the portable information terminal 9202 can be reversibly changed in shape from the opened state to the folded state. For example, the portable information terminal 9202 can be bent with a radius of curvature of greater than or equal to 1 mm and less than or equal to 150 mm.

Figure 8A:
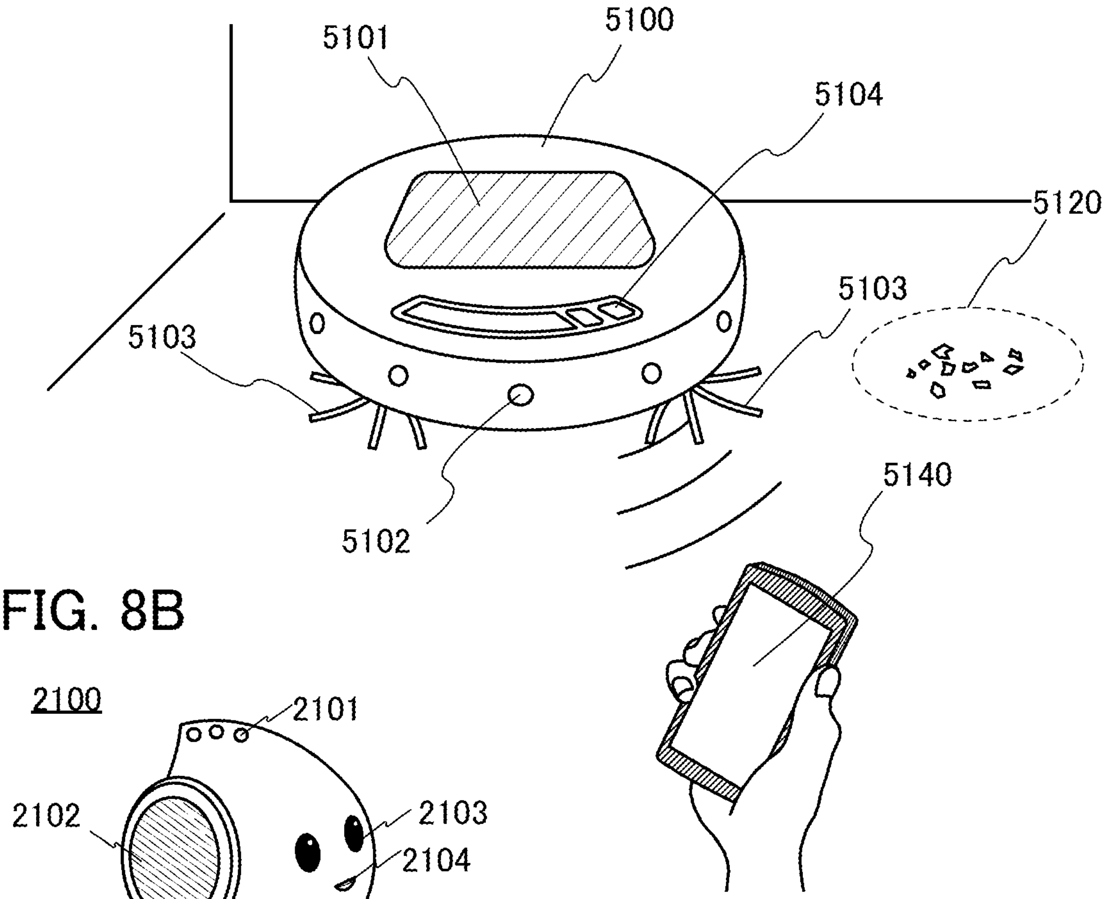
FIGS. 8(A) to 8(C) are diagrams illustrating electronic devices of embodiments of the present invention.

FIG. 8(A) is a schematic view showing an example of a cleaning robot.

A cleaning robot 5100 includes a display 5101 placed on its top surface, a plurality of cameras 5102 placed on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. In addition, the cleaning robot 5100 has a wireless communication means.

The cleaning robot 5100 is self-propelled, detects dust 5120, and sucks up the dust through the inlet provided on the bottom surface.

The cleaning robot 5100 can judge whether there is an obstacle such as a wall, furniture, or a step by analyzing images taken by the cameras 5102. When an object that is likely to be caught in the brush 5103, such as a wire, is detected by image analysis, the rotation of the brush 5103 can be stopped.

The display 5101 can display the remaining capacity of a battery, the amount of vacuumed dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor the room even from the outside. The display on the display 5101 can be checked by the portable electronic device such as a smartphone.

The light-emitting apparatus of one embodiment of the present invention can be used for the display 5101.

Figure 8B:
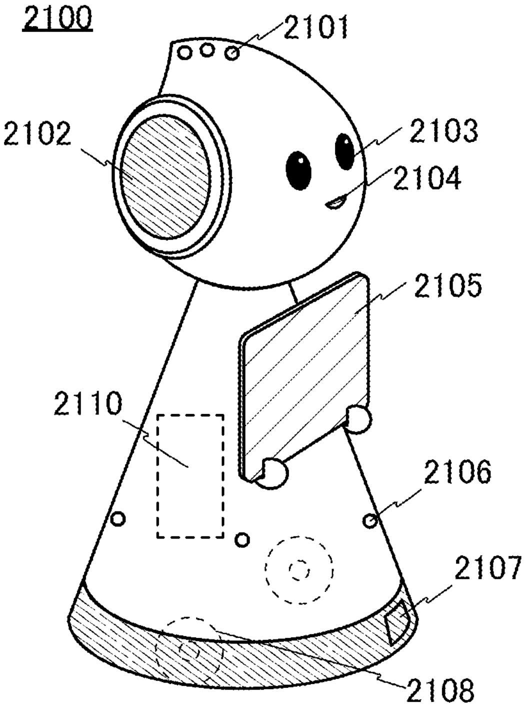

A robot 2100 illustrated in FIG. 8(B) includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect the presence of an obstacle in the direction where the robot 2100 advances with the moving mechanism 2108. The robot 2100 can move safely by recognizing the surroundings with the upper camera 2103, the lower camera 2106, and the obstacle sensor 2107.

The light-emitting apparatus of one embodiment of the present invention can be used for the display 2105.

Figure 8C:
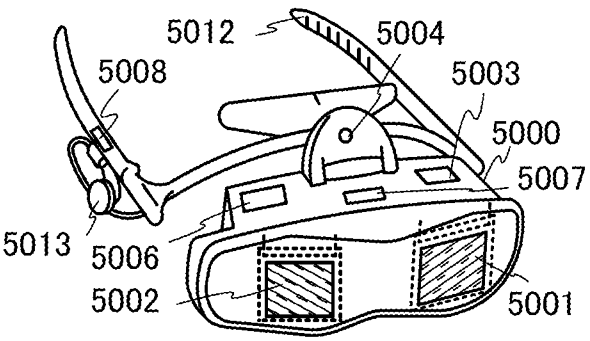

FIG. 8(C) shows an example of a goggle-type display. The goggle-type display includes, for example, a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared ray), a microphone 5008, a second display portion 5002, a support 5012, and an earphone 5013.

The light-emitting apparatus of one embodiment of the present invention can be used for the display portion 5001 and the second display portion 5002.

Figure 9A:
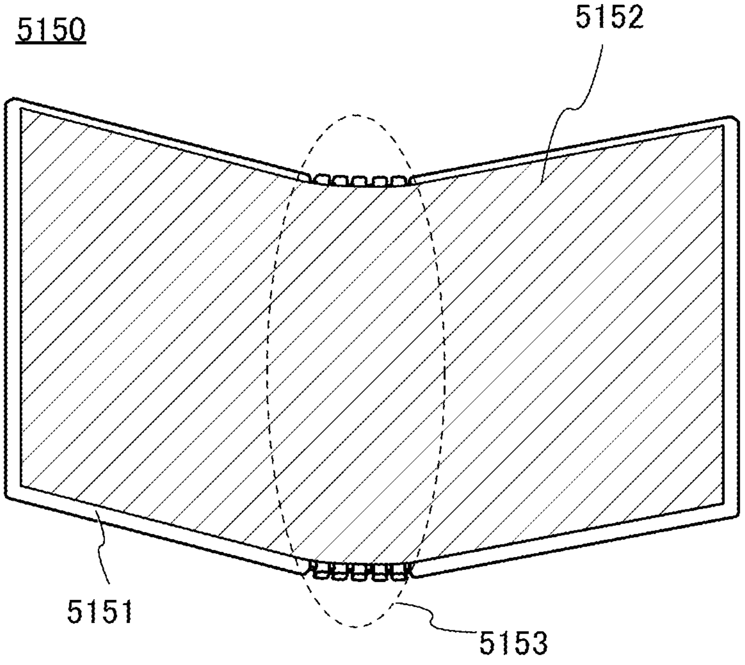
FIGS. 9(A) and 9(B) are diagrams illustrating an electronic device of one embodiment of the present invention.
Figure 9B:
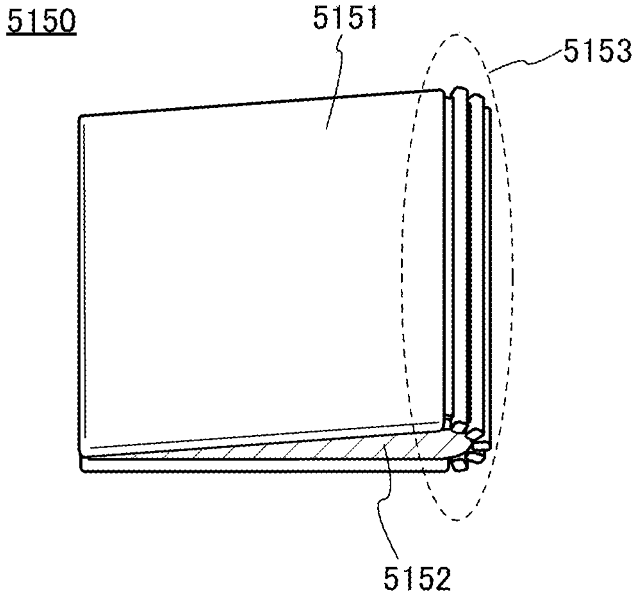

FIGS. 9(A) and 9(B) illustrate a foldable portable information terminal 5150. The foldable portable information terminal 5150 includes a housing 5151, a display region 5152, and a bend portion 5153. FIG. 9(A) illustrates the portable information terminal 5150 that is opened. FIG. 9(B) illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members, and when the display region is folded, the flexible member expands and the bend portion 5153 has a radius of curvature of 2 mm or more, preferably 5 mm or more.

Note that the display region 5152 may be a touch panel (an input/output device) including a touch sensor (an input device). The light-emitting apparatus of one embodiment of the present invention can be used for the display region 5152.

This embodiment can be combined as appropriate with any of the other embodiments.

Embodiment 7

In this embodiment, examples in which the light-emitting device of one embodiment of the present invention is used for various lighting devices will be described with reference to FIG. 10 and FIG. 11. With the use of the light-emitting device of one embodiment of the present invention, a highly reliable lighting device with high emission efficiency can be manufactured.

Fabricating the light-emitting device of one embodiment of the present invention over a substrate having flexibility enables an electronic device or a lighting device that has a light-emitting region with a curved surface to be achieved.

Furthermore, a light-emitting apparatus in which the light-emitting device of one embodiment of the present invention is used can also be used for lighting for motor vehicles; for example, such lighting can be provided on a windshield, a ceiling, and the like.

Figure 10A:
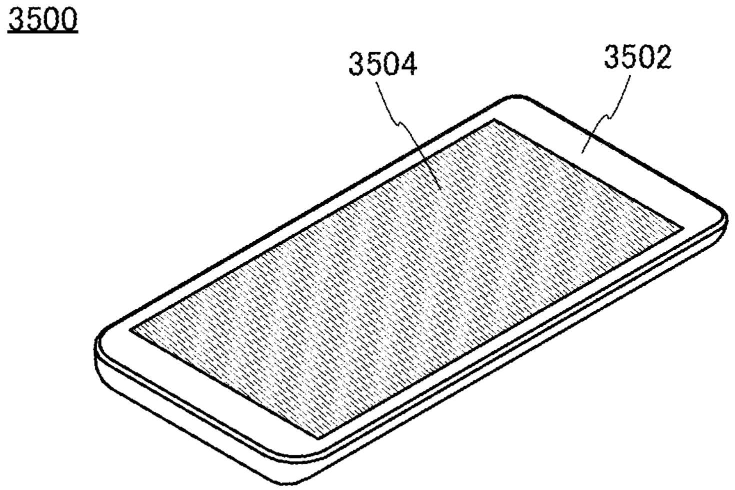
FIGS. 10(A) to 10(C) are diagrams illustrating lighting devices of embodiments of the present invention.
Figure 10B:
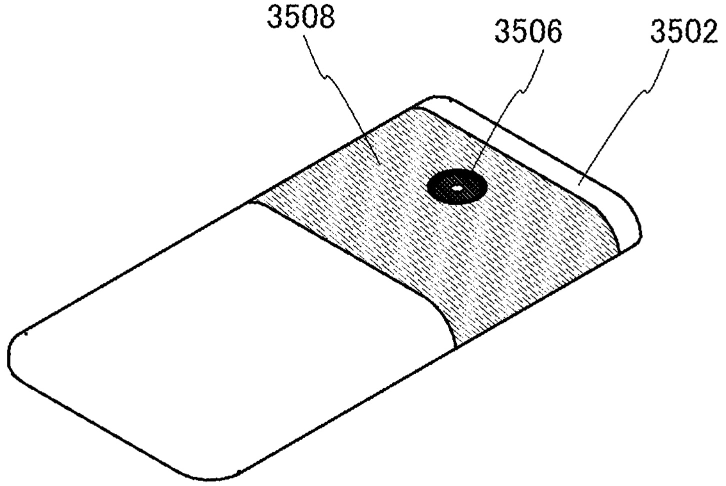

FIG. 10(A) is a perspective view of one surface of a multifunction terminal 3500, and FIG. 10(B) is a perspective view of the other surface of the multifunction terminal 3500. In a housing 3502 of the multifunction terminal 3500, a display portion 3504, a camera 3506, lighting 3508, and the like are incorporated. The light-emitting apparatus of one embodiment of the present invention can be used for the lighting 3508.

The lighting 3508 that includes the light-emitting apparatus of one embodiment of the present invention functions as a planar light source. Thus, unlike a point light source typified by an LED, the lighting 3508 can provide light emission with low directivity. When the lighting 3508 and the camera 3506 are used in combination, for example, an image can be taken by the camera 3506 with the lighting 3508 lighting or flashing. Because the lighting 3508 functions as a planar light source, a photograph as if taken under natural light can be taken.

Note that the multifunction terminal 3500 illustrated in FIGS. 10(A) and 10(B) can have a variety of functions as in the electronic devices illustrated in FIG. 7(A) to FIG. 7(C).

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone, and the like. When a detection device including a sensor for detecting inclination, such as a gyroscope sensor or an acceleration sensor, is provided inside the multifunction terminal 3500, display on the screen of the display portion 3504 can be automatically changed by determining the orientation (horizontal or vertical) of the multifunction terminal 3500.

The display portion 3504 can function as an image sensor. For example, an image of a palm print, a fingerprint, or the like is taken when the display portion 3504 is touched with the palm or the finger, whereby personal authentication can be performed. Furthermore, with the use of a backlight which emits near-infrared light or a sensing light source which emits near-infrared light in the display portion 3504, an image of a finger vein, a palm vein, or the like can be taken. Note that the light-emitting apparatus of one embodiment of the present invention may be used for the display portion 3504.

Figure 10C:
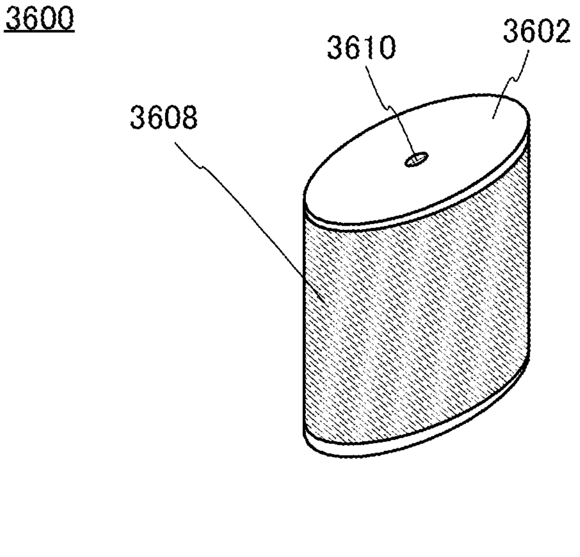

FIG. 10(C) is a perspective view of a security light 3600. The light 3600 includes lighting 3608 on the outside of the housing 3602, and a speaker 3610 and the like are incorporated in the housing 3602. The light-emitting device of one embodiment of the present invention can be used for the lighting 3608.

The light 3600 emits light when the lighting 3608 is gripped or held, for example. An electronic circuit that can control the manner of light emission from the light 3600 may be provided in the housing 3602. The electronic circuit may be a circuit that enables light emission once or intermittently a plurality of times or may be a circuit that can adjust the amount of emitted light by controlling the current value for light emission. A circuit with which a loud audible alarm is output from the speaker 3610 at the same time as light emission from the lighting 3608 may be incorporated.

The light 3600 can emit light in various directions; therefore, it is possible to intimidate a thug or the like with light, or light and sound. Moreover, the light 3600 may include a camera such as a digital still camera to have a photography function.

Figure 11:
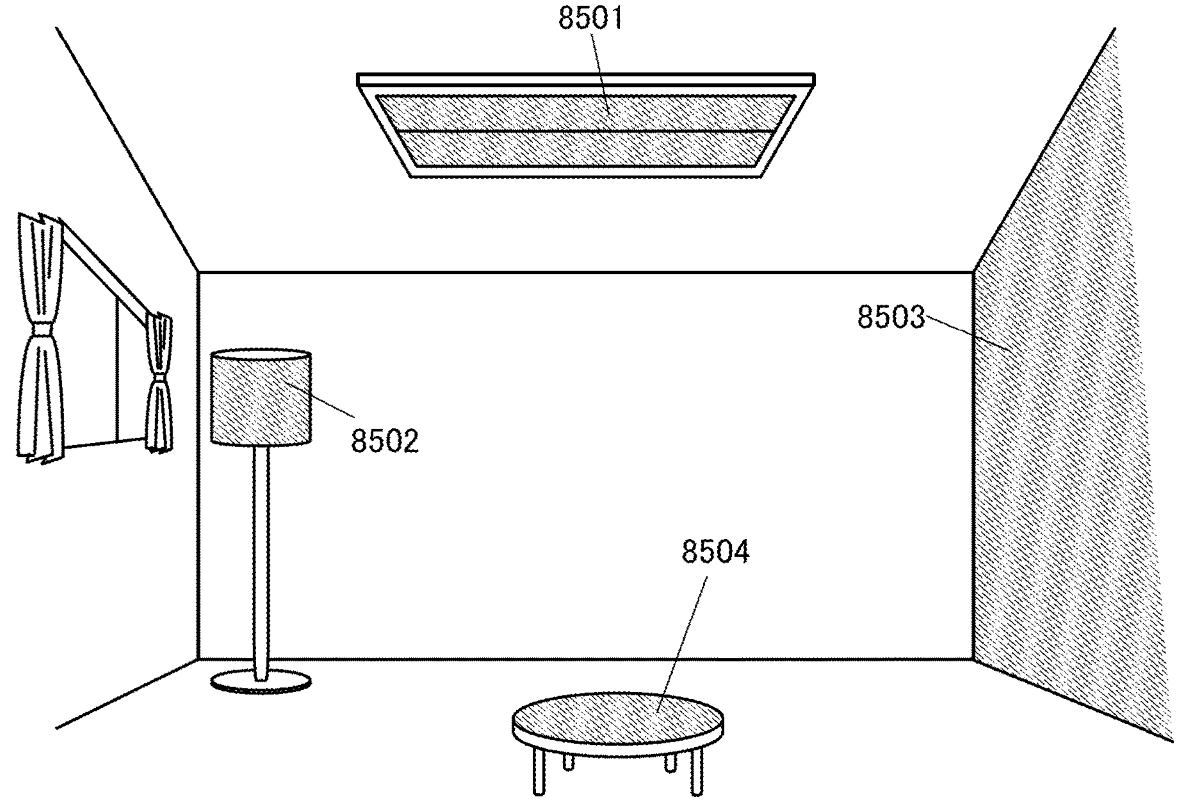
FIG. 11 is a diagram illustrating lighting devices of embodiments of the present invention.

FIG. 11 shows an example in which the light-emitting device is used for an indoor lighting device 8501. Since the light-emitting device can have a larger area, a lighting device having a large area can also be formed. In addition, a lighting device 8502 in which a light-emitting region has a curved surface can also be formed with the use of a housing with a curved surface. A light-emitting device described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to turn the power on or off.

Moreover, when the light-emitting device is used on the surface side of a table, a lighting device 8504 which has a function as a table can be obtained. When the light-emitting device is used as part of other furniture, a lighting device which has a function as the furniture can be obtained.

As described above, lighting devices and electronic devices can be obtained by application of the light-emitting apparatus of one embodiment of the present invention. Note that the light-emitting apparatus can be used for electronic devices in a variety of fields without being limited to the lighting devices and the electronic devices described in this embodiment.

The structure described above in this embodiment can be used in combination as appropriate with any of the structures described in the other embodiments.

Example 1

In this example, a synthesis method of tris{2-[1-(2,6-diisobutylphenyl)-1H-naphtho[1,2-d]imidazol-2-yl-κ$N^3$]phenyl-κC}iridium(III) (abbreviation: $[Ir(pni\text{-}diBup)_3]$) which is one embodiment of the organometallic complex of the present invention represented by Structure Formula (100) in Embodiment 1 is described.

Step 1; Synthesis of 2,6-diisobutylaniline

Into a 5000 mL three-neck flask were put 100 g (617 mmol) of 2,6-dichloroaniline, 230 g (2256 mmol) of isobutylboronic acid, 479 g (2256 mmol) of tripotassium phosphate, 10 g (24.7 mmol) of 2-dicyclohexylphosphino-2',6'-dimethoxybiphenyl (S-phos), and 3000 mL of toluene, the atmosphere in the flask was replaced with nitrogen, and the mixture was degassed by being stirred while the pressure in the flask was reduced. After the degassing, 11 g (11.5 mmol) of tris(dibenzylideneacetone)dipalladium(0) was added, and the mixture was stirred under a nitrogen stream at 120° C. for 12 hours. After a predetermined time elapsed, the obtained reaction solution was subjected to suction filtration. The obtained filtrate was purified by extraction with toluene. After that, purification by silica column chromatography was performed. A developing solvent of hexane:toluene=15:1 was used. The obtained fraction was concentrated, so that 79 g of a target black oily substance was obtained in a yield of 62%. The synthesis scheme of Step 1 is shown in (A-1) below.

[Chemical Formula 51]

(A-1)

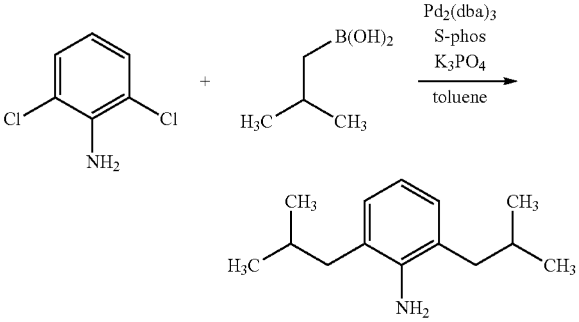

Step 2; Synthesis of 2-nitronaphthalene-1-trifluoromethanesulfonate

Into a 1000 mL three-neck flask were put 35 g (182 mmol) of 2-nitro-1-naphthol, 500 mL of dehydrated dichloromethane, and 51 mL (365 mmol) of triethylamine, the atmosphere in the flask was replaced with nitrogen, and the mixture was cooled down to 0° C. Here, 40 mL (243 mmol) of trifluoromethanesulfonic anhydride (abbreviation: $Tf_2O$) was dripped, and the mixture was stirred at 0° C. for one hour and then stirred at room temperature for 20 hours. After a predetermined time elapsed, 300 mL of water and 30 mL of 1M hydrochloric acid were added to the obtained mixture. After that, the mixture was purified by extraction with dichloromethane. Then, purification by silica column chromatography was performed. A developing solvent of hexane:dichloromethane=5:1 was used. The obtained fraction was concentrated, so that 47 g of a target yellow oily substance was obtained in a yield of 80%. The synthesis scheme of Step 2 is shown in (A-2) below.

[Chemical Formula 52]

(A-2)

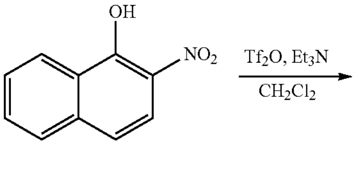

-continued

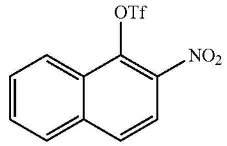

Step 3; Synthesis of N-(2,6-diisobutylphenyl)-2-nitro-1-naphthalenamine

Into a 2000 mL three-neck flask were put 30 g (146 mmol) of 2,6-diisobutylaniline synthesized in Step 1, 47 g (146 mmol) of 2-nitronaphthalene-1-trifluoromethanesulfonate synthesized in Step 2, 81 g (248 mmol) of cesium carbonate, and 750 mL of toluene, the atmosphere in the flask was replaced with nitrogen, and the mixture was degassed by being stirred while the pressure in the flask was reduced. After the degassing, 4.8 g (11.7 mmol) of S-phos and 2.7 g (2.9 mmol) of tris(dibenzylideneacetone)dipalladium(0) were added, and the mixture was stirred under a nitrogen stream at 130° C. for 28 hours. After a predetermined time elapsed, the obtained reaction mixture was purified by extraction with toluene. Then, purification by silica column chromatography was performed. A developing solvent of hexane:ethyl acetate=15:1 was used. The obtained fraction was concentrated, so that 13 g of a yellow oily substance was obtained in a yield of 23%. The synthesis scheme of Step 3 is shown in (A-3) below.

[Chemical Formula 53]

(A-3)

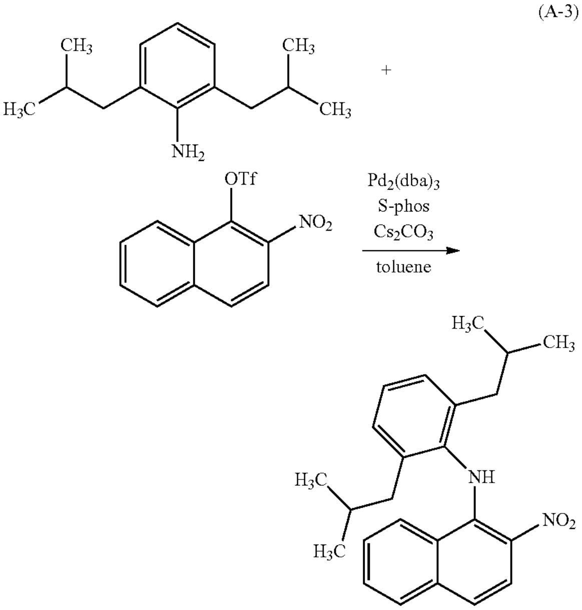

Step 4; Synthesis of N-(2,6-diisobutylphenyl)-1,2-naphthalenediamine

Into a 1000 mL three-neck flask were put 13 g (34 mmol) of N-(2,6-diisobutylphenyl)-2-nitro-1-naphthalenamine synthesized in Step 3, 6.1 mL (0.34 mol) of water, and 400 mL of ethanol, and the mixture was stirred. To this mixture was added 32 g (0.17 mol) of tin(II) chloride, and the mixture was stirred under a nitrogen stream at 80° C. for five hours. After a predetermined time elapsed, the obtained reaction mixture was poured into 500 mL of a 2M sodium hydroxide aqueous solution, and the solution was stirred at room temperature for two hours. A precipitated sediment was subjected to suction filtration, and washing with chloroform was performed, whereby a filtrate was obtained. The obtained filtrate was purified by extraction with chloroform. Then, purification by silica column chromatography was performed. A developing solvent of hexane:ethyl acetate=15:1 was used. The obtained fraction was concentrated, so that 9.5 g of a target black oily substance was obtained in a yield of 81%. The synthesis scheme of Step 4 is shown in (A-4) below.

[Chemical Formula 54]

(A-4)

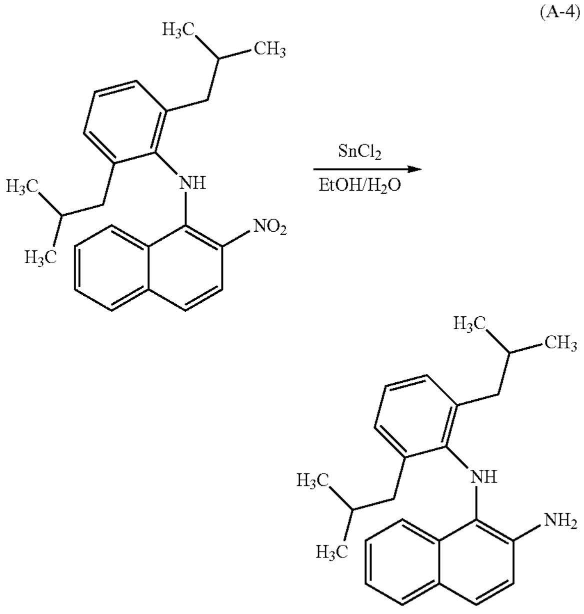

Step 5; Synthesis of 1-(2,6-diisobutylphenyl)-2-phenyl-1H-naphtho[1,2-d]imidazole (abbreviation: Hpni-diBup)

Into a 300 mL recovery flask were put 9.5 g (27 mmol) of N-(2,6-diisobutylphenyl)-1,2-naphthalenediamine synthesized in Step 4, 100 mL of acetonitrile, and 2.9 g (27 mmol) of benzaldehyde, and the mixture was stirred at 100° C. for six hours. To this mixture was added 0.044 g (0.274 mmol) of iron(III) chloride, and the mixture was stirred at 100° C. for 16 hours. After a predetermined time elapsed, the obtained reaction mixture was subjected to extraction with ethyl acetate to give an oily substance, which was put into a 300 mL recovery flask with 100 mL of toluene and 10 g of manganese(IV) oxide and stirred at 130° C. for seven hours. After a predetermined time elapsed, the obtained reaction mixture was subjected to suction filtration through Celite (Wako Pure Chemical Industries, Ltd., Catalog No. 537-02305)/Florisil (Wako Pure Chemical Industries, Ltd., Catalog No. 066-05265)/aluminum oxide. The obtained filtrate was concentrated to give an oily substance. The obtained oily substance was purified by silica column chromatography. Toluene was used as the developing solvent. The obtained fraction was concentrated, so that 7.9 g of a target white solid was obtained in a yield of 66%. The synthesis scheme of Step 5 is shown in (A-5) below.

[Chemical Formula 55]

(A-5)

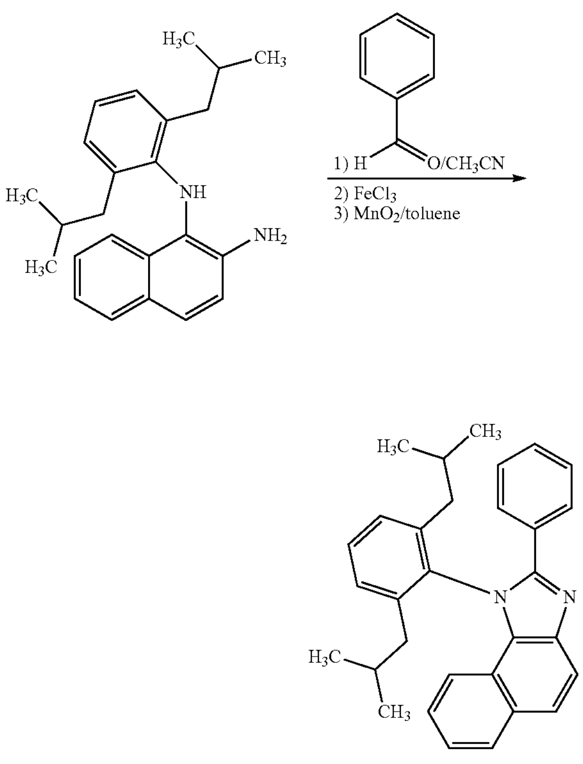

Hpni-diBup

Step 6; Synthesis of di-μ-chloro-tetrakis{2-[1-(2,6-diisobutylphenyl)-1H-naphtho[1,2-d]imidazol-2-yl-κ$N^3$]phenyl-κC}diiridium(III) (Abbreviation: [Ir(pni-diBup)$_2$Cl]$_2$)

Into a 100 mL round-bottom flask were put 3.3 g (7.7 mmol) of 1-(2,6-diisobutylphenyl)-2-phenyl-1H-naphtho[1,2-d]imidazole (abbreviation: Hpni-diBup) synthesized in Step 5, 1.6 g (3.7 mmol) of iridium chloride monohydrate, 30 mL of 2-ethoxyethanol, and 10 mL of water, and the atmosphere in the flask was replaced with argon. This reaction container was subjected to irradiation with microwaves (2.45 GHz, 100 W) for two hours to cause a reaction. After the reaction, the reaction solution was subjected to suction filtration, so that 2.8 g of a target yellow solid was obtained in a yield of 69%. The synthesis scheme of Step 6 is shown in (A-6) below.

[Chemical Formula 56]

(A-6)

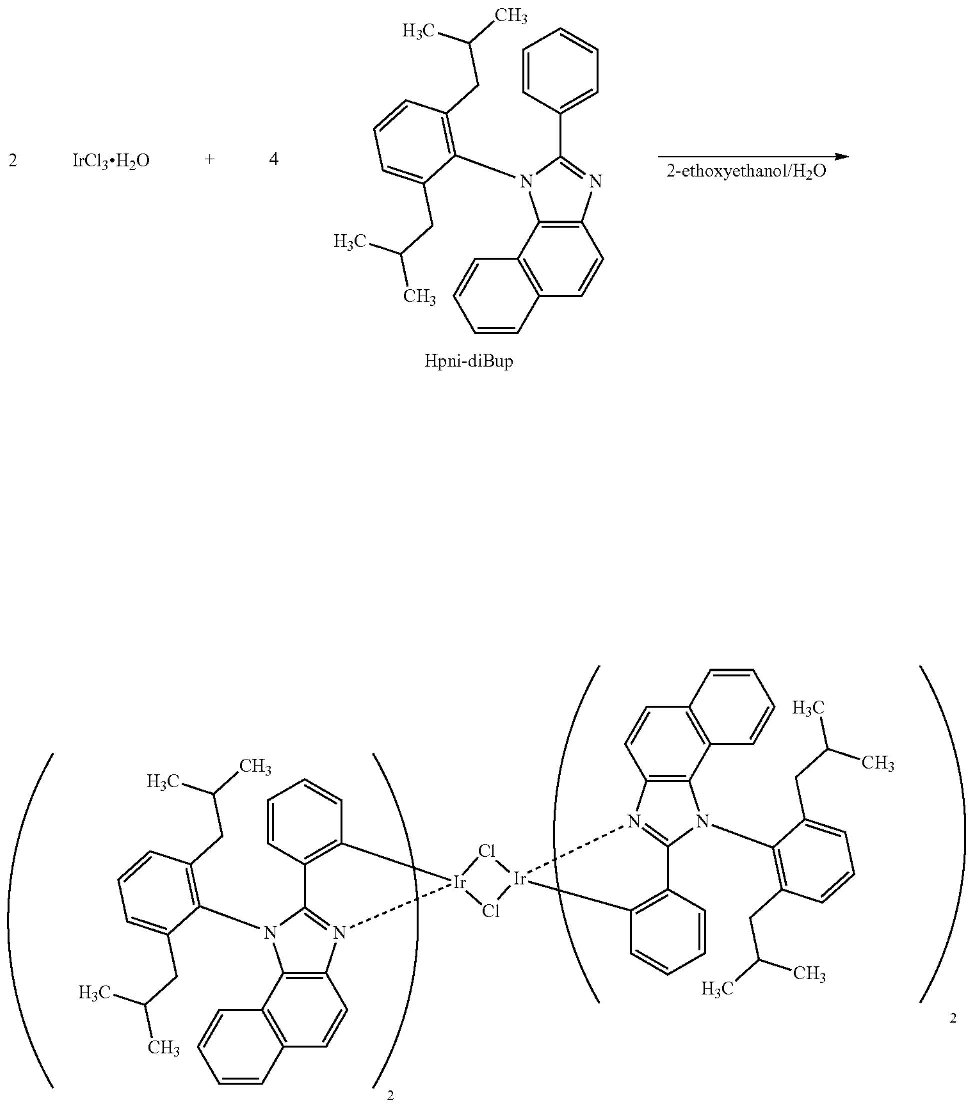

Hpni-diBup $[Ir(pni\text{-}diBup)_2Cl]_2$

Step 7; Synthesis of tris{2-[1-(2,6-diisobutylphenyl)-1H-naphtho[1,2-d]imidazol-2-yl-κ$N^3$]phenyl-κC}iridium(III) (Abbreviation: $[Ir(pni\text{-}diBup)_3]$)

Into a 500 mL three-neck flask were put 2.0 g (0.92 mmol) of di-p-chloro-tetrakis{2-[1-(2,6-diisobutylphenyl)-1H-naphtho[1,2-d]imidazol-2-yl-κ$N^3$]phenyl-κC}diiridium(III) (abbreviation: $[Ir(pni\text{-}diBup)_2Cl]_2$) synthesized by the method of Step 6 and 150 mL of dichloromethane, and the mixture was stirred under a nitrogen stream. To this mixed solution was dripped a mixed solution of 0.72 g (2.8 mmol) of silver trifluoromethanesulfonate and 150 mL of methanol, and the mixed solution was stirred for three days in a dark environment. After the reaction for a predetermined time, the reaction mixture was filtered through Celite. The obtained filtrate was concentrated, so that 2.7 g of a yellow solid was obtained. Into a 500 mL recovery flask were put 2.7 g of the obtained solid, 50 mL of ethanol, and 1.6 g (3.7 mmol) of 1-(2,6-diisobutylphenyl)-2-phenyl-1H-naphtho[1,2-d]imidazole (abbreviation: Hpni-diBup) synthesized by the method of Step 5, and the mixture was heated and refluxed under a nitrogen stream for 20 hours. After the reaction for a predetermined time, the reaction mixture was subjected to suction filtration, so that a solid was obtained. The obtained solid was dissolved in dichloromethane, and suction filtration through Celite/neutral silica/Celite was performed. The obtained filtrate was concentrated to give a solid. The obtained solid was purified by silica column chromatography. A developing solvent of dichloromethane: hexane=1:3 was used. The obtained fraction was concentrated to give a solid. The obtained solid was recrystallized with ethyl acetate/hexane, so that 1.1 g of a solid was obtained in a yield of 40%. The synthesis scheme is shown in (A-7) below.

[Chemical Formula 57]

(A-7)

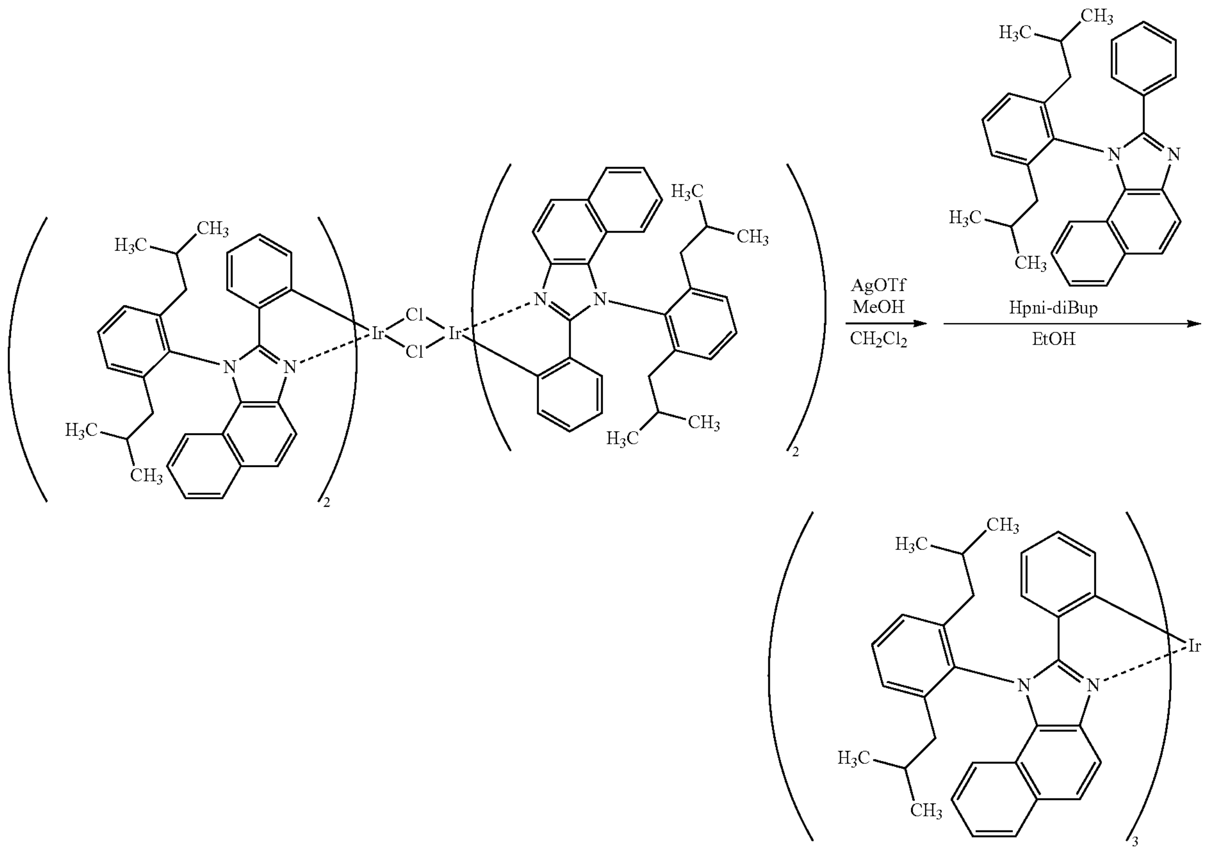

[$Ir(pni\text{-}diBuCNp)_3$]
(100)

By a train sublimation method, 1.1 g of the obtained solid was sublimated and purified. In the purification by sublimation, the obtained solid was heated at 340° C. under a pressure of 2.6 Pa with an argon flow rate of 10.5 mL/min for 41 hours. After the purification by sublimation, 0.93 g of a yellow solid was obtained at a collection rate of 88%.

Figure 12:
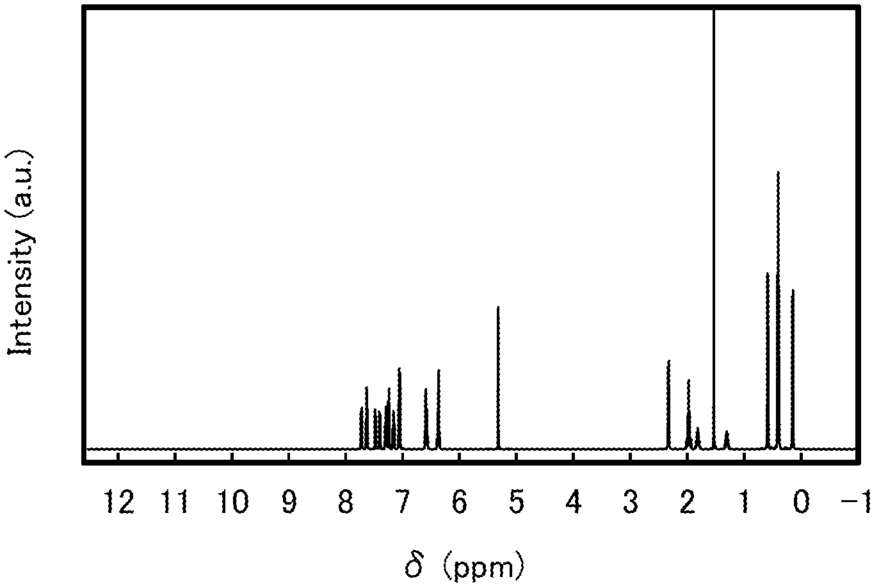
FIG. 12 is an NMR chart of a compound in Example.

The obtained yellow solid was subjected to proton NMR ($^1H$-NMR) measurement. The obtained values are shown below. FIG. 12 shows the $^1H$-NMR chart. It was found from FIG. 12 that [$Ir(pni\text{-}diBup)_3$] which is the organometallic complex of one embodiment of the present invention was obtained.

$^1H$-NMR. δ ($CD_2Cl_2$): 0.15 (d, 9H), 0.39-0.42 (m, 18H), 0.59 (d, 9H), 1.27-1.35 (m, 3H), 1.78-1.86 (m, 3H), 1.93-2.02 (m, 6H), 2.33 (d, 6H), 6.35-6.40 (m, 6H), 6.56-6.61 (m, 6H), 7.04-7.07 (m, 6H), 7.16 (t, 3H), 7.25 (d, 3H), 7.30 (t, 3H), 7.40 (d, 3H), 7.48 (d, 3H), 7.63 (t, 3H), 7.73 (d, 3H).

Figure 13:
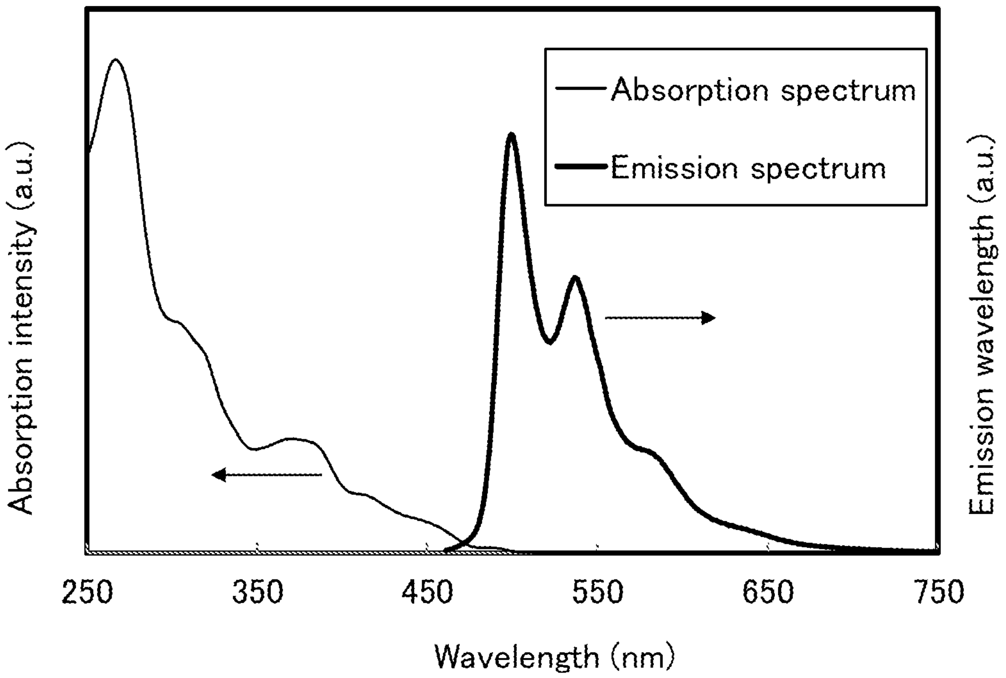
FIG. 13 is a diagram showing an absorption spectrum and an emission spectrum of a compound in Example.

Next, an ultraviolet-visible absorption spectrum (hereinafter, simply referred to as an "absorption spectrum") and an emission spectrum of an [$Ir(pni\text{-}diBup)_3$] solution were measured. The measurement of the absorption spectrum was conducted at room temperature, for which an ultraviolet-visible spectrophotometer (V550 type manufactured by JASCO Corporation) was used and a deoxidized dichloromethane solution of [$Ir(pni\text{-}diBup)_3$] (0.0089 mmol/L) was put into a quartz cell. The measurement of the emission spectrum and the measurement of the emission quantum yield were conducted at room temperature, for which an absolute PL quantum yield measurement system (C11347-01 manufactured by Hamamatsu Photonics K.K.) was used and the deoxidized dichloromethane solution (0.0089 mmol/L) was put and sealed in a quartz cell under a nitrogen atmosphere in a glove box (LABstar M13 (1250/780) manufactured by Bright Co., Ltd.). FIG. 13 shows measurement results of the obtained absorption spectrum and emission spectrum. The horizontal axis represents wavelength and the vertical axes represent absorption intensity and emission intensity. The absorption spectrum shown in FIG. 13 is a result obtained by subtraction of a measured absorption spectrum of only dichloromethane in a quartz cell from the measured absorption spectrum of the deoxidized dichloromethane solution in a quartz cell.

As shown in FIG. 13, the iridium complex [$Ir(pni\text{-}diBup)_3$] had emission peaks at 500 nm and 536 nm, and green light emission from the deoxidized dichloromethane solution was observed.

Furthermore, when the emission quantum yield at an excitation wavelength of 450 nm in the deoxidized dichloromethane solution was measured, the emission quantum yield was found to be as extremely high as 98%.

Example 2

In this example, a synthesis method of bis{2-[1-(2,6-diisobutylphenyl)-1H-naphtho[1,2-d]imidazol-2-yl-κ$N^3$]phenyl-κC}[2-(4-methyl-5-phenyl-2-pyridyl-κ$N^2$)phenyl-κC]iridium(III) (abbreviation: [Ir(pni-diBup)$_2$(mdppy)]) which is the organometallic complex of one embodiment of the present invention represented by Structure Formula (101) in Embodiment 1 is described.

Step 1; Synthesis of bis{2-[1-(2,6-diisobutylphenyl)-1H-naphtho[1,2-d]imidazol-2-yl-κ$N^3$]phenyl-κC}[2-(4-methyl-5-phenyl-2-pyridyl-κ$N^2$)phenyl-κC]iridium(III) (abbreviation: [Ir(pni-diBup)$_2$(mdppy)])

Into a 500 mL three-neck flask were put 1.3 g (0.9 mmol) of di-μ-chloro-tetrakis[2-(4-methyl-5-phenyl-2-pyridinyl-κN)phenyl-κC]diiridium(III) (abbreviation: [Ir(mdppy)$_2$Cl]$_2$) and 180 mL of dichloromethane, and the mixture was stirred under a nitrogen stream. To this mixed solution was dripped a mixed solution of 0.7 g (2.7 mmol) of silver trifluoromethanesulfonate and 35 mL of methanol, and the mixed solution was stirred for 18 hours in a dark environment. After the reaction for a predetermined time, the reaction mixture was filtered through Celite. The obtained filtrate was concentrated, so that 1.9 g of a yellow solid was obtained. Into a 300 mL recovery flask were put 1.9 g of the obtained yellow solid, 30 mL of methanol, 30 mL of ethanol, and 1.6 g (3.6 mmol) of Hpni-diBup, and the mixture was heated and refluxed under a nitrogen stream for 23 hours. After the reaction for a predetermined time, the reaction mixture was subjected to suction filtration to remove an insoluble matter and the filtrate was concentrated, so that a solid was obtained. To the obtained solid was added 60 mL of 1-butanol, and the mixture was heated and refluxed under a nitrogen stream for 22 hours. After the reaction for a predetermined time, the reaction mixture was subjected to suction filtration to give a solid. The obtained solid was purified by silica column chromatography. As the developing solvent, a mixed solvent of hexane:dichloromethane=3:1 was used. The obtained fraction was concentrated to give a solid. The obtained solid was recrystallized with ethyl acetate/hexane, so that 0.20 g of a target yellow solid was obtained in a yield of 9%. The synthesis scheme is shown in (B-1) below.

[Chemical Formula 58]

(B-1)

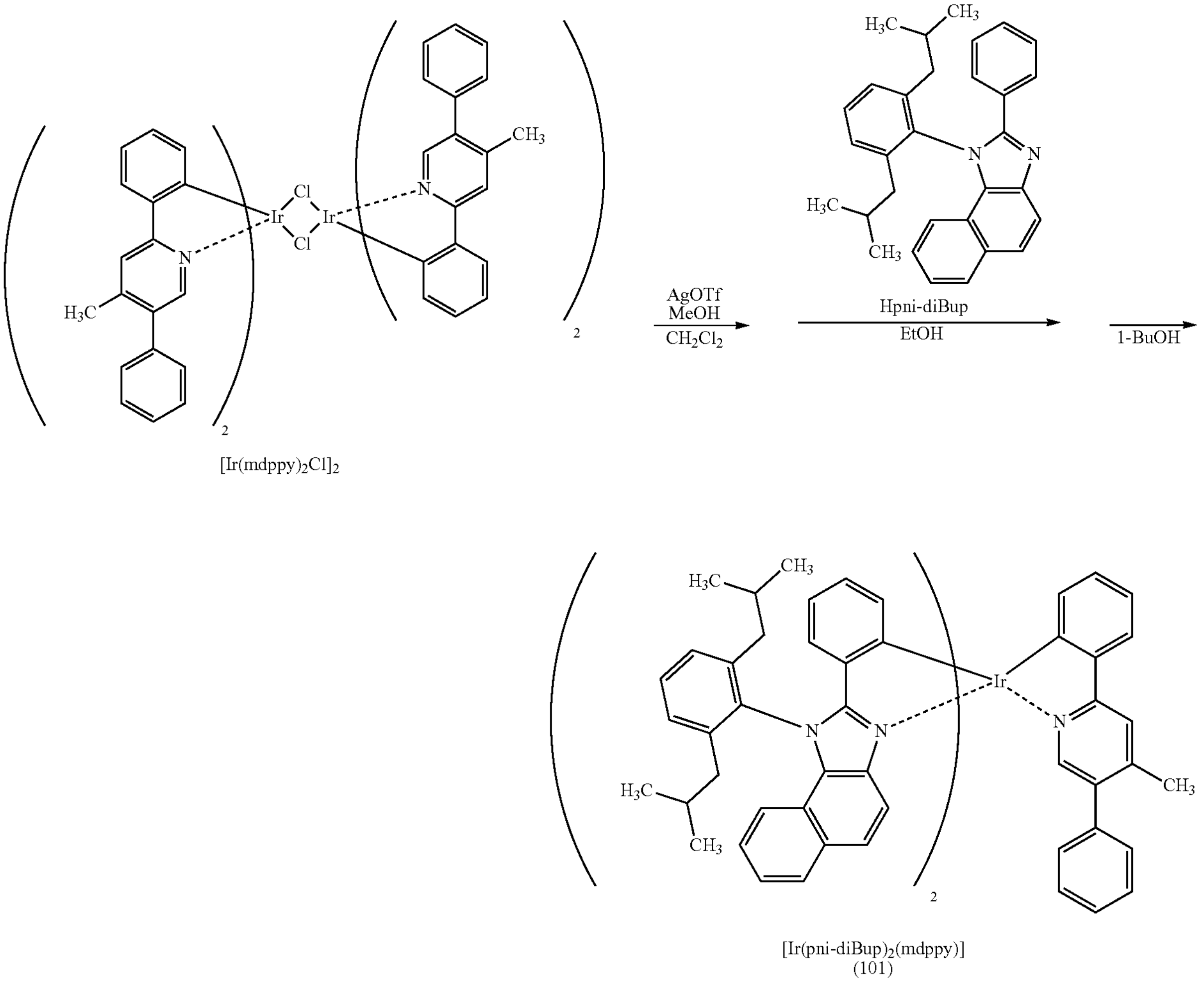

[Ir(mdppy)$_2$Cl]$_2$

[Ir(pni-diBup)$_2$(mdppy)]
(101)

By a train sublimation method, 0.19 g of the obtained solid was sublimated and purified. In the purification by sublimation, the obtained solid was heated at 320° C. under a pressure of 2.5 Pa with an argon flow rate of 10.3 mL/min for 18 hours. After the purification by sublimation, 0.14 g of a yellow solid was obtained at a collection rate of 72%.

Figure 14:
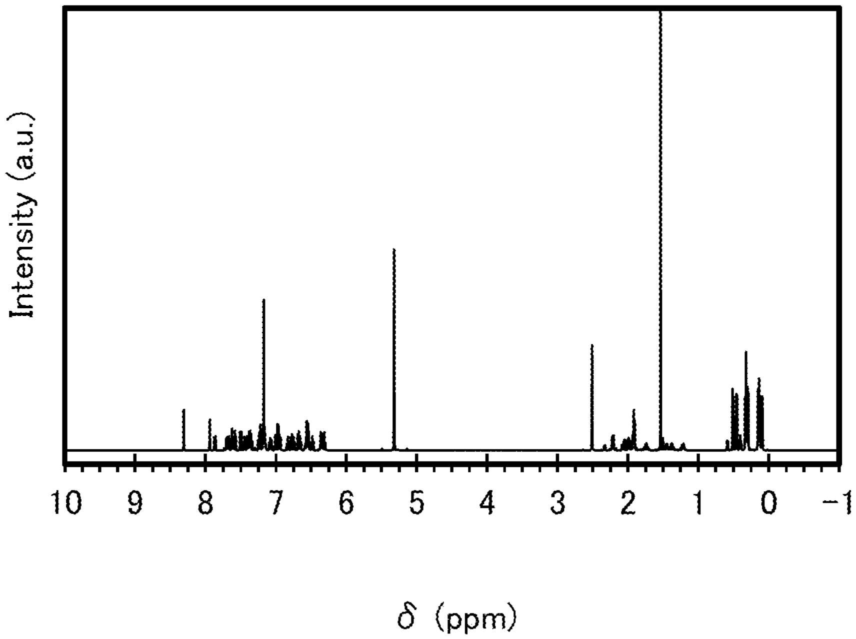
FIG. 14 is an NMR chart of a compound in Example.

The obtained yellow solid was subjected to $^1$H-NMR measurement. The obtained values are shown below. FIG. 14 shows the $^1$H-NMR chart. It was found from FIG. 14 that [Ir(pni-diBup)$_2$(mdppy)] which is the organometallic complex of one embodiment of the present invention was obtained.

$^1$H-NMR. δ ($CD_2Cl_2$): 0.09-0.15 (m, 9H), 0.29-0.34 (m, 9H), 0.40 (t, 1H), 0.45 (d, 3H), 0.51 (d, 3H), 1.18-1.24 (m, 1H), 1.34-1.49 (m, 1H), 1.70-1.78 (m, 1H), 1.88-2.09 (m, 6H), 2.17-2.25 (m, 2H), 2.51 (s, 3H), 6.30-6.40 (m, 3H), 6.48 (t, 1H), 6.61-6.52 (m, 3H), 6.64-6.69 (m, 2H), 6.74-6.79 (m, 2H), 6.83 (t, 1H), 6.93-7.01 (m, 3H), 7.08 (t, 1H), 7.13-7.25 (m, 8H), 7.34-7.51 (m, 6H), 7.57-7.73 (m, 4H), 7.87 (d, 1H), 7.94 (s, 1H), 8.31 (s, 1H).

Figure 15:
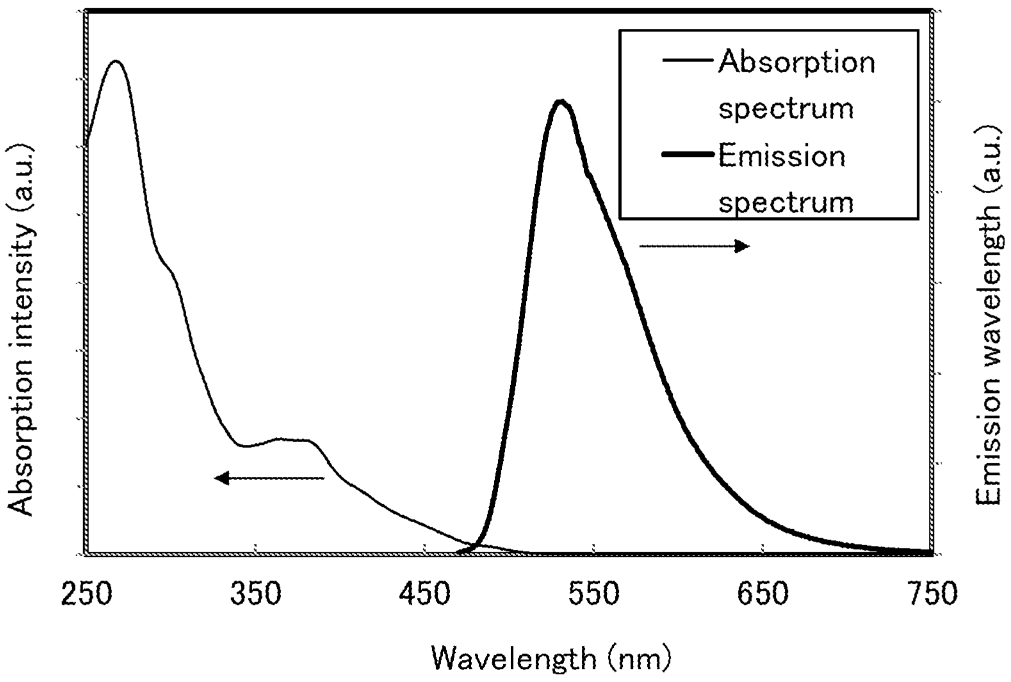
FIG. 15 is a diagram showing an absorption spectrum and an emission spectrum of a compound in Example.

Next, an absorption spectrum, an emission spectrum, and an emission quantum yield of a deoxidized dichloromethane solution of [Ir(pni-diBup)$_2$(mdppy)] (0.0073 mmol/L) were measured. The measurements were performed in manners similar to those in Example 1. FIG. 15 shows measurement results of the absorption spectrum and the emission spectrum.

As shown in FIG. 15, the iridium complex [Ir(pni-diBup)$_2$(mdppy)] had an emission peak at 530 nm, and green light emission from the deoxidized dichloromethane solution was observed.

Furthermore, when the emission quantum yield at an excitation wavelength of 450 nm in the deoxidized dichloromethane solution (0.0073 mmol/L) was measured, the emission quantum yield was found to be as extremely high as 98%.

Example 3

In this example, a synthesis method of tris{2-[1-(4-cyano-2-isobutylphenyl)-1H-naphtho[1,2-d]imidazol-2-yl-κN$^3$]phenyl-κC}iridium(III) (abbreviation: [Ir(pni-iBuCNp)$_3$]) which is the organometallic complex of one embodiment of the present invention represented by Structure Formula (102) in Embodiment 1 is described.

Step 1; Synthesis of 4-amino-3-isobutylbenzonitrile

Into a 5000 mL three-neck flask were put 75 g (492 mmol) of 4-amino-3-chlorobenzonitrile, 90 g (886 mmol) of isobutylboronic acid, 188 g (886 mmol) of tripotassium phosphate, 4.0 g (9.8 mmol) of 2-dicyclohexylphosphino-2',6'-dimethoxybiphenyl (S-phos), and 2400 mL of toluene, the atmosphere in the flask was replaced with nitrogen, and the mixture was degassed by being stirred while the pressure in the flask was reduced. After the degassing, 4.5 g (4.9 mmol) of tris(dibenzylideneacetone)dipalladium(0) was added, and the mixture was stirred under a nitrogen stream at 120° C. for 20 hours. After a predetermined time elapsed, the obtained reaction solution was subjected to suction filtration. The obtained filtrate was purified by extraction with toluene. Then, purification by silica column chromatography was performed. Toluene was used as the developing solvent. The obtained fraction was concentrated, so that 59 g of a target brown oily substance was obtained in a yield of 69%. The synthesis scheme of Step 1 is shown in (C-1) below.

[Chemical Formula 59]

(C-1)

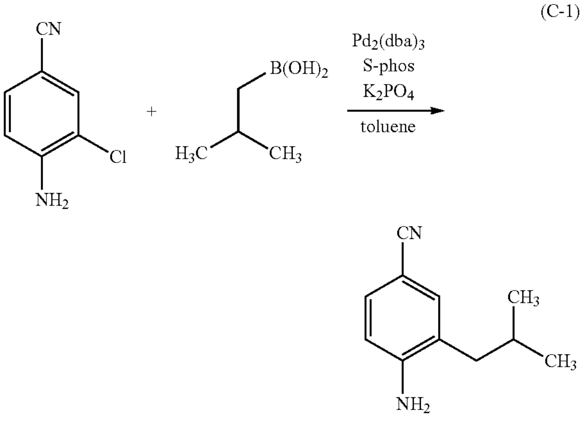

Step 2; Synthesis of 3-isobutyl-4-[N-(2-nitronaphthyl)amino]benzonitrile

Into a 2000 mL three-neck flask were put 30 g (170 mmol) of 4-amino-3-isobutylbenzonitrile synthesized in Step 1, 45 g (141 mmol) of 2-nitronaphthalene-1-trifluoromethanesulfonate, 78 g (240 mmol) of cesium carbonate, and 750 mL of toluene, the atmosphere in the flask was replaced with nitrogen, and the mixture was degassed by being stirred while the pressure in the flask was reduced. After the degassing, 4.6 g (11 mmol) of 2-dicyclohexylphosphino-2',6'-dimethoxybiphenyl (S-phos) and 2.6 g (2.8 mmol) of tris(dibenzylideneacetone)dipalladium(0) were added, and the mixture was stirred under a nitrogen stream at 130° C. for 24 hours. After a predetermined time elapsed, the obtained reaction mixture was purified by extraction with toluene. Then, purification by silica column chromatography was performed. A developing solvent of hexane: ethyl acetate=10:1 was used. The obtained fraction was concentrated, so that 40 g of a target yellow oily substance was obtained in a yield of 82%. The synthesis scheme of Step 2 is shown in (C-2) below.

[Chemical Formula 60]

(C-2)

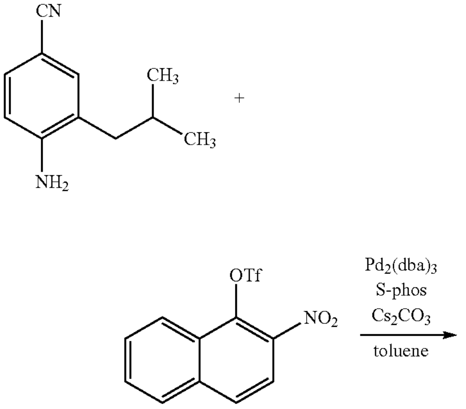

-continued

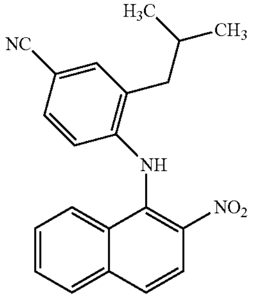

Step 3; Synthesis of 3-isobutyl-4-[N-(1,2-naphthalenediamine)]benzonitrile

Into a 3000 mL three-neck flask were put 40 g (115 mmol) of 3-isobutyl-4-[N-(2-nitronaphthyl)amino]benzonitrile synthesized in Step 2, 21 mL (1.2 mol) of water, and 1350 mL of ethanol, and the mixture was stirred. To this mixture was added 109 g (0.58 mol) of tin(II) chloride, and the mixture was stirred under a nitrogen stream at 80° C. for six hours. After a predetermined time elapsed, the obtained reaction mixture was poured into 500 mL of a 2M sodium hydroxide aqueous solution, and the solution was stirred at room temperature for two hours. A precipitated sediment was subjected to suction filtration, and washing with chloroform was performed, whereby a filtrate was obtained. The obtained filtrate was purified by extraction with chloroform. After that, hexane was added to the obtained solid, which was then subjected to suction filtration to give 32 g of a white solid in a yield of 88%. The synthesis scheme of Step 3 is shown in (C-3) below.

[Chemical Formula 61]

(C-3)

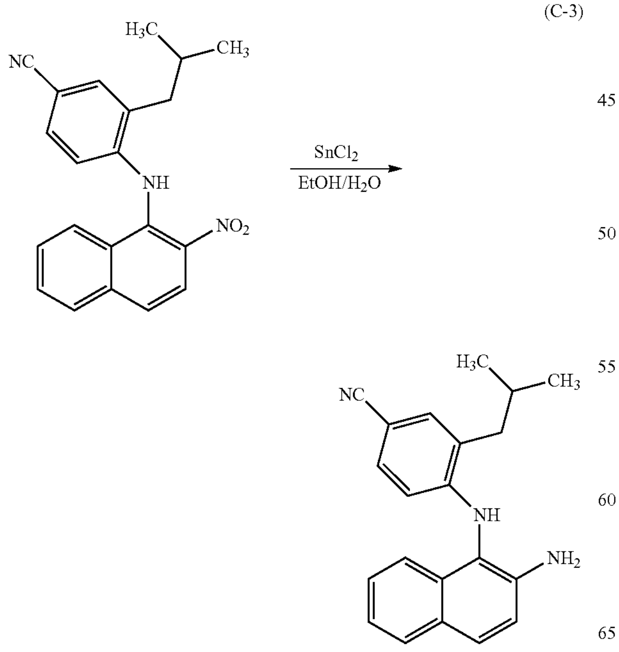

Step 4; Synthesis of 1-(4-cyano-2-isobutylphenyl)-2-phenyl-1H-naphtho[1,2-d]imidazole (Abbreviation: Hpni-iBuCNp)

Into a 1000 mL three-neck flask were put 32 g (101 mmol) of 3-isobutyl-4-[N-(1,2-naphthalenediamine)]benzonitrile synthesized in Step 3, 400 mL of acetonitrile, and 11 g (101 mmol) of benzaldehyde, and the mixture was stirred at 100° C. for six hours. To this mixture was added 0.16 g (1.0 mmol) of iron(III) chloride, and the mixture was stirred at 100° C. for 16 hours. After a predetermined time elapsed, the obtained reaction mixture was subjected to extraction with ethyl acetate. Then, the obtained solid was purified by silica column chromatography. As developing solvents, first, toluene was used, and then a mixed solvent of toluene:ethyl acetate=18:1 was used. The obtained fraction was concentrated to give a solid. Ethyl acetate was added to the obtained solid and suction filtration was performed, so that 14 g of a target white solid was obtained in a yield of 34%. The synthesis scheme of Step 4 is shown in (C-4) below.

[Chemical Formula 62]

(C-4)

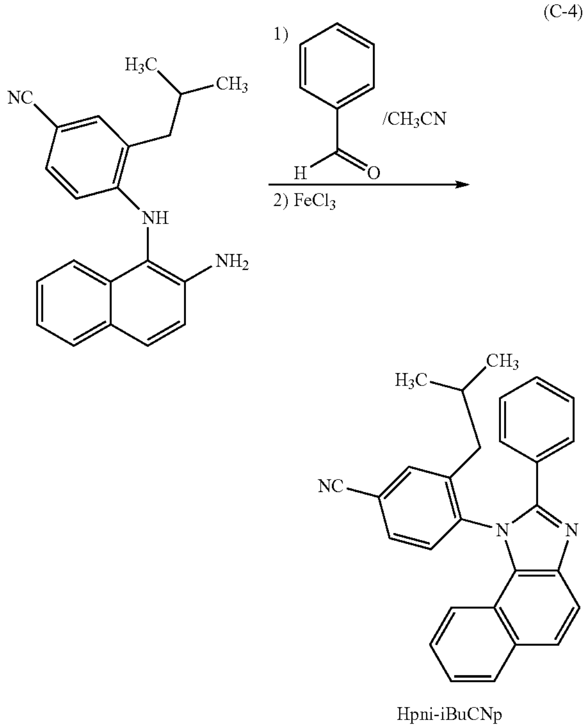

Hpni-iBuCNp

Step 5; Synthesis of tris{2-[1-(4-cyano-2-isobutylphenyl)-1H-naphtho[1,2-d]imidazol-2-yl-κ$N^3$]phenyl-κC}iridium(III) (Abbreviation: [Ir(pni-iBuCNp)$_3$])>

Into a reaction container with a three-way cock were put 3.8 g (9.5 mmol) of 1-(4-cyano-2-isobutylphenyl)-2-phenyl-1H-naphtho[1,2-d]imidazole synthesized by the method of Step 4 and 0.93 g (1.9 mmol) of tris(acetylacetonato)iridium (III), and the mixture was heated at 250° C. for 40 hours. Dichloromethane was added to the obtained reaction mixture, and an insoluble matter was removed. The obtained filtrate was concentrated to give a solid. The obtained solid was purified by silica column chromatography. Dichloromethane was used as the developing solvent. The obtained fraction was concentrated to give a solid. The obtained solid was recrystallized with ethyl acetate/hexane, so that 0.3 g of a yellow solid was obtained in a yield of 10%. The synthesis scheme is shown in (C-5) below.

[Chemical Formula 63]

(C-5)

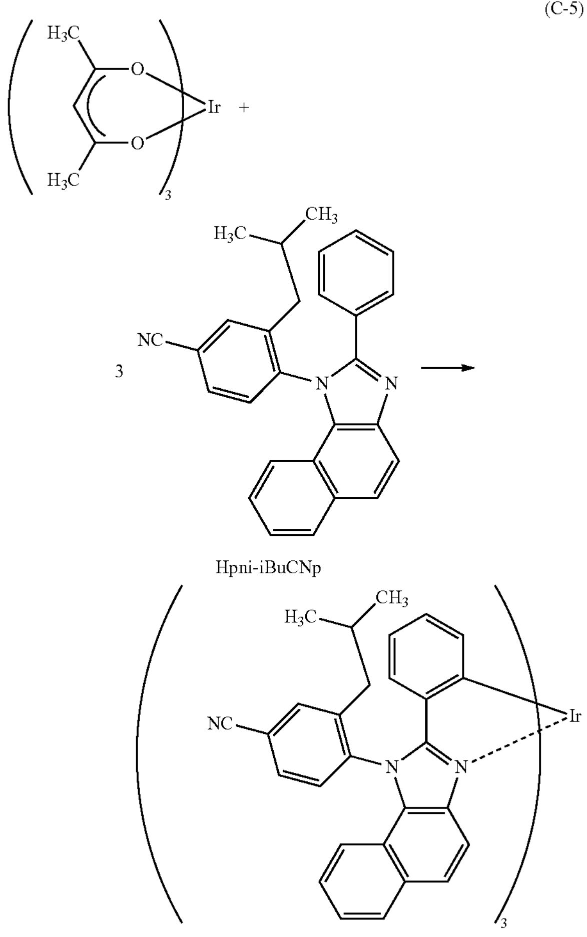

Hpni-iBuCNp

[Ir(pni-iBuCNp)$_3$]

The mass (MS) of the obtained yellow solid was measured. The ESI-MS measurement result of the obtained compound is shown below. ESI-MS [M+H$^+$]=1394.51 (Exact Mass=1393.51). This reveals that [Ir(pni-iBuCNp)$_3$] which is one embodiment of the organometallic complex of the present invention represented by Structure Formula (102) was obtained.

Figure 16:
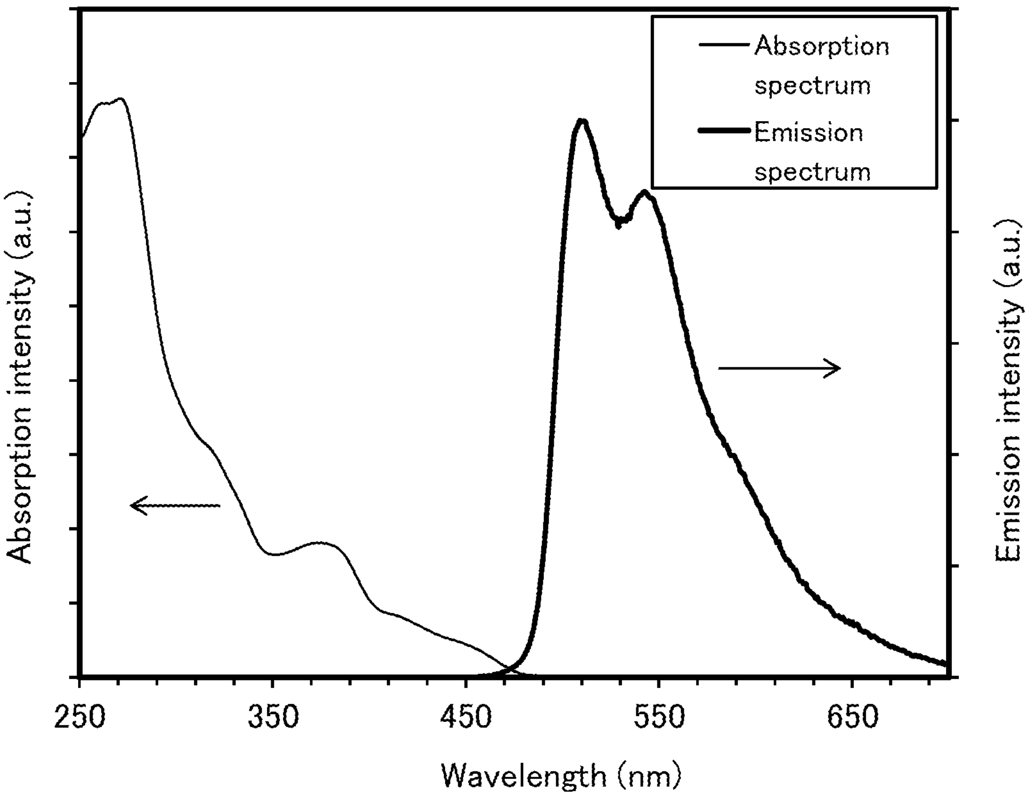
FIG. 16 is a diagram showing an absorption spectrum and an emission spectrum of a compound in Example.

Then, an absorption spectrum and an emission spectrum of a deoxidized dichloromethane solution of [Ir(pni-iBuCNp)$_3$] obtained above (0.013 mmol/L) were measured. The measurements were performed in manners similar to those in Example 1. FIG. 16 shows the absorption spectrum and the emission spectrum.

As shown in FIG. 16, the iridium complex [Ir(pni-iBuCNp)$_3$] had emission peaks at 509 nm and 544 nm, and green light emission from the deoxidized dichloromethane solution was observed.

Example 4

In this example, a synthesis method of tris{2-[1-(4-cyano-2,6-diisobutylphenyl)-1H-naphtho[1,2-d]imidazol-2-yl-κ N$^3$]phenyl-K C}iridium(III) (abbreviation: [Ir(pni-diBuCNp)$_3$]) which is the organometallic complex of one embodiment of the present invention represented by Structure Formula (103) in Embodiment 1 is described.

Step 1; Synthesis of 4-amino-3,5-diisobutylbenzonitrile

Into a 3000 mL three-neck reaction container were put 58 g (310 mmol) of 4-amino-3,5-diisobutylbenzonitrile, 117 g (1145 mmol) of isobutylboronic acid, 243 g (1145 mmol) of tripotassium phosphate, 6.4 g (15.5 mmol) of 2-dicyclohexylphosphino-2',6'-dimethoxybiphenyl (S-phos), and 1500 ml of toluene, the atmosphere in the flask was replaced with nitrogen, and the mixture was degassed by being stirred while the pressure in the flask was reduced. After the degassing, 5.7 g (6.2 mmol) of tris(dibenzylideneacetone) dipalladium(0) was added, and the mixture was stirred under a nitrogen stream at 130° C. for 12 hours. Toluene was added to the obtained reaction solution, and the mixture was subjected to suction filtration through Celite. The obtained filtrate was purified by extraction with toluene. After that, purification by silica column chromatography was performed. Toluene was used as the developing solvent. The obtained fraction was concentrated, so that 69 g of a target yellow oily substance was obtained in a yield of 96%. The synthesis scheme of Step 1 is shown in (D-1) below.

[Chemical Formula 64]

(D-1)

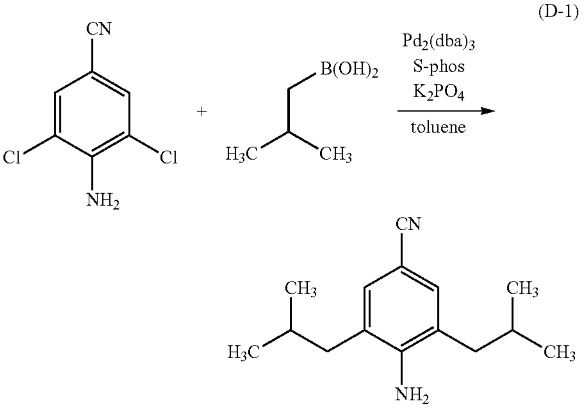

Step 2; Synthesis of 3,5-diisobutyl-4-[N-(2-nitronaphthyl)amino]benzonitrile

Into a 2000 mL three-neck flask were put 28 g (121 mmol) of 4-amino-3,5-diisobutylbenzonitrile synthesized in Step 1, 39 g (121 mmol) of 2-nitronaphthalene-1-trifluoromethanesulfonate, 67 g (205 mmol) of cesium carbonate, and 750 mL of toluene, the atmosphere in the flask was replaced with nitrogen, and the mixture was degassed by being stirred while the pressure in the flask was reduced. After the degassing, 4.0 g (9.7 mmol) of 2-dicyclohexylphosphino-2',6'-dimethoxybiphenyl (S-phos) and 2.2 g (2.4 mmol) of tris(dibenzylideneacetone)dipalladium(0) were added, and the mixture was stirred under a nitrogen stream at 130° C. for 40 hours. After a predetermined time elapsed, the obtained reaction mixture was purified by extraction with toluene. Then, purification by silica column chromatography was performed. A developing solvent of hexane: ethyl acetate=10:1 was used. The obtained fraction was concentrated, so that 4.5 g of a target orange solid was obtained in a yield of 9%. The synthesis Scheme of Step 2 is shown in (D-2) below.

[Chemical Formula 65]

(D-2)

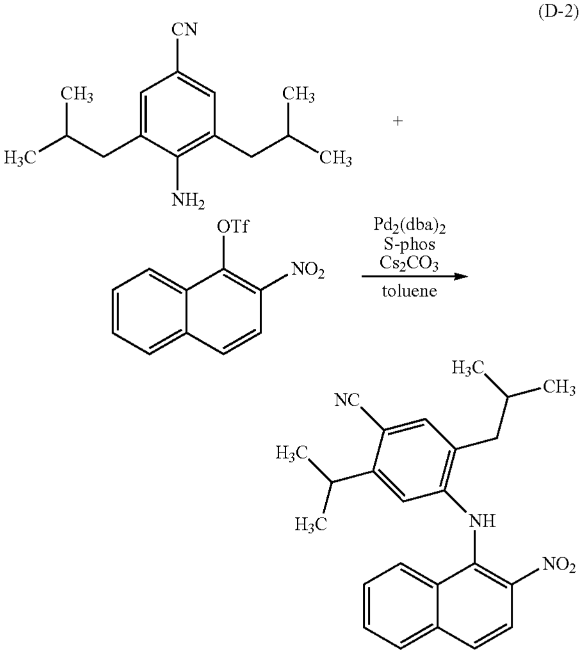

Step 3; Synthesis of 3,5-diisobutyl-4-[N-(1,2-naphthalenediamine)]benzonitrile

Into a 500 mL three-neck flask were put 4.5 g (11 mmol) of 3,5-diisobutyl-4-[N-(2-nitronaphthyl)amino]benzonitrile synthesized in Step 2, 2 mL (110 mmol) of water, and 130 mL of ethanol, and the mixture was stirred. To this mixture was added 10.4 g (55 mmol) of tin(II) chloride, and the mixture was stirred under a nitrogen stream at 80° C. for 7.5 hours. After a predetermined time elapsed, the obtained reaction mixture was poured into 100 mL of a 2M sodium hydroxide aqueous solution, and the solution was stirred at room temperature for two hours. A precipitated sediment was subjected to suction filtration, and washing with chloroform was performed, whereby a filtrate was obtained. The obtained filtrate was subjected to extraction with chloroform. Then, the obtained extracted solution was concentrated, so that 4.1 g of a target black oily substance was obtained in a yield of 99%. The synthesis scheme of Step 3 is shown in (D-3) below.

[Chemical Formula 66]

(D-3)

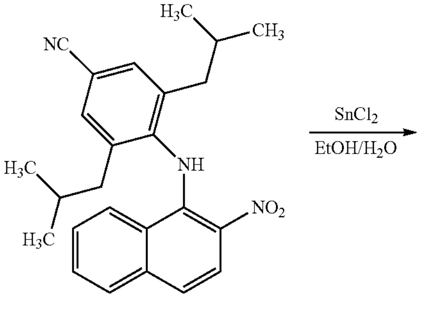

-continued

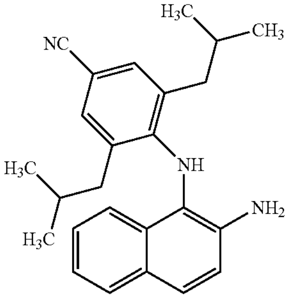

Step 4; Synthesis of 1-(4-cyano-2,6-diisobutylphenyl)-2-phenyl-1H-naphtho[1,2-d]imidazole (Abbreviation: Hpni-diBuCNp)

Into a 500 mL three-neck flask were put 4.2 g (11 mmol) of 3,5-diisobutyl-4-[N-(1,2-naphthalenediamine)]benzonitrile synthesized in Step 3, 50 mL of acetonitrile, and 1.2 g (11 mmol) of benzaldehyde, and the mixture was stirred at 100° C. for eight hours. To this mixture was added 18 mg (0.11 mmol) of iron(III) chloride, and the mixture was stirred at 100° C. for 29 hours. After a predetermined time elapsed, the obtained reaction mixture was purified by extraction with ethyl acetate. Then, the obtained solid was purified by silica column chromatography. As developing solvents, first, toluene was used, and then a mixed solvent of toluene:ethyl acetate=20:1 was used. The obtained fraction was concentrated, so that 2.9 g of a target black oily substance was obtained in a yield of 58%. The synthesis scheme of Step 4 is shown in (D-4) below.

[Chemical Formula 67]

(D-4)

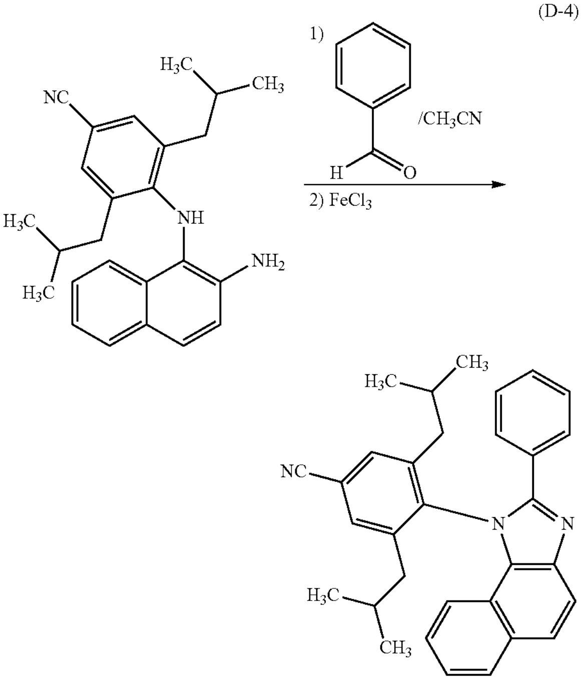

Hpni-iBuCNp

Step 5; Synthesis of tris{2-[1-(4-cyano-2,6-di-isobutylphenyl)-1H-naphtho[1,2-d]imidazol-2-yl-κ$N^3$]phenyl-κC}iridium(III) (Abbreviation: [Ir(pni-diBuCNp)$_3$])

Into a reaction container with a three-way cock were put 2.9 g (6.3 mmol) of 1-(4-cyano-2,6-diisobutylphenyl)-2-phenyl-1H-naphtho[1,2-d]imidazole synthesized by the method through Steps 1 to 4 and 0.62 g (1.3 mmol) of tris(acetylacetonato)iridium(III), and the mixture was heated at 250° C. for 56 hours. Toluene was added to the obtained reaction mixture and filtration was performed, so that an insoluble matter was removed. The obtained filtrate was concentrated to give a solid. The obtained solid was purified by silica column chromatography. Toluene was used as the developing solvent. The obtained fraction was concentrated to give a solid. The obtained solid was recrystallized with ethyl acetate/hexane, so that 0.33 g of a yellow solid was obtained in a yield of 16%. The synthesis scheme is shown in (D-5) below.

[Chemical Formula 68]

(D-5)

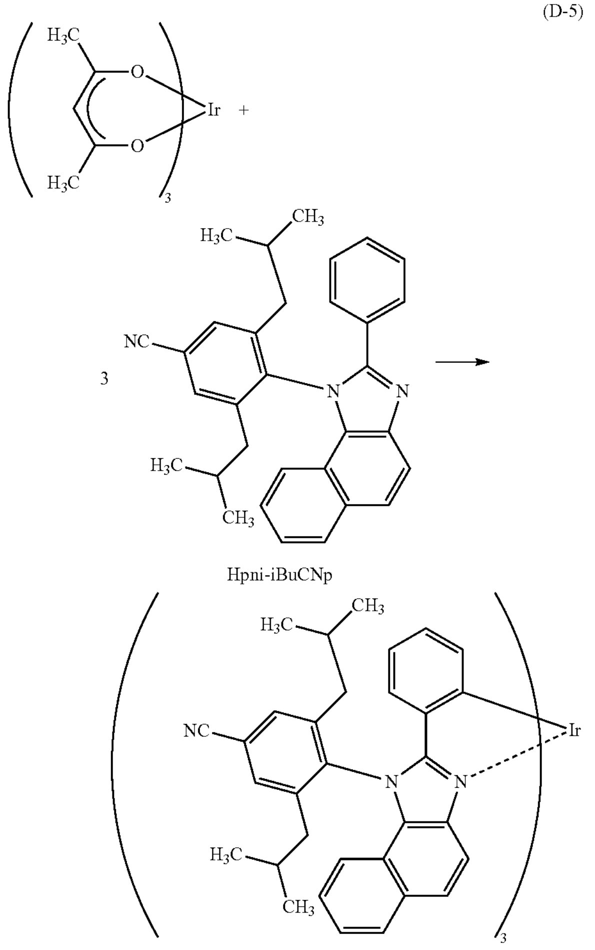

Hpni-iBuCNp

[Ir(pni-iBuCNp)3]

By a train sublimation method, 0.32 g of the obtained solid was sublimated and purified. In the purification by sublimation, the obtained solid was heated at 345° C. under a pressure of 2.5 Pa with an argon flow rate of 10.4 mL/min for 17 hours. After the purification by sublimation, 0.10 g was obtained at a collection rate of 31%.

Figure 17:
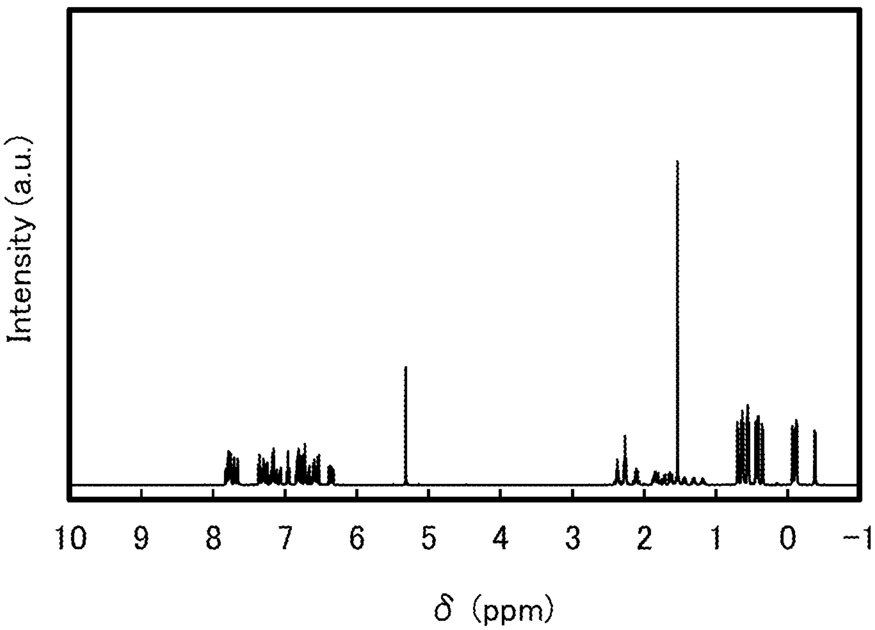
FIG. 17 is an NMR chart of a compound in Example.

The obtained yellow solid was subjected to $^1$H-NMR measurement. The obtained values are shown below. FIG. 17 shows the $^1$H-NMR chart. It was found from FIG. 17 that [Ir(pni-diBuCNp)$_3$] which is the organometallic complex of one embodiment of the present invention was obtained.

$^1$H-NMR. δ (ppm from $CH_2Cl_2$), ($CD_2Cl_2$): −0.38 (d, 3H), −0.13--0.06 (m, 9H), 0.35 (d, 3H), 0.41-0.45 (m, 6H), 0.54-0.57 (m, 6H), 0.62-0.65 (m, 6H), 0.70 (d, 3H), 1.14-1.23 (m, 1H), 1.27-1.35 (m, 1H), 1.40-1.49 (m, 1H), 1.50-1.57 (m, 1H), 1.60-1.66 (m, 2H), 1.71-1.90 (m, 4H), 2.06-2.15 (m, 2H), 2.22-2.31 (m, 4H), 2.33-2.42 (t, 2H), 6.32-6.39 (m, 3H), 6.53-6.85 (m, 12H), 6.96 (t, 2H), 7.06 (d, 1H), 7.10-7.37 (m, 9H), 7.66-7.83 (m, 9H).

Figure 18:
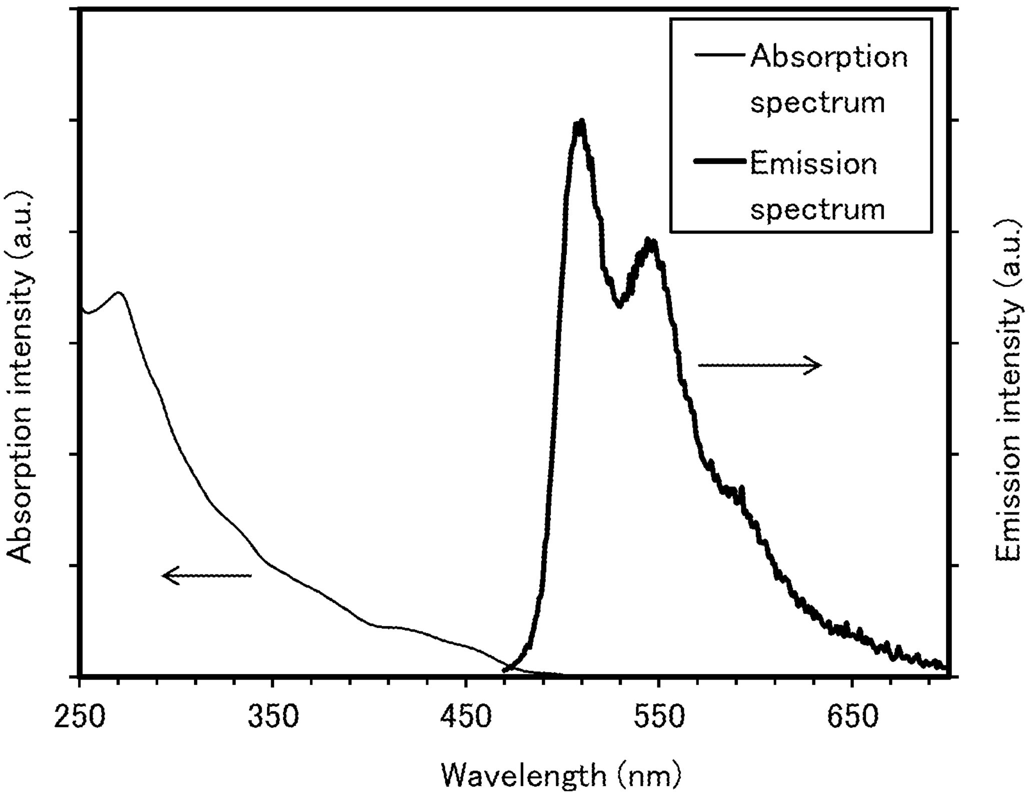
FIG. 18 is a diagram showing an absorption spectrum and an emission spectrum of a compound in Example.

Next, an absorption spectrum, an emission spectrum, and an emission quantum yield of a deoxidized dichloromethane solution of [Ir(pni-diBuCNp)$_3$] (0.0084 mmol/L) were measured. FIG. 18 shows measurement results of the absorption spectrum and the emission spectrum.

As shown in FIG. 18, the iridium complex [Ir(pni-di-BuCNp)$_3$] had emission peaks at 510 nm and 547 nm, and green light emission from the deoxidized dichloromethane solution was observed.

Furthermore, when the emission quantum yield at an excitation wavelength of 450 nm in the deoxidized dichloromethane solution (0.0084 mmol/L) was measured, the emission quantum yield was found to be as extremely high as 91%.

Example 5

Emission quantum yields of [Ir(pni-diBup)$_3$], [Ir(pni-diBup)$_2$(mdppy)], and [Ir(pni-diBuCNp)$_3$] synthesized as described above were measured. In addition, an emission quantum yield of a comparative substance (OC-6-22)-tris{2-[1-(2,6-diisobutylphenyl)-1H-benzimidazol-2-yl-κ$N^3$]phenyl-κC}iridium(III) (abbreviation:fac-[Ir(pbi-diBup)$_3$]) was also measured. The measurement was performed in a manner similar to that described in Example 1. The results are shown in Table 1.

TABLE 1

| Material name | Quantum yield (%) |
|---|---|
| fac-[Ir(pbi-diBup)$_3$] | 88 |
| [Ir(pni-diBup)$_3$] | 98 |
| [Ir(pni-diBup)$_2$(mdppy)] | 98 |
| [Ir(pni-diBuCNp)$_3$] | 91 |

The difference in the structure between [Ir(pni-diBup)$_3$] which is the organometallic complex of one embodiment of the present invention and fac-[Ir(pbi-diBup)$_3$] is whether a benzene ring fused to the g-position of a benzimidazole skeleton is included or not. As shown in Table 1, the organometallic complexes of embodiments of the present invention have higher emission quantum yields. In addition, it was found that the organometallic complexes each including a 1H-naphtho[1,2-d]imidazole skeleton as a ligand each had an extremely high emission quantum yield exceeding 90%.

Example 6

This example will describe fabrication examples of a light-emitting device including the organic compound of one embodiment of the present invention and comparative light-emitting devices and the characteristics of the light-emitting devices. FIG. 1(A) illustrates a stacked-layer structure of the light-emitting devices fabricated in this example. Table 2 shows the details of the device structures. Organic compounds used in this example are shown below. Note that other embodiments or examples can be referred to for other organic compounds.
[Chemical Formula 69]
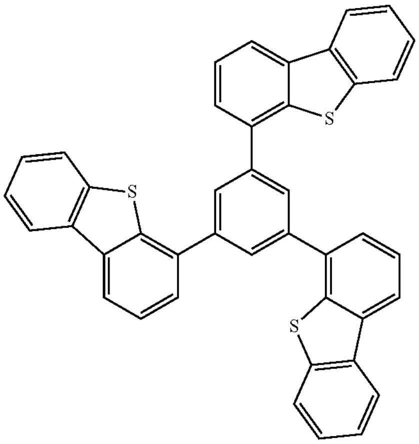
DBT3P-II
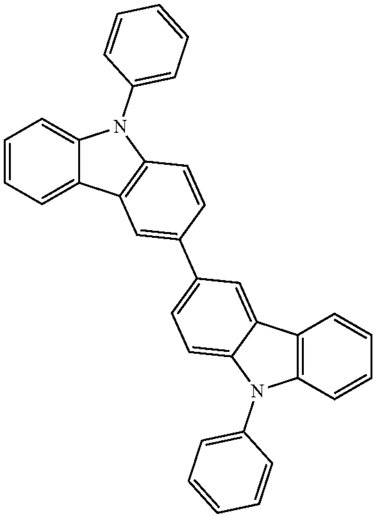
PCCP
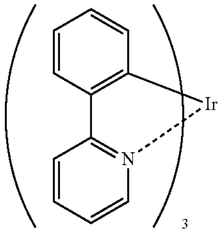
[Ir(ppy)3]
-continued
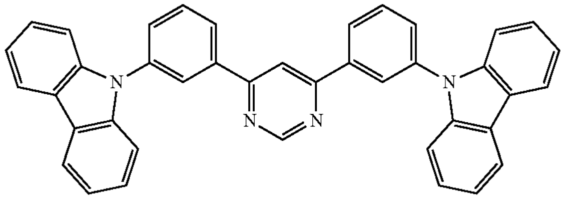
4,6mCzP2Pm
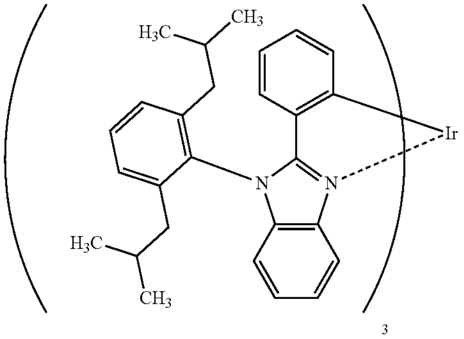
[Ir(pbi-diBup)3]
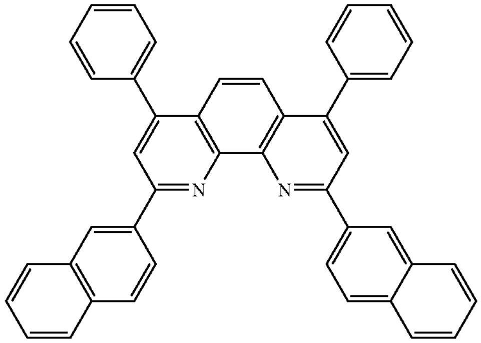
NBPhen

TABLE 2

| | Layer | Reference numeral | Thickness (nm) | Material | Weight ratio |
|---|---|---|---|---|---|
| Comparative light-emitting device 1 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 140 | 40 | 4,6mCzP2Pm:PCCP:[Ir(ppy)$_3$] | 0.6:0.4:0.1 |
| | Hole-transport layer | 112 | 20 | PCCP | — |
| | Hole-injection layer | 111 | 40 | DBT3P-II:$MoO_3$ | 1:0.5 |
| | Electrode | 101 | 70 | ITSO | — |
| Comparative light-emitting device 2 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 140 | 40 | 4,6mCzP2Pm:PCCP:GD270 | 0.6:0.4:0.1 |
| | Hole-transport layer | 112 | 20 | PCCP | — |
| | Hole-injection layer | 111 | 40 | DBT3P-II:$MoO_3$ | 1:0.5 |
| | Electrode | 101 | 70 | ITSO | — |
| Comparative light-emitting device 3 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 140 | 40 | 4,6mCzP2Pm:PCCP:fac-[Ir(pbi-diBup)$_3$] | 0.6:0.4:0.1 |
| | Hole-transport layer | 112 | 20 | PCCP | — |
| | Hole-injection layer | 111 | 40 | DBT3P-II:$MoO_3$ | 1:0.5 |
| | Electrode | 101 | 70 | ITSO | — |
| Light-emitting device 4 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 140 | 40 | 4,6mCzP2Pm:PCCP:[Ir(pni-diBup)$_3$] | 0.6:0.4:0.1 |
| | Hole-transport layer | 112 | 20 | PCCP | — |
| | Hole-injection layer | 111 | 40 | DBT3P-II:$MoO_3$ | 1:0.5 |
| | Electrode | 101 | 70 | ITSO | — |

<<Fabrication of Comparative Light-Emitting Device 1>>

As the electrode 101, an JTSO film was formed to a thickness of 70 nm over a glass substrate by a sputtering method. Note that the electrode area of the electrode 101 was set to 4 $mm^2$ (2 mm×2 mm). Next, as pretreatment for forming a light-emitting device over the substrate, a surface of the substrate was washed with water, drying was performed at 200° C. for one hour, and then UV ozone treatment was performed for 370 seconds. After that, the substrate was transferred into a vacuum evaporation apparatus where the degree of vacuum was kept at approximately $1\times10^{-4}$ Pa, and baking was performed at 170° C. for 30 minutes. Then, the substrate was cooled down for approximately 30 minutes.

Next, as the hole-injection layer 111, DBT3P-II and molybdenum(VI) oxide ($MoO_3$) were deposited by co-evaporation over the electrode 101 to a thickness of 40 nm in a weight ratio (DBT3P-II:$MoO_3$) of 1:0.5.

Then, as the hole-transport layer 112, PCCP was deposited by evaporation over the hole-injection layer 111 to a thickness of 20 nm.

Next, as the light-emitting layer 140, 4,6mCzP2Pm, PCCP, and [Ir(ppy)$_3$] were deposited by co-evaporation over the hole-transport layer 112 to a thickness of 40 nm in a weight ratio (4,6mCzP2Pm:PCCP:[Ir(ppy)$_3$]) of 0.6:0.4:0.1. Note that in the light-emitting layers 140, [Ir(ppy)$_3$] is a guest material that emits phosphorescence.

Next, as an electron-transport layer 118(1), 4,6mCzP2Pm was deposited by evaporation over the light-emitting layer 140 to a thickness of 20 nm. Then, as an electron-transport layer 118(2), NBPhen was sequentially deposited by evaporation over the electron-transport layer 118(1) to a thickness of 10 nm.

Next, as the electron-injection layer 119, LiF was deposited by evaporation over the electron-transport layer 118 to a thickness of 1 nm.

Next, as the electrode 102, aluminum (Al) was formed over the electron-injection layer 119 to a thickness of 200 nm.

Next, in a glove box containing a nitrogen atmosphere, the substrate over which the light-emitting device was formed was fixed to a substrate (a counter substrate) that differs from the substrate over which the light-emitting device was formed for sealing with a sealant, whereby a comparative light-emitting device 1 was sealed. Specifically, a drying agent was attached to the counter substrate, and the counter substrate in which the sealant was applied to the surrounding of a portion where the light-emitting device was formed and the glass substrate over which the light-emitting device was formed were bonded to each other. Then, irradiation with ultraviolet light having a wavelength of 365 nm at 6 J/$cm^2$ and heat treatment at 80° C. for one hour were performed. Through the above steps, the comparative light-emitting device 1 was obtained.

<<Fabrication of Comparative Light-Emitting Device 2, Comparative Light-Emitting Device 3, and Light-Emitting Device 4>>

The fabrication processes of a comparative light-emitting device 2, a comparative light-emitting device 3, and a light-emitting device 4 are the same as the fabrication process of the comparative light-emitting device 1 described above, except for the fabrication step of the light-emitting layer 140. The device structures of the comparative light-emitting device 2, the comparative light-emitting device 3, and the light-emitting device 4 are as shown in Table 2; hence, the detailed description of the fabrication process is omitted. Note that the light-emitting layer 140 of each of the comparative light-emitting device 2, the comparative light-emitting device 3, and the light-emitting device 4 was deposited by a vacuum evaporation method like that of the comparative light-emitting device 1.

The device structures of the comparative light-emitting device 1 to the comparative light-emitting device 3 and the light-emitting device 4 are the same, except for a guest material used for the light-emitting layer 140. Note that [Ir(pni-diBup)$_3$] which is the organic compound of one embodiment of the present invention was used for the light-emitting device 4, and the comparative substance fac-[Ir(pbi-diBup)$_3$] was used for the comparative light-emitting device 3. [Ir(ppy)$_3$] and GD270 (manufactured by JiLin OLED Material Tech Co., Ltd.), which are widely used as guest materials, are used for the comparative light-emitting device 1 and the comparative light-emitting device 2, respectively.

<Characteristics of Light-Emitting Devices>

Next, the characteristics of the comparative light-emitting device 1 to the comparative light-emitting device 3 and the light-emitting device 4 fabricated above were measured. Luminance and CIE chromaticity were measured with a luminance colorimeter (BM-5A manufactured by TOPCON TECHNOHOUSE CORPORATION), and electroluminescence spectra were measured with a multi-channel spectrometer (PMA-11 manufactured by Hamamatsu Photonics K.K.).

Figure 19:
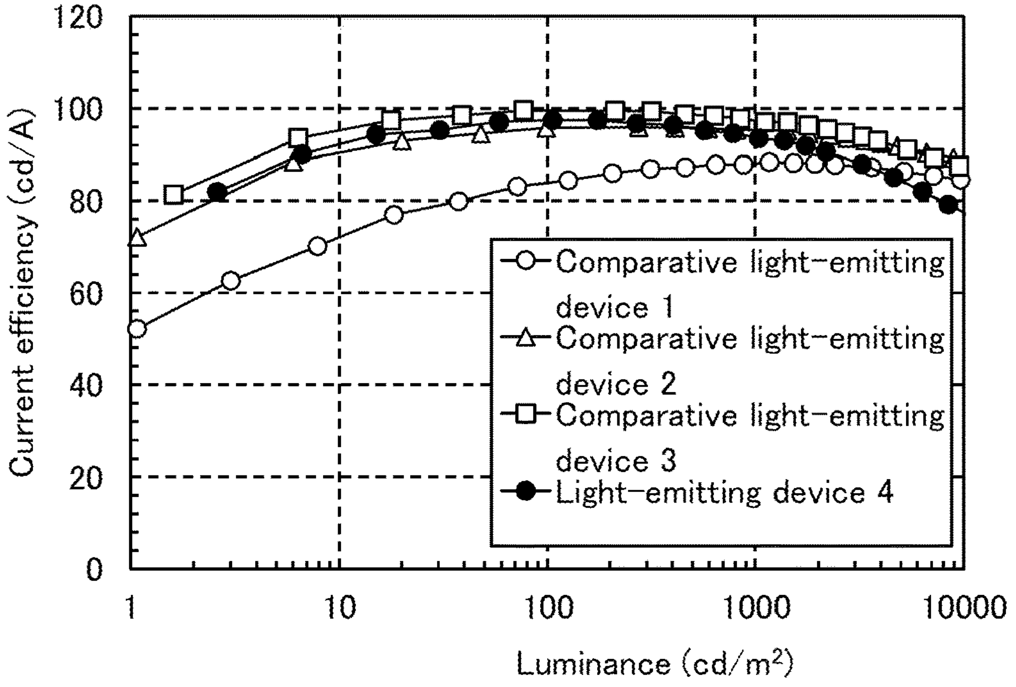
FIG. 19 is a diagram showing current efficiency-luminance characteristics of light-emitting devices in Example.
Figure 20:
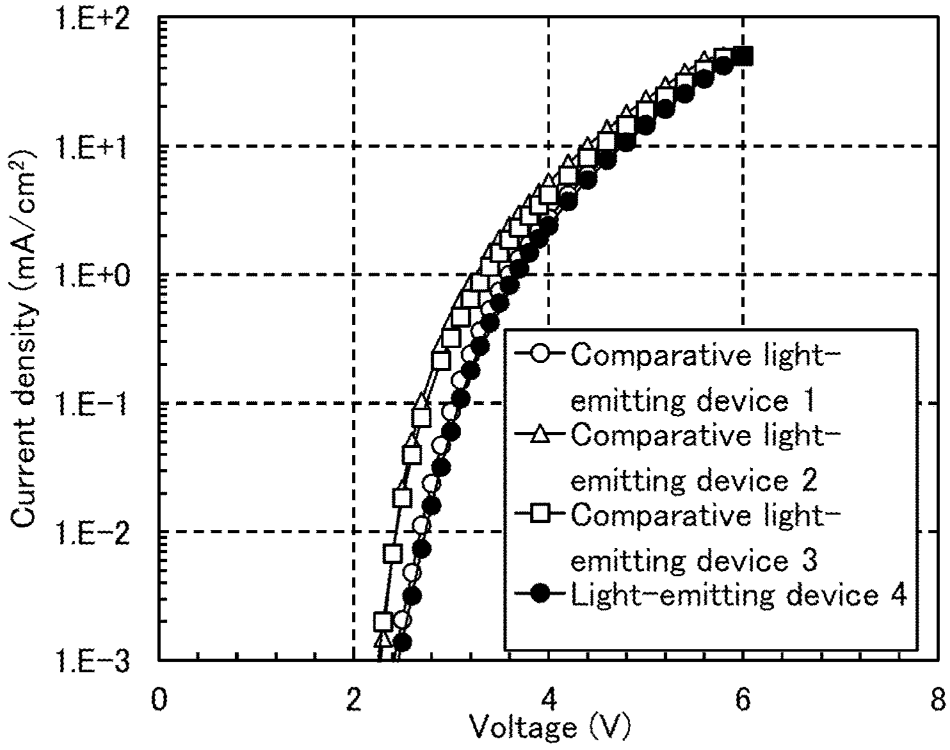
FIG. 20 is a diagram showing current density-voltage characteristics of light-emitting devices in Example.
Figure 21:
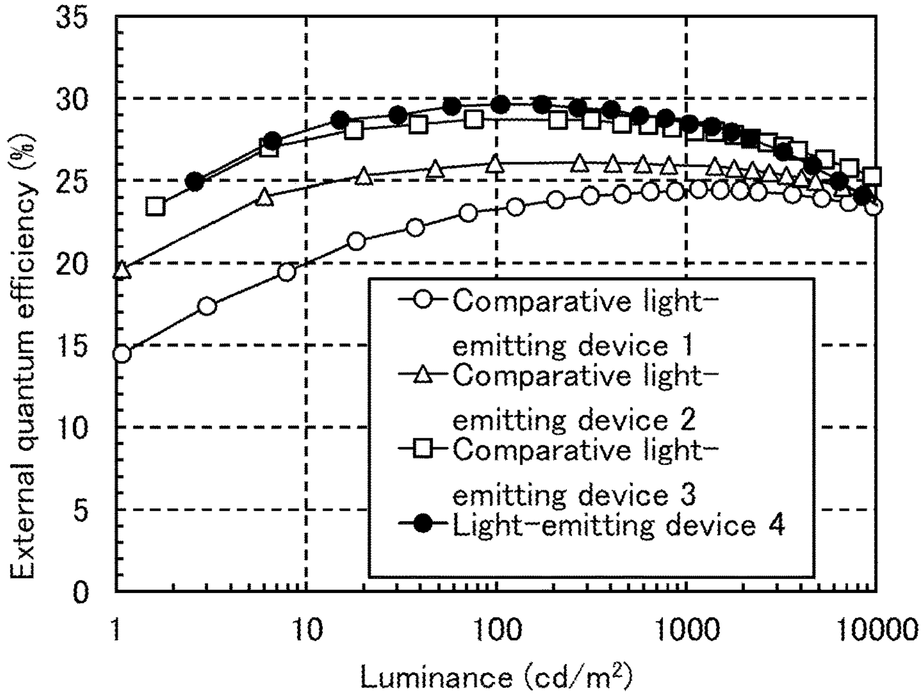
FIG. 21 is a diagram showing external quantum efficiency-luminance characteristics of light-emitting devices in Example.
Figure 22:
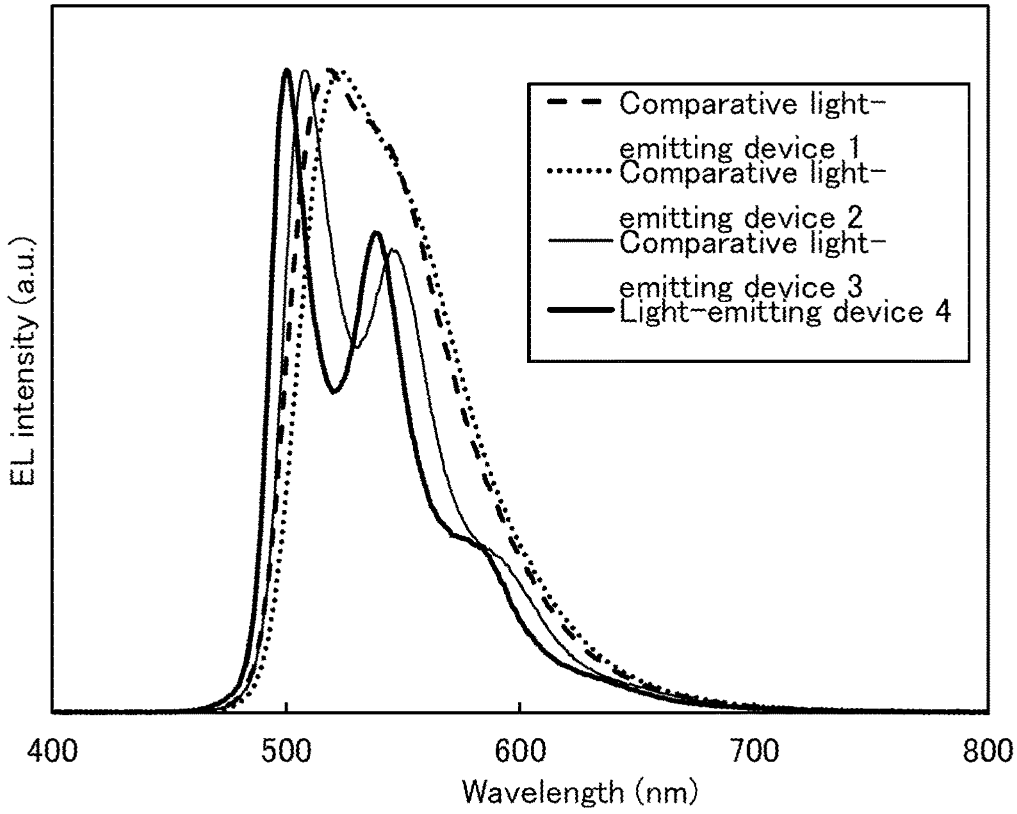
FIG. 22 is a diagram showing emission spectra of light-emitting devices in Example.

FIG. 19 shows current efficiency-luminance characteristics of the comparative light-emitting device 1 to the comparative light-emitting device 3 and the light-emitting device 4. FIG. 20 shows current density-voltage characteristics. FIG. 21 shows external quantum efficiency-luminance characteristics. Note that the measurement of the light-emitting devices was performed at room temperature (in an atmosphere maintained at 23° C.). FIG. 22 shows emission spectra of the comparative light-emitting device 1 to the comparative light-emitting device 3 and the light-emitting device 4 to which a current at a current density of 2.5 mA/cm$^2$ was supplied.

Table 3 shows the device characteristics of the comparative light-emitting device 1 to the comparative light-emitting device 3 and the light-emitting device 4 at around 1000 cd/m$^2$.

TABLE 3

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Comparative light-emitting device 1 | 3.60 | 1.00 | (0.324, 0.628) | 878.9 | 87.8 | 76.7 | 24.3 |
| Comparative light-emitting device 2 | 3.20 | 0.85 | (0.338, 0.626) | 813.7 | 95.3 | 93.6 | 25.9 |
| Comparative light-emitting device 3 | 3.40 | 1.15 | (0.309, 0.627) | 1112 | 97.0 | 89.6 | 28.0 |
| Light-emitting device 4 | 3.70 | 1.11 | (0.289, 0.616) | 1039 | 93.5 | 79.4 | 28.4 |

As shown in FIG. 22, the emission spectra of the comparative light-emitting device 1 to the comparative light-emitting device 3 and the light-emitting device 4 had emission peaks at around 518 nm, 523 nm, 508 nm, and 500 nm, respectively, and full widths at half maximum of approximately 74 nm, 73 nm, 63 nm, and 27 nm, respectively; accordingly, it was found that light emission derived from the guest material included in each of the comparative light-emitting device 1 to the comparative light-emitting device 3 and the light-emitting device 4 was obtained.

As shown in FIG. 19 and Table 3, each of the comparative light-emitting device 1 to the comparative light-emitting device 3 and the light-emitting device 4 exhibited high current efficiency. The light-emitting device 4 had its emission spectrum in a region with a lower luminosity factor (a shorter wavelength region) than the comparative light-emitting device 1 to the comparative light-emitting device 3, but had the current efficiency equivalent to those of the comparative light-emitting device 1 to the comparative light-emitting device 3. As shown in FIG. 21 and Table 3, it was found that the light-emitting device 4 had extremely high external quantum efficiency exceeding 25%. The light-emitting device 4 exhibited higher efficiency than the comparative light-emitting device 1 and the comparative light-emitting device 2 using [Ir(ppy)$_3$] and GD270 which are widely used as guest materials. It was also found that although the light-emitting device 4 exhibited light emission on a shorter wavelength side than the light-emitting device 3, the light-emitting device 4 had external quantum efficiency higher than or equal to that of the light-emitting device 3.

As shown in FIG. 20 and Table 3, it was found that the comparative light-emitting device 1 to the comparative light-emitting device 3 and the light-emitting device 4 each had favorable drive voltage characteristics.

Example 7

This example will describe a fabrication example of a light-emitting device that includes the organometallic complex of one embodiment of the present invention and is different from those in Example 6 and the characteristics of the light-emitting device. FIG. 1(A) illustrates a stacked-layer structure of the light-emitting device fabricated in this example. Table 4 shows the details of the device structure. Organic compounds used in this example are shown below. Note that other embodiments or examples can be referred to for other organic compounds.

[Chemical Formula 70]

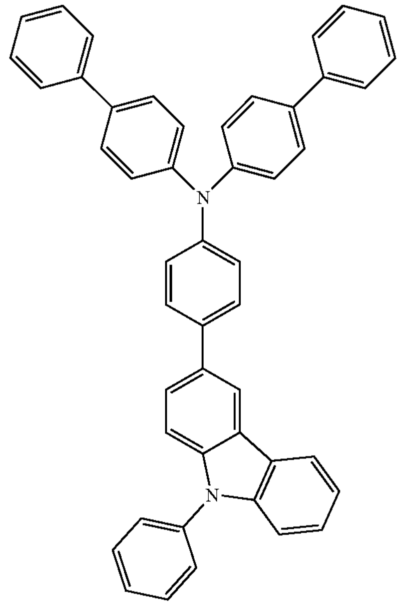

PCBBi1BP

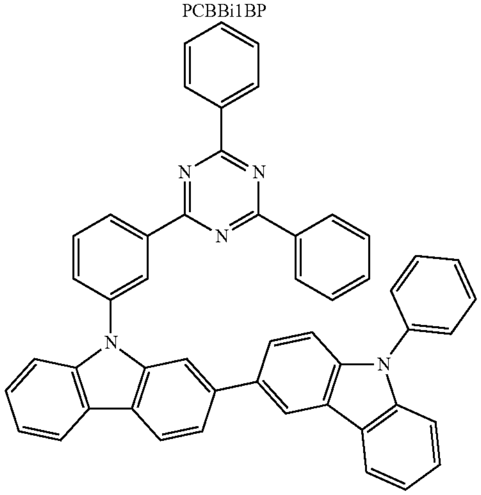

mPCCzPTzn-02

TABLE 4

| | Layer | Reference numeral | Thickness (nm) | Material | Weight ratio |
|---|---|---|---|---|---|
| Light-emitting device 5 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | mPCCzPTzn-02 | — |
| | Light-emitting layer | 140 | 40 | mPCCzPTzn-02:PCCP:[Ir(pni-diBup)$_2$(mdppy)] | 0.6:0.4:0.1 |
| | Hole-transport layer | 112 | 20 | PCBBi1BP | — |
| | Hole-injection layer | 111 | 40 | DBT3P-II:$MoO_3$ | 1:0.5 |
| | Electrode | 101 | 70 | ITSO | — |

<<Fabrication of Light-Emitting Device 5>>

In fabrication of a light-emitting device 5, deposition by vacuum evaporation was performed as in the above-described fabrication of the comparative light-emitting device 1 to the comparative light-emitting device 3 and the light-emitting device 4. The device structure of the light-emitting device 5 is as shown in Table 4; hence, the detailed description of the fabrication process is omitted. The light-emitting device 5 is a light-emitting device using a hetero-type organometallic complex (a metal complex having two or more kinds of ligands) of one embodiment of the present invention.

<Characteristics of Light-Emitting Device>

Next, the characteristics of the fabricated light-emitting device 5 were measured. The measurement conditions of the light-emitting device were similar to those in Example above.

Figure 23:
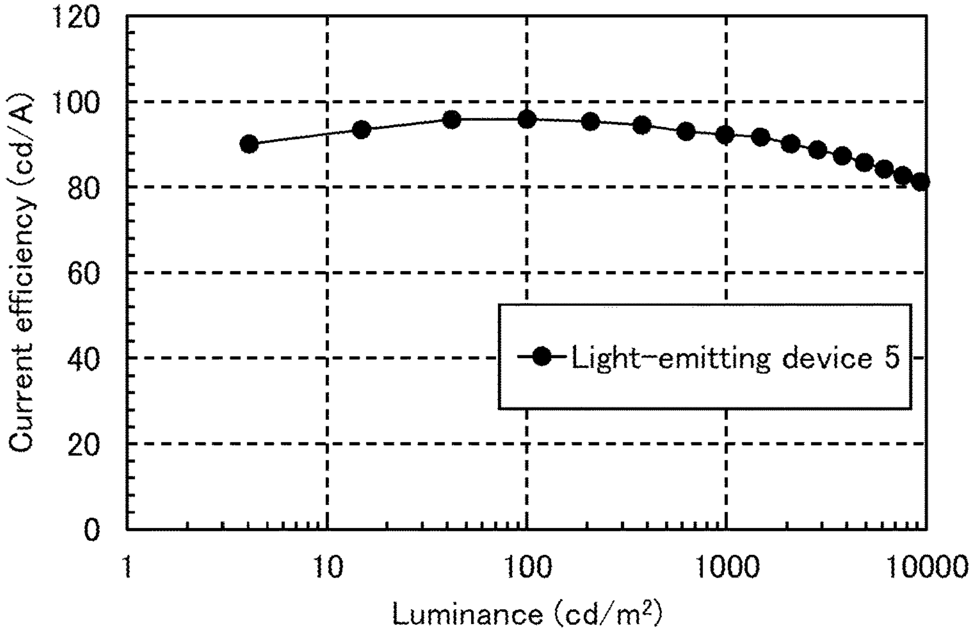
FIG. 23 is a diagram showing current efficiency-luminance characteristics of a light-emitting device in Example.
Figure 24:
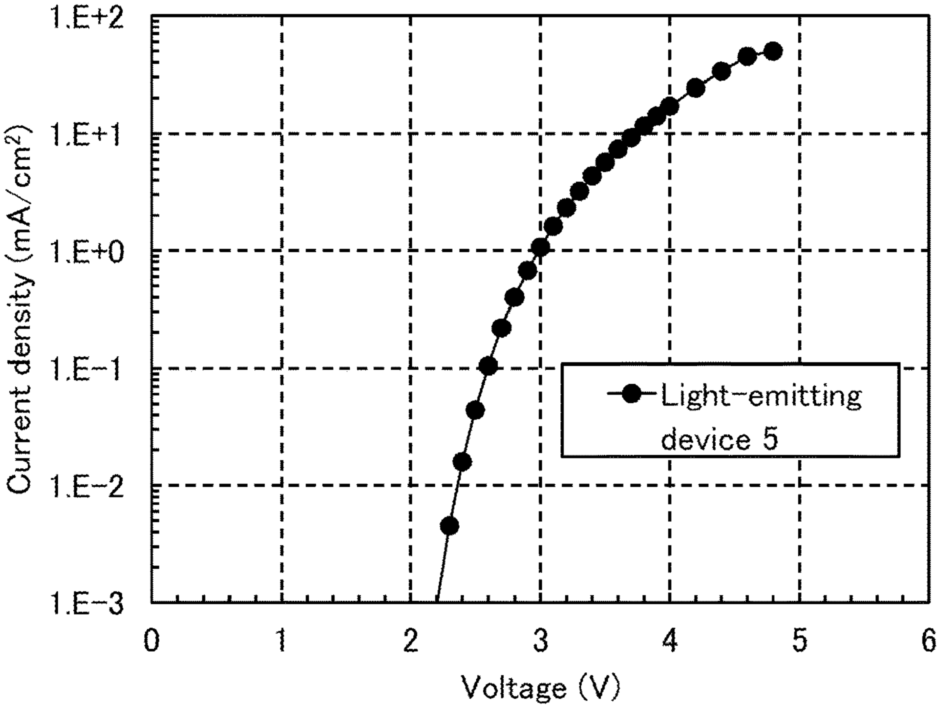
FIG. 24 is a diagram showing current density-voltage characteristics of a light-emitting device in Example.
Figure 25:
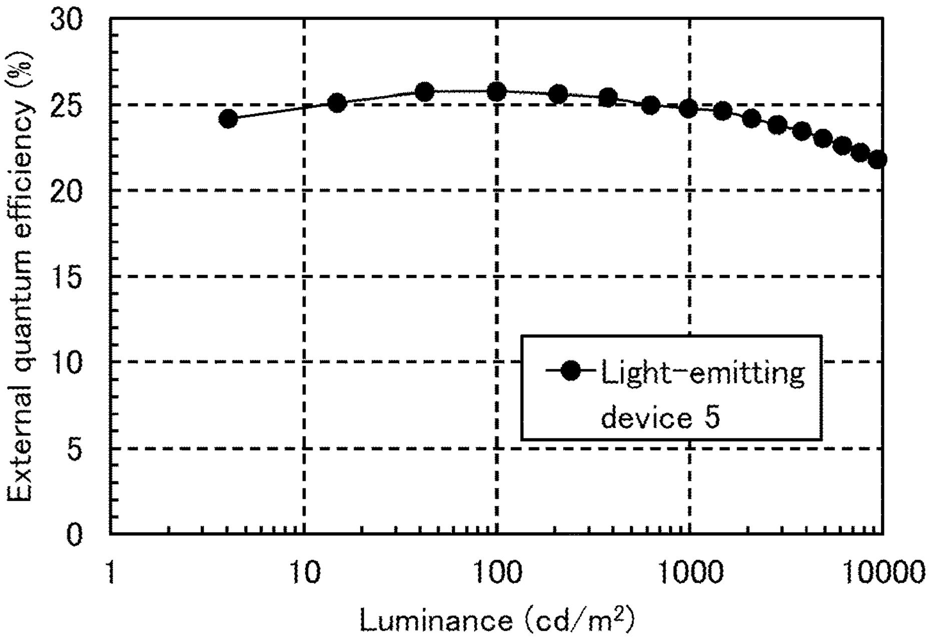
FIG. 25 is a diagram showing external quantum efficiency-luminance characteristics of a light-emitting device in Example.
Figure 26:
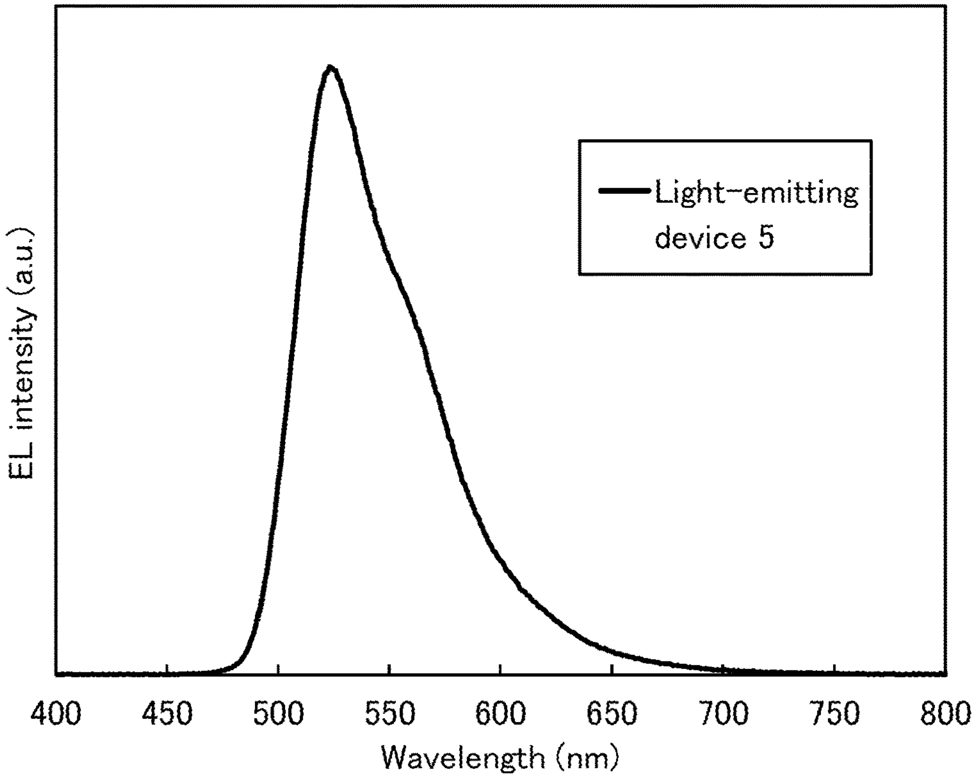
FIG. 26 is a diagram showing an emission spectrum of a light-emitting device in Example.

FIG. 23 shows current efficiency-luminance characteristics of the light-emitting device 5. FIG. 24 shows current density-voltage characteristics. FIG. 25 shows external quantum efficiency-luminance characteristics. FIG. 26 shows an emission spectrum of the light-emitting device 5 to which a current at a current density of 2.5 $mA/cm^2$ was supplied.

Table 5 shows the device characteristics of the light-emitting device 5 at around 1000 $cd/m^2$.

TABLE 5

| | Voltage (V) | Current density ($mA/cm^2$) | CIE chromaticity (x, y) | Luminance ($cd/m^2$) | Current efficiency (cd/A) | Power efficiency (lm/W) | External quantum efficiency (%) |
|---|---|---|---|---|---|---|---|
| Light-emitting device 5 | 3.00 | 1.07 | (0.320, 0.640) | 985 | 92.3 | 96.7 | 24.8 |

As shown in FIG. 26, the emission spectrum of the light-emitting device 5 had an emission peak at around 523 nm and full width at half maximum of approximately 63 nm; accordingly, it was found that the light-emitting device 5 emitted light derived from the guest material $[Ir(pni\text{-}diBup)_2(mdppy)]$.

As shown in FIG. 23, FIG. 25, and Table 5, the light-emitting device 5 exhibited high current efficiency and high external quantum efficiency. In particular, extremely high external quantum efficiency exceeding 25% was obtained.

As shown in FIG. 24 and Table 5, it was found that the light-emitting device 5 had favorable drive voltage characteristics. Exhibited light.

<Reliability of Light-Emitting Device>

Figure 27:
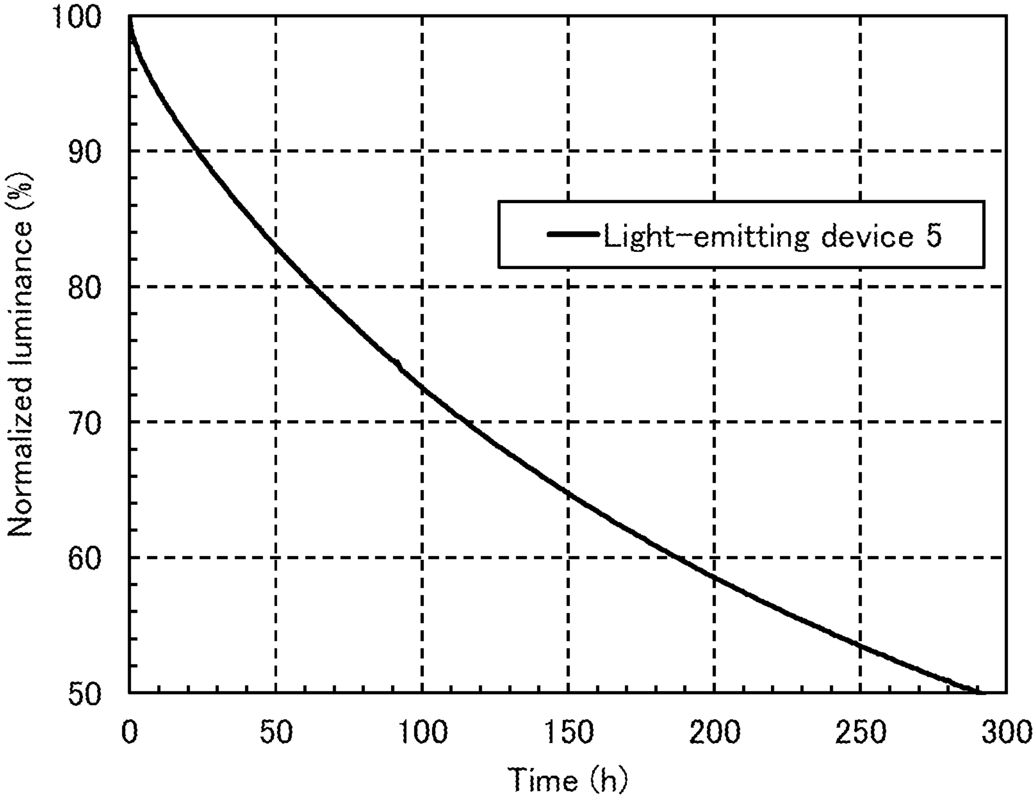
FIG. 27 is a diagram showing a result of a reliability test on a light-emitting device in Example.

Next, a driving test at a constant current of 2 mA was performed on the light-emitting device 5. FIG. 27 shows the result. It was found from FIG. 27 that $LT_{70}$ (time taken for 30% luminance reduction) of the light-emitting device 5 exceeded 100 hours, demonstrating high reliability.

Example 8

This example will describe a fabrication example of a light-emitting device that includes the organometallic complex of one embodiments of the present invention and is different from those in Example 6 and Example 7 and the characteristics of the light-emitting device. FIG. 1(A) illustrates a stacked-layer structure of the light-emitting device fabricated in this example. Table 6 shows the details of the device structure.

TABLE 6

| | Layer | Reference numeral | Thickness (nm) | Material | Weight ratio |
|---|---|---|---|---|---|
| Comparative light-emitting device 6 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 140 | 40 | mPCCzPTzn-02:PCCP:GD270 | 0.6:0.4:0.1 |
| | Hole-transport layer | 112 | 20 | PCBBi1BP | — |
| | Hole-injection layer | 111 | 40 | DBT3P-II:$MoO_3$ | 1:0.5 |
| | Electrode | 101 | 70 | ITSO | — |
| Light-emitting device 7 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 140 | 40 | mPCCzPTzn-02:PCCP:$[Ir(pni\text{-}diBuCNp)_3]$ | 0.6:0.4:0.1 |
| | Hole-transport layer | 112 | 20 | PCBBi1BP | — |
| | Hole-injection layer | 111 | 40 | DBT3P-II:$MoO_3$ | 1:0.5 |
| | Electrode | 101 | 70 | ITSO | — |

<<Fabrication of Comparative Light-Emitting Device 6 and Light-Emitting Device 7>>

In fabrication of a comparative light-emitting device 6 and a light-emitting device 7, deposition by vacuum evaporation was also performed as in the above-described fabrication of the light-emitting device 5. The device structures of the comparative light-emitting device 6 and the light-emitting device 7 are as shown in Table 6; hence, the detailed description of the fabrication process is omitted. The light-emitting device 7 is a light-emitting device using $[Ir(pni\text{-}difluCNp)_3]$ which is the organometallic complex of one embodiment of the present invention as a guest material. Note that the comparative light-emitting device 6 is a light-emitting device using GD270 as a guest material.

<Characteristics of Light-Emitting Devices>

Next, the characteristics of the fabricated comparative light-emitting device 6 and light-emitting device 7 were measured. The measurement conditions of the light-emitting devices were similar to those in Example above.

Figure 28:
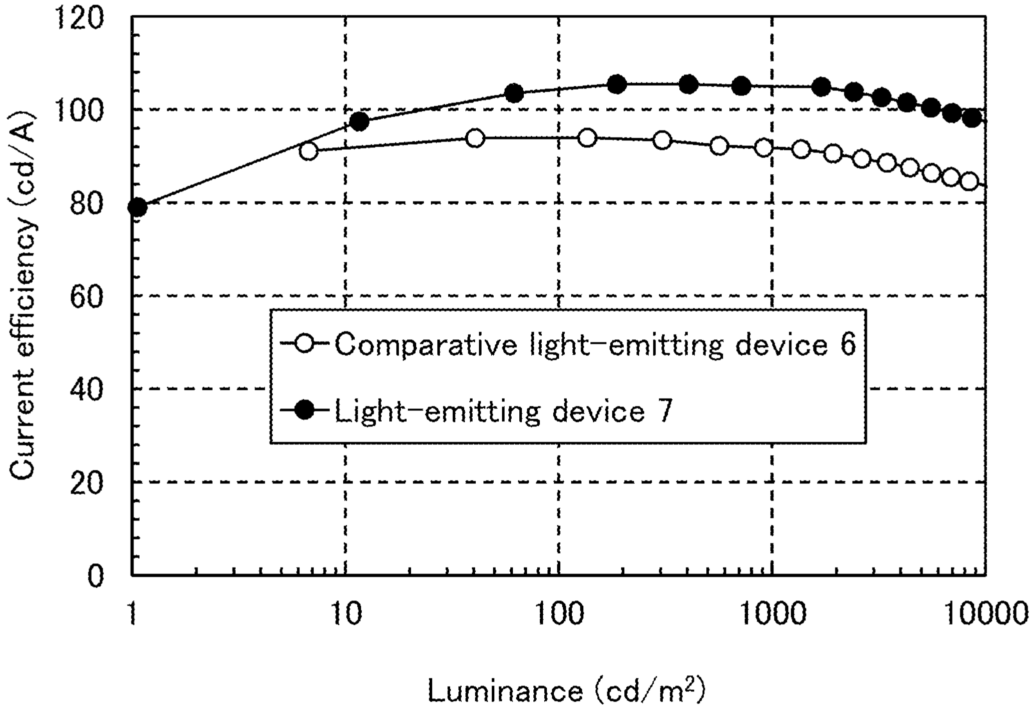
FIG. 28 is a diagram showing current efficiency-luminance characteristics of light-emitting devices in Example.
Figure 29:
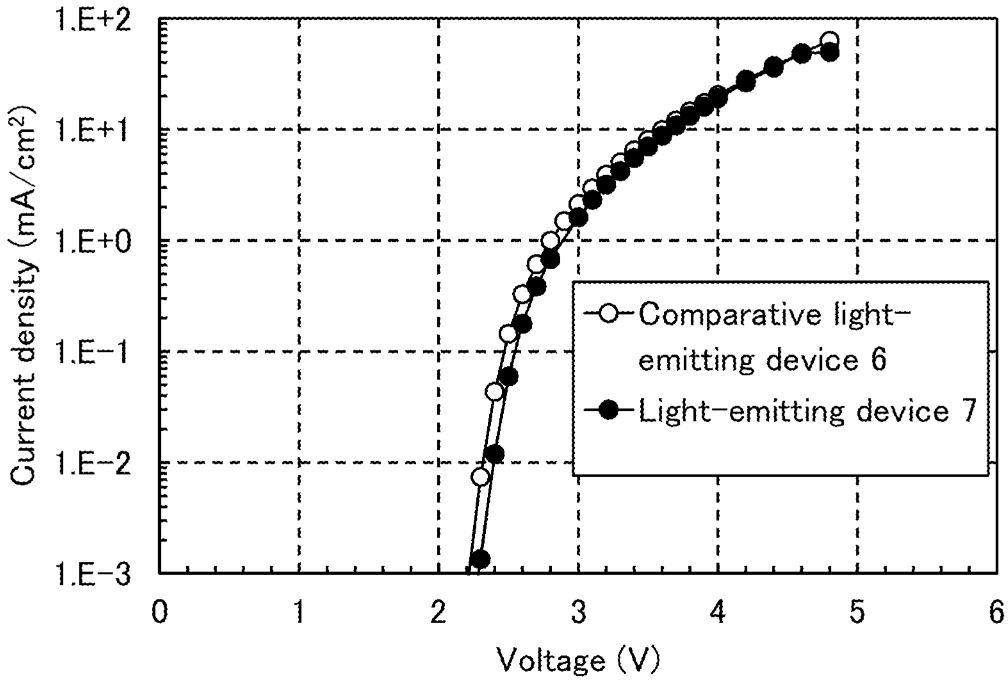
FIG. 29 is a diagram showing current density-voltage characteristics of light-emitting devices in Example.
Figure 30:
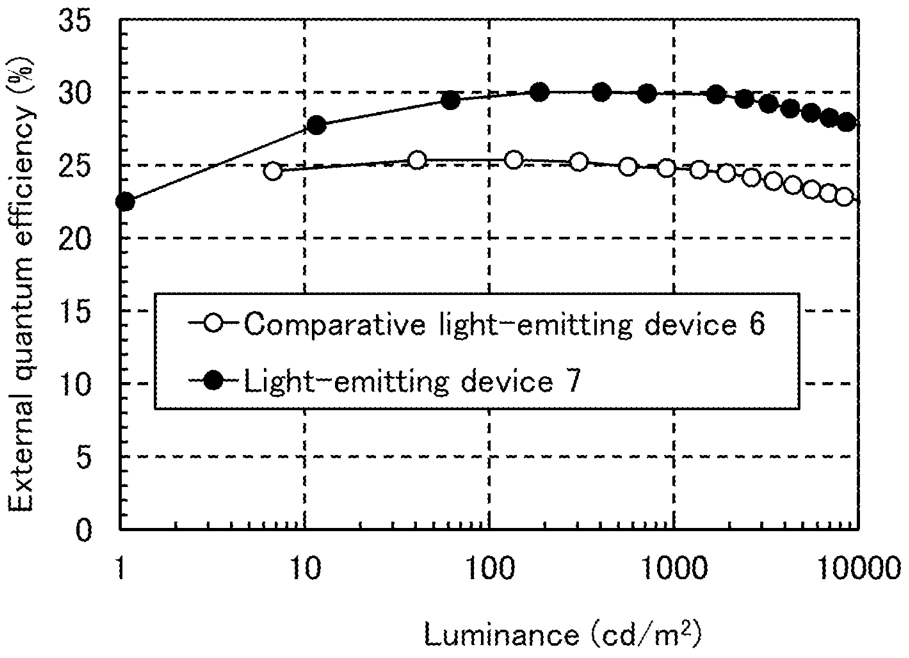
FIG. 30 is a diagram showing external quantum efficiency-luminance characteristics of light-emitting devices in Example.
Figure 31:
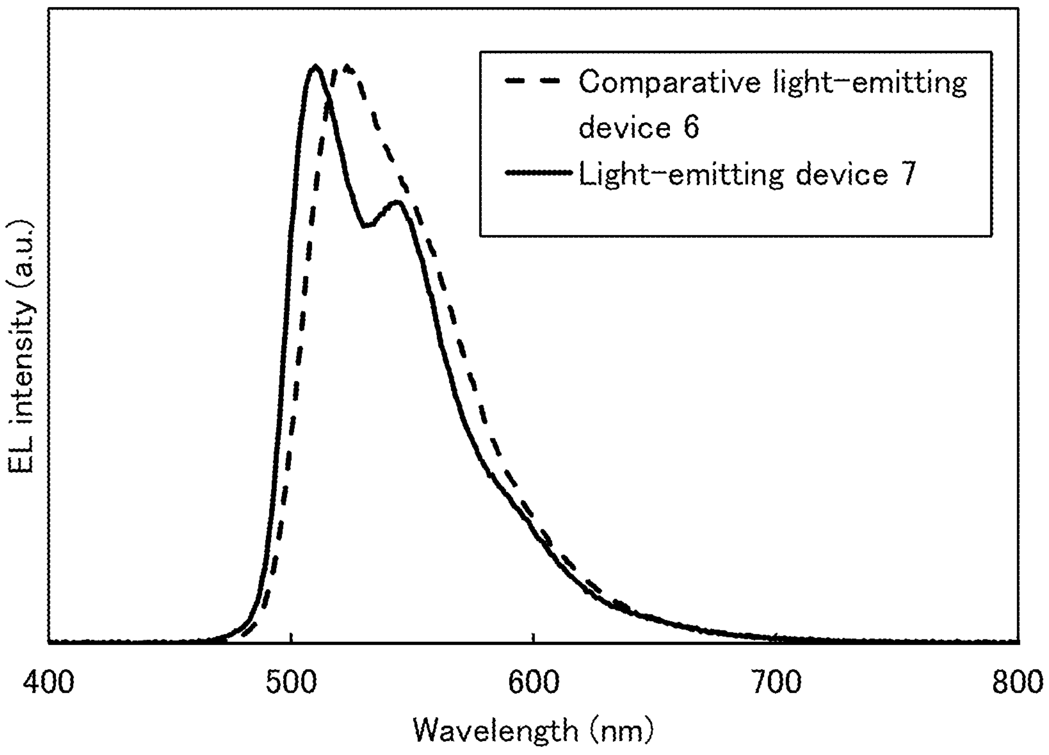
FIG. 31 is a diagram showing emission spectra of light-emitting devices in Example.

FIG. 28 shows current efficiency-luminance characteristics of the comparative light-emitting device 6 and the light-emitting device 7. FIG. 29 shows current density-voltage characteristics. FIG. 30 shows external quantum efficiency-luminance characteristics. FIG. 31 shows emission spectra of the comparative light-emitting device 6 and the light-emitting device 7 to which a current at a current density of 2.5 $mA/cm^2$ was supplied.

Table 7 shows the device characteristics of the comparative light-emitting device 6 and the light-emitting device 7 at around 1000 $cd/m^2$.

TABLE 7

| | Voltage (V) | Current density ($mA/cm^2$) | CIE chromaticity (x, y) | Luminance ($cd/m^2$) | Current efficiency (cd/A) | Power efficiency (lm/W) | External quantum efficiency (%) |
|---|---|---|---|---|---|---|---|
| Comparative light-emitting device 6 | 2.80 | 1.00 | (0.322, 0.638) | 915 | 91.8 | 103.0 | 24.8 |
| Light-emitting device 7 | 2.80 | 0.68 | (0.303, 0.634) | 717 | 105.1 | 117.9 | 29.9 |

As shown in FIG. 31, the emission spectra of the comparative light-emitting device 6 and the light-emitting device 7 had emission peaks at around 523 nm and 510 nm, respectively, and full widths at half maximum of approximately 68 nm and 67 nm, respectively; accordingly, it was found that the comparative light-emitting device 6 and the light-emitting device 7 emitted light derived from the respective guest materials included in the light-emitting devices.

As shown in FIG. 28, FIG. 30, and Table 7, the comparative light-emitting device 6 and the light-emitting device 7 each exhibited high current efficiency. The light-emitting device 7 had its emission spectrum in a region with a lower luminosity factor (a shorter wavelength region) than the comparative light-emitting device 6, but had higher current efficiency than the comparative light-emitting device 6. As shown in FIG. 30 and Table 7, it was found that the light-emitting device 7 had extremely high external quantum efficiency exceeding 25%. Although the light-emitting device 7 exhibited light emission in a shorter wavelength side than the comparative light-emitting device 6 using GD270 which is widely used as a guest material, it exhibited higher current efficiency and higher external quantum efficiency than the comparative light-emitting device 6.

As shown in FIG. 29 and Table 7, it was found that the comparative light-emitting device 6 and the light-emitting device 7 each had favorable drive voltage characteristics.

REFERENCE NUMERALS

100: EL layer, 101: electrode, 102: electrode, 103: EL layer, 106: light-emitting unit, 108: light-emitting unit, 111: hole-injection layer, 112: hole-transport layer, 113: electron-transport layer, 114: electron-injection layer, 115: charge-generation layer, 116: hole-injection layer, 117: hole-transport layer, 118: electron-transport layer, 119: electron-injection layer, 120: light-emitting layer, 140: light-emitting layer, 141: host material, 141_1: organic compound, 141_2: organic compound, 142: guest material, 150: light-emitting device, 152: light-emitting device, 170: light-emitting layer, 250: light-emitting device, 601: source side driver circuit, 602: pixel portion, 603: gate side driver circuit, 604: sealing substrate, 605: sealing material, 607: space, 608: wiring, 610: element substrate, 611: switching TFT, 612: current controlling, 613: electrode, 614: insulator, 616: EL layer, 617: electrode, 618: light-emitting device, 623: n-channel TFT, 624: p-channel TFT, 900: portable information terminal, 901: housing, 902: housing, 903: display portion, 905: hinge portion, 910: portable information terminal, 911: housing, 912: display portion, 913: operation button, 914: external connection port, 915: speaker, 916: microphone, 917: camera, 920: camera, 921: housing, 922: display portion, 923: operation button, 924: shutter button, 926: lens, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1025B: lower electrode, 1025G: lower electrode, 1025R: lower electrode, 1026: partition, 1028: EL layer, 1029: electrode, 1031: sealing substrate, 1032: sealing material, 1033: base material, 1034B: coloring layer, 1034G: coloring layer, 1034R: coloring layer, 1036: overcoat layer, 1037: interlayer insulating film, 1040: pixel portion, 1041: driver circuit portion, 1042: peripheral portion, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 3500: multifunction terminal, 3502: housing, 3504: display portion, 3506: camera, 3508: lighting, 3600: light, 3602: housing, 3608: lighting, 3610: speaker, 5000: housing, 5001: display portion, 5002: display portion, 5003: speaker, 5004: LED lamp, 5005: operation key, 5006: connection terminal, 5007: sensor, 5008: microphone, 5012: support, 5013: earphone, 5100: cleaning robot, 5101: display, 5102: camera, 5103: brush, 5104: operation button, 5120: dust, 5140: portable electronic device, 5150: portable information terminal, 5151: housing, 5152: display region, 5153: bend portion, 8501: lighting device, 8502: lighting device, 8503: lighting device, 8504: lighting device, 9000: housing, 9001: display portion, 9006: connection terminal, 9055: hinge, 9200: portable information terminal, 9201: portable information terminal, 9202: portable information terminal.

This application is based on Japanese Patent Application Serial No. 2018-143623 filed with Japan Patent Office on Jul. 31, 2018, the entire contents of which are hereby incorporated herein by reference.

The invention claimed is:

1. An organometallic complex represented by General Formula (G-7), (G-7)

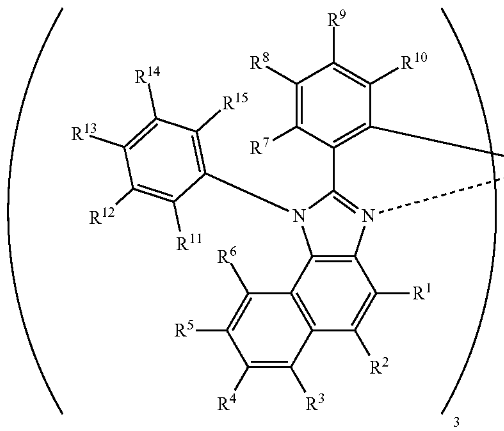

wherein each of $R^1$ to $R^{10}$ and $R^{12}$ to $R^{14}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, a halogeno group, a cyano group, a nitro group, a carbonyl group, and a haloalkyl group, and wherein each of $R^{11}$ and $R^{15}$ represents an alkyl group having 1 to 6 carbon atoms.

2. The organometallic complex according to claim 1, wherein the alkyl group is a branched-chain alkyl group having 3 to 6 carbon atoms.

3. A light-emitting device comprising an EL layer between a pair of electrodes, wherein the EL layer comprises the organometallic complex according to claim 1.

4. A light-emitting apparatus comprising:

the light-emitting device according to claim 3; and at least one of a color filter and a transistor.

5. An organometallic complex represented by General Formula (G-8), (G-8)

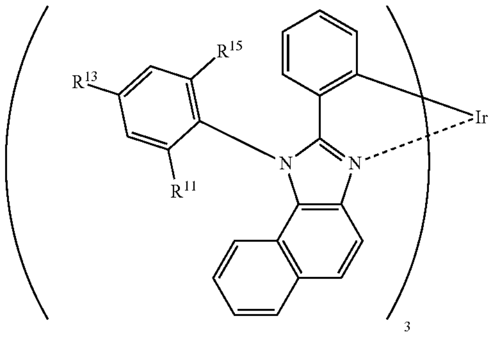

wherein $R^{13}$ independently represents any of hydrogen, an alkyl group having 1 to 6 carbon atoms, a substituted or unsubstituted cycloalkyl group having 3 to 7 carbon atoms, a substituted or unsubstituted aryl group having 6 to 25 carbon atoms, a halogeno group, a cyano group, a nitro group, a carbonyl group, and a haloalkyl group, and wherein each of $R^{11}$ and $R^{15}$ represents an alkyl group having 1 to 6 carbon atoms.

6. The organometallic complex according to claim 5, wherein $R^{13}$ represents hydrogen, the halogeno group, the cyano group, the nitro group, the carbonyl group, or the haloalkyl group.

7. The organometallic complex according to claim 5, wherein the alkyl group is a branched-chain alkyl group having 3 to 6 carbon atoms.

8. A light-emitting device comprising an EL layer between a pair of electrodes, wherein the EL layer comprises the organometallic complex according to claim 5.

9. A light-emitting apparatus comprising:

the light-emitting device according to claim 8; and at least one of a color filter and a transistor.

10. The organometallic complex according to claim 1, wherein the organometallic complex is represented by any one of Structure Formulae (100), (103), (201), and (206), (100)

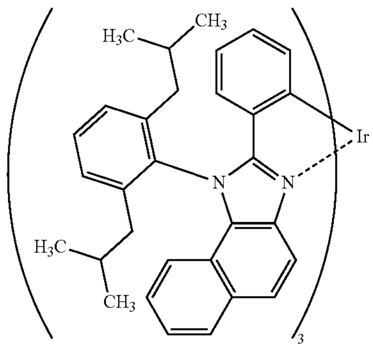

(103)

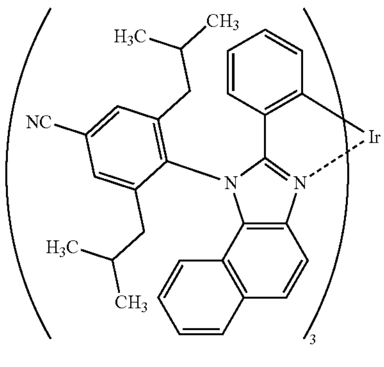

-continued
(201)
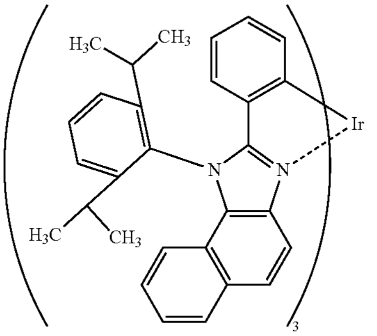
(206)
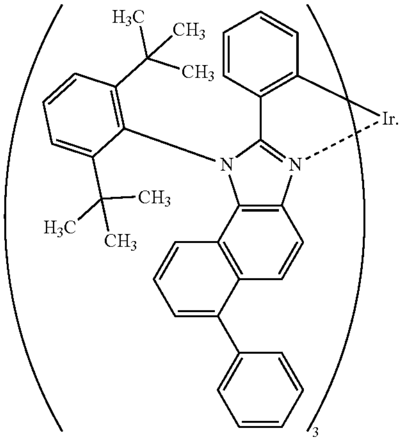
* * * * *